(12) United States Patent
Berkovich et al.

(10) Patent No.: US 11,863,886 B2
(45) Date of Patent: *Jan. 2, 2024

(54) PIXEL SENSOR HAVING MULTIPLE PHOTODIODES

(71) Applicant: META PLATFORMS TECHNOLOGIES, LLC, Menlo Park, CA (US)

(72) Inventors: Andrew Samuel Berkovich, Bellevue, WA (US); Xinqiao Liu, Medina, WA (US); Song Chen, Redmond, WA (US); Nicholas Daniel Trail, Bothell, WA (US); Michael Patrick Schaub, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/591,300

(22) Filed: Feb. 2, 2022

(65) Prior Publication Data
US 2022/0159204 A1 May 19, 2022

Related U.S. Application Data

(63) Continuation of application No. 16/453,538, filed on Jun. 26, 2019, now Pat. No. 11,463,636.
(Continued)

(51) Int. Cl.
*H04N 25/58* (2023.01)
*H03M 1/18* (2006.01)
*H04N 25/59* (2023.01)

(52) U.S. Cl.
CPC .............. *H04N 25/58* (2023.01); *H03M 1/18* (2013.01); *H04N 25/59* (2023.01)

(58) Field of Classification Search
CPC .......... H04N 25/58; H04N 25/59; H03M 1/18
See application file for complete search history.

(56) References Cited

U.S. PATENT DOCUMENTS

| 4,596,977 A | 6/1986 | Bauman et al. |
| 5,053,771 A | 10/1991 | McDermott |

(Continued)

FOREIGN PATENT DOCUMENTS

| CN | 1490878 A | 4/2004 |
| CN | 1728397 A | 2/2006 |

(Continued)

OTHER PUBLICATIONS

Advisory Action dated Apr. 7, 2020 for U.S. Appl. No. 15/801,216, filed Nov. 1, 2019, 3 Pages.
(Continued)

*Primary Examiner* — Georgia Y Epps
*Assistant Examiner* — Don J Williams
(74) *Attorney, Agent, or Firm* — Kilpatrick Townsend & Stockton LLP

(57) ABSTRACT

In one example, an apparatus comprises: multiple distinct sets of photodiodes, wherein each set of photodiodes includes one or more photodiodes, one or more charge sensing units, and a controller. The controller is configured to: transfer charge generated by the one or more photodiodes in response to a different component of incident light to the one or more charge sensing units in order to convert the charge to voltages; perform one or more quantization processes of a plurality of quantization processes corresponding to a plurality of intensity ranges, wherein the one or more quantization processes quantizes the voltages from the one or more charge sensing units to digital values representing (Continued)

components of a pixel of different wavelength ranges; and generate a pixel value based on the at least some of the digital values.

20 Claims, 24 Drawing Sheets

Related U.S. Application Data

(60) Provisional application No. 62/690,571, filed on Jun. 27, 2018.

(56) References Cited

U.S. PATENT DOCUMENTS

| | | | |
|---|---|---|---|
| 5,844,512 A | 12/1998 | Gorin et al. | |
| 5,963,369 A | 10/1999 | Steinthal et al. | |
| 6,057,586 A | 5/2000 | Bawolek et al. | |
| 6,384,905 B1 | 5/2002 | Barrows | |
| 6,522,395 B1 | 2/2003 | Bamji et al. | |
| 6,529,241 B1 | 3/2003 | Clark | |
| 6,864,817 B1 | 3/2005 | Salvi et al. | |
| 6,963,369 B1 | 11/2005 | Olding | |
| 6,970,195 B1 | 11/2005 | Bidermann et al. | |
| 6,972,791 B1 | 12/2005 | Yomeyama | |
| 6,992,706 B2 | 1/2006 | Mabuchi et al. | |
| 7,038,820 B1 | 5/2006 | Kindt et al. | |
| 7,326,903 B2 | 2/2008 | Ackland | |
| 7,362,365 B1 | 4/2008 | Reyneri et al. | |
| 7,659,772 B2 | 2/2010 | Nomura et al. | |
| 7,659,925 B2 | 2/2010 | Krymski | |
| 7,719,589 B2 | 5/2010 | Turchetta et al. | |
| 7,830,292 B2 | 11/2010 | Kirsch | |
| 7,956,914 B2 | 6/2011 | Xu | |
| 8,134,623 B2 | 3/2012 | Purcell et al. | |
| 8,144,227 B2 | 3/2012 | Kobayashi | |
| 8,369,458 B2 | 2/2013 | Wong et al. | |
| 8,426,793 B1 | 4/2013 | Barrows | |
| 8,754,798 B2 | 6/2014 | Lin | |
| 8,773,562 B1 | 7/2014 | Fan | |
| 8,779,346 B2 | 7/2014 | Fowler et al. | |
| 8,946,610 B2 | 2/2015 | Iwabuchi et al. | |
| 9,001,251 B2 | 4/2015 | Smith et al. | |
| 9,094,629 B2 | 7/2015 | Ishibashi | |
| 9,185,273 B2 | 11/2015 | Beck et al. | |
| 9,274,151 B2 | 3/2016 | Lee et al. | |
| 9,282,264 B2 | 3/2016 | Park et al. | |
| 9,332,200 B1 | 5/2016 | Hseih et al. | |
| 9,343,497 B2 | 5/2016 | Cho | |
| 9,363,454 B2 | 6/2016 | Ito et al. | |
| 9,478,579 B2 | 10/2016 | Dai et al. | |
| 9,497,396 B2 | 11/2016 | Choi | |
| 9,531,990 B1 | 12/2016 | Wilkins et al. | |
| 9,800,260 B1 | 10/2017 | Banerjee | |
| 9,819,885 B2 | 11/2017 | Furukawa et al. | |
| 9,832,370 B2 | 11/2017 | Cho et al. | |
| 9,909,922 B2 | 3/2018 | Schweickert et al. | |
| 9,935,618 B1 | 4/2018 | Fenigstein | |
| 9,948,316 B1 | 4/2018 | Yun et al. | |
| 9,955,091 B1 | 4/2018 | Dai et al. | |
| 9,967,496 B2 | 5/2018 | Ayers et al. | |
| 10,003,759 B2 | 6/2018 | Fan | |
| 10,015,416 B2 | 7/2018 | Borthakur et al. | |
| 10,090,342 B1 | 10/2018 | Gambino et al. | |
| 10,096,631 B2 | 10/2018 | Ishizu | |
| 10,103,193 B1 | 10/2018 | Manabe et al. | |
| 10,154,221 B2 | 12/2018 | Ogino et al. | |
| 10,157,951 B2 | 12/2018 | Kim et al. | |
| 10,321,081 B2 | 6/2019 | Watanabe et al. | |
| 10,345,447 B1 | 7/2019 | Hicks | |
| 10,419,701 B2 | 9/2019 | Liu | |
| 10,574,925 B2 | 2/2020 | Otaka | |
| 10,594,974 B2 | 3/2020 | Ivarsson et al. | |
| 10,598,546 B2 | 3/2020 | Liu | |
| 10,608,101 B2 | 3/2020 | Liu | |
| 10,686,996 B2 | 6/2020 | Liu | |
| 10,726,627 B2 | 7/2020 | Liu | |
| 10,750,097 B2 | 8/2020 | Liu | |
| 10,764,526 B1 | 9/2020 | Liu et al. | |
| 10,804,926 B2 | 10/2020 | Gao et al. | |
| 10,812,742 B2 | 10/2020 | Chen et al. | |
| 10,825,854 B2 | 11/2020 | Liu | |
| 10,834,344 B2 | 11/2020 | Chen et al. | |
| 10,897,586 B2 | 1/2021 | Liu et al. | |
| 10,903,260 B2 | 1/2021 | Chen et al. | |
| 10,917,589 B2 | 2/2021 | Liu | |
| 10,923,523 B2 | 2/2021 | Liu et al. | |
| 10,931,884 B2 | 2/2021 | Liu et al. | |
| 10,951,849 B2 | 3/2021 | Liu | |
| 10,969,273 B2 | 4/2021 | Berkovich et al. | |
| 11,004,881 B2 | 5/2021 | Liu et al. | |
| 11,057,581 B2 | 7/2021 | Liu | |
| 11,089,210 B2 | 8/2021 | Berkovich et al. | |
| 11,089,241 B2 | 8/2021 | Chen et al. | |
| 11,146,753 B2 | 10/2021 | Shimura et al. | |
| 11,218,660 B1 | 1/2022 | Xinqiao et al. | |
| 11,233,085 B2 | 1/2022 | Chen et al. | |
| 11,393,867 B2 | 7/2022 | Chen et al. | |
| 11,463,636 B2 * | 10/2022 | Berkovich | H04N 5/35536 |
| 11,595,602 B2 | 2/2023 | Gao et al. | |
| 2002/0067303 A1 | 6/2002 | Lee et al. | |
| 2002/0113886 A1 | 8/2002 | Hynecek | |
| 2003/0001080 A1 | 1/2003 | Kummaraguntla et al. | |
| 2003/0020100 A1 | 1/2003 | Guidash | |
| 2003/0049925 A1 | 3/2003 | Layman et al. | |
| 2004/0095495 A1 | 5/2004 | Inokuma et al. | |
| 2004/0118994 A1 | 6/2004 | Mizuno | |
| 2004/0251483 A1 | 12/2004 | Ko et al. | |
| 2005/0046715 A1 | 3/2005 | Lim et al. | |
| 2005/0057389 A1 | 3/2005 | Krymski | |
| 2005/0104983 A1 | 5/2005 | Raynor | |
| 2005/0206414 A1 | 9/2005 | Cottin et al. | |
| 2005/0237380 A1 | 10/2005 | Kakii et al. | |
| 2005/0280727 A1 | 12/2005 | Sato et al. | |
| 2006/0023109 A1 | 2/2006 | Mabuchi et al. | |
| 2006/0146159 A1 | 7/2006 | Farrier | |
| 2006/0158541 A1 | 7/2006 | Ichikawa | |
| 2007/0013983 A1 | 1/2007 | Kitamura et al. | |
| 2007/0014019 A1 | 1/2007 | Mouli | |
| 2007/0035653 A1 | 2/2007 | Hong et al. | |
| 2007/0076109 A1 | 4/2007 | Krymski | |
| 2007/0076481 A1 | 4/2007 | Tennant | |
| 2007/0092244 A1 | 4/2007 | Pertsel et al. | |
| 2007/0102740 A1 | 5/2007 | Ellis-Monaghan et al. | |
| 2007/0131991 A1 | 6/2007 | Sugawa | |
| 2007/0208526 A1 | 9/2007 | Staudt et al. | |
| 2007/0222881 A1 | 9/2007 | Mentzer | |
| 2007/0225560 A1 | 9/2007 | Avni et al. | |
| 2008/0001065 A1 | 1/2008 | Ackland | |
| 2008/0007731 A1 | 1/2008 | Botchway et al. | |
| 2008/0042046 A1 | 2/2008 | Mabuchi | |
| 2008/0042888 A1 | 2/2008 | Danesh | |
| 2008/0068478 A1 | 3/2008 | Watanabe | |
| 2008/0088014 A1 | 4/2008 | Adkisson et al. | |
| 2008/0191791 A1 | 8/2008 | Nomura et al. | |
| 2008/0226170 A1 | 9/2008 | Sonoda | |
| 2008/0226183 A1 | 9/2008 | Lei et al. | |
| 2009/0002528 A1 | 1/2009 | Manabe et al. | |
| 2009/0033588 A1 | 2/2009 | Kajita et al. | |
| 2009/0040364 A1 | 2/2009 | Rubner | |
| 2009/0066820 A1 | 3/2009 | Jiang et al. | |
| 2009/0091645 A1 | 4/2009 | Trimeche et al. | |
| 2009/0128640 A1 | 5/2009 | Yumiki | |
| 2009/0224139 A1 | 9/2009 | Buettgen et al. | |
| 2009/0244328 A1 | 10/2009 | Yamashita | |
| 2009/0244346 A1 | 10/2009 | Funaki | |
| 2009/0245637 A1 | 10/2009 | Barman et al. | |
| 2009/0261235 A1 | 10/2009 | Lahav et al. | |
| 2009/0303371 A1 | 12/2009 | Watanabe et al. | |
| 2009/0321615 A1 | 12/2009 | Sugiyama et al. | |
| 2010/0013969 A1 | 1/2010 | Ui | |
| 2010/0140732 A1 | 6/2010 | Eminoglu et al. | |
| 2010/0194956 A1 | 8/2010 | Yuan et al. | |
| 2010/0232227 A1 | 9/2010 | Lee | |

(56) References Cited

U.S. PATENT DOCUMENTS

| | | |
|---|---|---|
| 2010/0245647 A1 | 9/2010 | Honda et al. |
| 2010/0276572 A1 | 11/2010 | Iwabuchi et al. |
| 2011/0049589 A1 | 3/2011 | Chuang et al. |
| 2011/0122304 A1 | 5/2011 | Sedelnikov |
| 2011/0149116 A1 | 6/2011 | Kim |
| 2011/0155892 A1 | 6/2011 | Neter et al. |
| 2011/0254986 A1 | 10/2011 | Nishimura et al. |
| 2011/0267533 A1 | 11/2011 | Hirose |
| 2011/0298074 A1 | 12/2011 | Funao |
| 2012/0016817 A1 | 1/2012 | Smith et al. |
| 2012/0039548 A1 | 2/2012 | Wang et al. |
| 2012/0068051 A1 | 3/2012 | Ahn et al. |
| 2012/0075511 A1 | 3/2012 | Tay |
| 2012/0092677 A1 | 4/2012 | Suehira et al. |
| 2012/0105475 A1 | 5/2012 | Tseng |
| 2012/0105668 A1 | 5/2012 | Velarde et al. |
| 2012/0113119 A1 | 5/2012 | Massie |
| 2012/0127284 A1 | 5/2012 | Bar-Zeev et al. |
| 2012/0133807 A1 | 5/2012 | Wu et al. |
| 2012/0138775 A1 | 6/2012 | Cheon et al. |
| 2012/0153123 A1 | 6/2012 | Mao et al. |
| 2012/0188420 A1 | 7/2012 | Black et al. |
| 2012/0200499 A1 | 8/2012 | Osterhout et al. |
| 2012/0212465 A1 | 8/2012 | White et al. |
| 2012/0241591 A1 | 9/2012 | Wan et al. |
| 2012/0262616 A1 | 10/2012 | Sa et al. |
| 2012/0267511 A1 | 10/2012 | Kozlowski |
| 2012/0273654 A1 | 11/2012 | Hynecek et al. |
| 2012/0273906 A1 | 11/2012 | Mackey et al. |
| 2012/0305751 A1 | 12/2012 | Kusuda |
| 2012/0327279 A1 | 12/2012 | Hashimoto et al. |
| 2013/0020466 A1 | 1/2013 | Ayers et al. |
| 2013/0056809 A1 | 3/2013 | Mao et al. |
| 2013/0057742 A1 | 3/2013 | Nakamura et al. |
| 2013/0068929 A1 | 3/2013 | Solhusvik et al. |
| 2013/0069787 A1 | 3/2013 | Petrou |
| 2013/0082313 A1 | 4/2013 | Manabe |
| 2013/0113969 A1 | 5/2013 | Manabe et al. |
| 2013/0120615 A1 | 5/2013 | Hirooka et al. |
| 2013/0120625 A1 | 5/2013 | Ishii et al. |
| 2013/0126710 A1 | 5/2013 | Kondo |
| 2013/0141619 A1 | 6/2013 | Lim et al. |
| 2013/0148013 A1 | 6/2013 | Shiohara |
| 2013/0187027 A1 | 7/2013 | Qiao et al. |
| 2013/0207219 A1 | 8/2013 | Ahn |
| 2013/0214371 A1 | 8/2013 | Asatsuma et al. |
| 2013/0218728 A1 | 8/2013 | Hashop et al. |
| 2013/0221194 A1 | 8/2013 | Manabe |
| 2013/0229543 A1 | 9/2013 | Hashimoto et al. |
| 2013/0229560 A1 | 9/2013 | Kondo |
| 2013/0234029 A1 | 9/2013 | Bikumandla |
| 2013/0248685 A1 | 9/2013 | Ahn |
| 2013/0293752 A1 | 11/2013 | Peng et al. |
| 2013/0299674 A1 | 11/2013 | Fowler et al. |
| 2013/0300906 A1 | 11/2013 | Yan |
| 2014/0021574 A1 | 1/2014 | Egawa |
| 2014/0042299 A1 | 2/2014 | Wan et al. |
| 2014/0042582 A1 | 2/2014 | Kondo |
| 2014/0078336 A1 | 3/2014 | Beck et al. |
| 2014/0085523 A1 | 3/2014 | Hynecek |
| 2014/0176770 A1 | 6/2014 | Kondo |
| 2014/0211052 A1 | 7/2014 | Choi |
| 2014/0232890 A1 | 8/2014 | Yoo et al. |
| 2014/0247382 A1 | 9/2014 | Moldovan et al. |
| 2014/0306276 A1 | 10/2014 | Yamaguchi |
| 2014/0313387 A1 | 10/2014 | Vogelsang et al. |
| 2014/0368687 A1 | 12/2014 | Yu et al. |
| 2015/0048427 A1 | 2/2015 | Hu et al. |
| 2015/0083895 A1 | 3/2015 | Hashimoto et al. |
| 2015/0085134 A1 | 3/2015 | Novotny et al. |
| 2015/0090863 A1 | 4/2015 | Mansoorian et al. |
| 2015/0097951 A1 | 4/2015 | Barrows |
| 2015/0172574 A1 | 6/2015 | Honda et al. |
| 2015/0189209 A1 | 7/2015 | Yang et al. |
| 2015/0201142 A1 | 7/2015 | Smith et al. |
| 2015/0208009 A1 | 7/2015 | Oh et al. |
| 2015/0229859 A1 | 8/2015 | Guidash et al. |
| 2015/0237274 A1 | 8/2015 | Yang et al. |
| 2015/0279884 A1 | 10/2015 | Kusumoto |
| 2015/0287766 A1 | 10/2015 | Kim et al. |
| 2015/0309311 A1 | 10/2015 | Cho |
| 2015/0309316 A1 | 10/2015 | Osterhout et al. |
| 2015/0312461 A1 | 10/2015 | Kim et al. |
| 2015/0312502 A1 | 10/2015 | Borremans |
| 2015/0312557 A1 | 10/2015 | Kim |
| 2015/0350582 A1 | 12/2015 | Korobov et al. |
| 2015/0358569 A1 | 12/2015 | Egawa |
| 2015/0358571 A1 | 12/2015 | Dominguez Castro et al. |
| 2015/0358593 A1 | 12/2015 | Sato |
| 2015/0381907 A1 | 12/2015 | Boettiger et al. |
| 2015/0381911 A1 | 12/2015 | Shen et al. |
| 2016/0011422 A1 | 1/2016 | Thurber et al. |
| 2016/0018645 A1 | 1/2016 | Haddick et al. |
| 2016/0021302 A1 | 1/2016 | Cho et al. |
| 2016/0028974 A1 | 1/2016 | Guidash et al. |
| 2016/0028980 A1 | 1/2016 | Kameyama et al. |
| 2016/0035770 A1 | 2/2016 | Ahn et al. |
| 2016/0037111 A1 | 2/2016 | Dai et al. |
| 2016/0078614 A1 | 3/2016 | Ryu et al. |
| 2016/0088253 A1 | 3/2016 | Tezuka |
| 2016/0093659 A1 | 3/2016 | Nakamura et al. |
| 2016/0100115 A1 | 4/2016 | Kusano |
| 2016/0111457 A1 | 4/2016 | Sekine |
| 2016/0112626 A1 | 4/2016 | Shimada |
| 2016/0118992 A1 | 4/2016 | Milkov |
| 2016/0165160 A1 | 6/2016 | Hseih et al. |
| 2016/0181298 A1 | 6/2016 | Wan et al. |
| 2016/0197117 A1 | 7/2016 | Nakata et al. |
| 2016/0198114 A1 | 7/2016 | Zhang et al. |
| 2016/0204150 A1 | 7/2016 | Oh et al. |
| 2016/0210785 A1 | 7/2016 | Balachandreswaran et al. |
| 2016/0225813 A1 | 8/2016 | Liao et al. |
| 2016/0240570 A1 | 8/2016 | Barna et al. |
| 2016/0249004 A1 | 8/2016 | Saeki et al. |
| 2016/0255293 A1 | 9/2016 | Gesset |
| 2016/0276394 A1 | 9/2016 | Chou et al. |
| 2016/0307945 A1 | 10/2016 | Madurawe |
| 2016/0337605 A1 | 11/2016 | Ito |
| 2016/0353045 A1 | 12/2016 | Kawahito et al. |
| 2016/0360127 A1 | 12/2016 | Dierickx et al. |
| 2017/0013215 A1 | 1/2017 | McCarten |
| 2017/0038504 A1 | 2/2017 | Tsai |
| 2017/0039906 A1 | 2/2017 | Jepsen |
| 2017/0041525 A1 | 2/2017 | Liu et al. |
| 2017/0041571 A1 | 2/2017 | Tyrrell et al. |
| 2017/0053962 A1 | 2/2017 | Oh et al. |
| 2017/0059399 A1 | 3/2017 | Suh et al. |
| 2017/0062501 A1 | 3/2017 | Velichko et al. |
| 2017/0069363 A1 | 3/2017 | Baker |
| 2017/0070691 A1 | 3/2017 | Nishikido |
| 2017/0099422 A1 | 4/2017 | Goma et al. |
| 2017/0099446 A1 | 4/2017 | Cremers et al. |
| 2017/0104021 A1 | 4/2017 | Park et al. |
| 2017/0104946 A1 | 4/2017 | Hong |
| 2017/0110493 A1 | 4/2017 | Yokogawa |
| 2017/0111600 A1 | 4/2017 | Wang et al. |
| 2017/0141147 A1 | 5/2017 | Raynor |
| 2017/0154909 A1 | 6/2017 | Ishizu |
| 2017/0163924 A1 | 6/2017 | Wan |
| 2017/0170223 A1 | 6/2017 | Hynecek et al. |
| 2017/0201693 A1 | 7/2017 | Sugizaki et al. |
| 2017/0207268 A1 | 7/2017 | Kurokawa |
| 2017/0228345 A1 | 8/2017 | Gupta et al. |
| 2017/0264364 A1 | 9/2017 | Aoyama et al. |
| 2017/0270664 A1 | 9/2017 | Hoogi et al. |
| 2017/0272667 A1 | 9/2017 | Hynecek |
| 2017/0272768 A1 | 9/2017 | Tall et al. |
| 2017/0280031 A1 | 9/2017 | Price et al. |
| 2017/0293799 A1 | 10/2017 | Skogo et al. |
| 2017/0295338 A1 | 10/2017 | Geurts |
| 2017/0310910 A1 | 10/2017 | Smith et al. |
| 2017/0324917 A1 | 11/2017 | Mlinar et al. |
| 2017/0338262 A1 | 11/2017 | Hirata |
| 2017/0339327 A1 | 11/2017 | Koshkin et al. |

(56) References Cited

U.S. PATENT DOCUMENTS

| | | |
|---|---|---|
| 2017/0346579 A1 | 11/2017 | Barghi |
| 2017/0350755 A1 | 12/2017 | Geurts |
| 2017/0359497 A1 | 12/2017 | Mandelli et al. |
| 2017/0366766 A1 | 12/2017 | Geurts et al. |
| 2018/0019269 A1 | 1/2018 | Klipstein |
| 2018/0077368 A1 | 3/2018 | Suzuki |
| 2018/0084164 A1 | 3/2018 | Hynecek et al. |
| 2018/0115725 A1 | 4/2018 | Zhang et al. |
| 2018/0115730 A1 | 4/2018 | Velichko |
| 2018/0136471 A1 | 5/2018 | Miller et al. |
| 2018/0143701 A1 | 5/2018 | Suh et al. |
| 2018/0152650 A1 | 5/2018 | Sakakibara et al. |
| 2018/0167575 A1 | 6/2018 | Watanabe et al. |
| 2018/0176545 A1 | 6/2018 | Aflaki Beni |
| 2018/0204867 A1 | 7/2018 | Kim et al. |
| 2018/0213205 A1 | 7/2018 | Oh |
| 2018/0220093 A1 | 8/2018 | Murao et al. |
| 2018/0224658 A1 | 8/2018 | Teller |
| 2018/0227516 A1 | 8/2018 | Mo et al. |
| 2018/0241953 A1 | 8/2018 | Johnson |
| 2018/0270436 A1 | 9/2018 | Ivarsson et al. |
| 2018/0276841 A1 | 9/2018 | Krishnaswamy et al. |
| 2018/0278865 A1 | 9/2018 | Takado et al. |
| 2018/0286896 A1 | 10/2018 | Kim et al. |
| 2018/0348494 A1 | 12/2018 | Isono |
| 2018/0376046 A1 | 12/2018 | Liu |
| 2018/0376090 A1 | 12/2018 | Liu |
| 2019/0035154 A1 | 1/2019 | Liu |
| 2019/0043903 A1 | 2/2019 | Gambino et al. |
| 2019/0046044 A1 | 2/2019 | Tzvieli et al. |
| 2019/0052788 A1 | 2/2019 | Liu |
| 2019/0056264 A1 | 2/2019 | Liu |
| 2019/0057995 A1 | 2/2019 | Liu |
| 2019/0058058 A1 | 2/2019 | Liu |
| 2019/0098232 A1 | 3/2019 | Mori et al. |
| 2019/0104263 A1 | 4/2019 | Ochiai et al. |
| 2019/0104265 A1 | 4/2019 | Totsuka et al. |
| 2019/0104283 A1 | 4/2019 | Wakeyama et al. |
| 2019/0110039 A1 | 4/2019 | Linde et al. |
| 2019/0123088 A1 | 4/2019 | Kwon |
| 2019/0124285 A1 | 4/2019 | Otaka |
| 2019/0141270 A1 | 5/2019 | Otaka et al. |
| 2019/0149751 A1 | 5/2019 | Wise |
| 2019/0157330 A1 | 5/2019 | Sato et al. |
| 2019/0172227 A1 | 6/2019 | Kasahara |
| 2019/0172868 A1 | 6/2019 | Chen et al. |
| 2019/0191116 A1 | 6/2019 | Madurawe |
| 2019/0246036 A1 | 8/2019 | Wu et al. |
| 2019/0253650 A1 | 8/2019 | Kim |
| 2019/0327439 A1 | 10/2019 | Chen et al. |
| 2019/0331914 A1 | 10/2019 | Lee et al. |
| 2019/0335151 A1 | 10/2019 | Rivard et al. |
| 2019/0348460 A1 | 11/2019 | Chen et al. |
| 2019/0355782 A1 | 11/2019 | Do et al. |
| 2019/0363118 A1 | 11/2019 | Berkovich et al. |
| 2019/0371845 A1 | 12/2019 | Chen et al. |
| 2019/0379827 A1 | 12/2019 | Berkovich et al. |
| 2019/0379846 A1 | 12/2019 | Chen et al. |
| 2020/0007800 A1 | 1/2020 | Berkovich et al. |
| 2020/0053299 A1 | 2/2020 | Zhang et al. |
| 2020/0059589 A1 | 2/2020 | Liu et al. |
| 2020/0068189 A1 | 2/2020 | Chen et al. |
| 2020/0186731 A1 | 6/2020 | Chen et al. |
| 2020/0195875 A1 | 6/2020 | Berkovich et al. |
| 2020/0217714 A1 | 7/2020 | Liu |
| 2020/0228745 A1 | 7/2020 | Otaka |
| 2020/0374475 A1 | 11/2020 | Fukuoka et al. |
| 2020/0396399 A1 | 12/2020 | Tsai et al. |
| 2021/0026796 A1 | 1/2021 | Graif et al. |
| 2021/0099659 A1 | 4/2021 | Miyauchi et al. |
| 2021/0144330 A1 | 5/2021 | Otaka |
| 2021/0185264 A1 | 6/2021 | Wong et al. |
| 2021/0227159 A1 | 7/2021 | Sambonsugi |
| 2021/0368124 A1 | 11/2021 | Berkovich et al. |

FOREIGN PATENT DOCUMENTS

| | | |
|---|---|---|
| CN | 1812506 A | 8/2006 |
| CN | 103207716 A | 7/2013 |
| CN | 103730455 A | 4/2014 |
| CN | 104125418 A | 10/2014 |
| CN | 104204904 A | 12/2014 |
| CN | 104469195 A | 3/2015 |
| CN | 104704812 A | 6/2015 |
| CN | 104733485 A | 6/2015 |
| CN | 104754255 A | 7/2015 |
| CN | 105706439 A | 6/2016 |
| CN | 106255978 A | 12/2016 |
| CN | 106791504 A | 5/2017 |
| CN | 207184624 U | 4/2018 |
| CN | 109298528 A | 2/2019 |
| DE | 202016105510 U1 | 10/2016 |
| EP | 0675345 A2 | 10/1995 |
| EP | 1681856 A2 | 7/2006 |
| EP | 1732134 A1 | 12/2006 |
| EP | 1746820 A1 | 1/2007 |
| EP | 1788802 A1 | 5/2007 |
| EP | 2037505 A1 | 3/2009 |
| EP | 2063630 A1 | 5/2009 |
| EP | 2538664 A2 | 12/2012 |
| EP | 2804074 A2 | 11/2014 |
| EP | 2833619 A1 | 2/2015 |
| EP | 3032822 A1 | 6/2016 |
| EP | 3229457 A1 | 10/2017 |
| EP | 3258683 A1 | 12/2017 |
| EP | 3425352 A1 | 1/2019 |
| EP | 3425353 A1 | 1/2019 |
| EP | 3439039 A1 | 2/2019 |
| EP | 3744085 A2 | 12/2020 |
| JP | 2002199292 A | 7/2002 |
| JP | 2002314875 A | 10/2002 |
| JP | 2003319262 A | 11/2003 |
| JP | 2005328493 A | 11/2005 |
| JP | 2006203736 A | 8/2006 |
| JP | 2007074447 A | 3/2007 |
| JP | 2010239337 A | 10/2010 |
| JP | 2010283525 A | 12/2010 |
| JP | 2011216966 A | 10/2011 |
| JP | 2012095349 A | 5/2012 |
| JP | 2013009087 A | 1/2013 |
| JP | 2013090127 A | 5/2013 |
| JP | 2013172203 A | 9/2013 |
| JP | 2014165733 A | 9/2014 |
| JP | 2015103998 A | 6/2015 |
| JP | 2016092661 A | 5/2016 |
| JP | 2017139820 A | 8/2017 |
| JP | 2017227686 A | 12/2017 |
| JP | 2017536780 A | 12/2017 |
| JP | 2018082261 A | 5/2018 |
| KR | 100574959 B1 | 4/2006 |
| KR | 20110050351 A | 5/2011 |
| KR | 20120058337 A | 6/2012 |
| KR | 20140041492 A | 4/2014 |
| KR | 20150095841 A | 8/2015 |
| KR | 20160008267 A | 1/2016 |
| KR | 20160008287 A | 1/2016 |
| TW | 548962 B | 8/2003 |
| TW | 201106691 A | 2/2011 |
| TW | 201242353 A | 10/2012 |
| TW | 201705755 A | 2/2017 |
| TW | 201717381 A | 5/2017 |
| TW | 201720138 A | 6/2017 |
| TW | 201737696 A | 10/2017 |
| TW | 201921660 A | 6/2019 |
| TW | I774803 | 8/2022 |
| WO | 2006124592 A2 | 11/2006 |
| WO | 2013145753 A1 | 10/2013 |
| WO | WO-2014055391 A2 | 4/2014 |
| WO | WO-2016095057 A1 | 6/2016 |
| WO | WO-2017003477 A1 | 1/2017 |
| WO | WO-2017013806 A1 | 1/2017 |
| WO | 2017018215 A1 | 2/2017 |
| WO | WO-2017047010 A1 | 3/2017 |
| WO | WO-2017058488 A1 | 4/2017 |

(56) References Cited

FOREIGN PATENT DOCUMENTS

| WO | WO-2017069706 A1 | 4/2017 |
|----|------------------|--------|
| WO | WO-2017169446 A1 | 10/2017 |
| WO | WO-2017169882 A1 | 10/2017 |
| WO | WO-2019018084 A1 | 1/2019 |
| WO | WO-2019111528 A1 | 6/2019 |
| WO | WO-2019145578 A1 | 8/2019 |
| WO | WO-2019168929 A1 | 9/2019 |

OTHER PUBLICATIONS

Advisory Action dated Oct. 8, 2020 for U.S. Appl. No. 16/210,748, filed Dec. 5, 2018, 4 Pages.
Advisory Action dated Oct. 23, 2019 for U.S. Appl. No. 15/668,241, filed Aug. 3, 2017, 5 Pages.
Amir M.F., et al., "3-D Stacked Image Sensor With Deep Neural Network Computation," IEEE Sensors Journal, IEEE Service Center, New York, NY, US, May 15, 2018, vol. 18 (10), pp. 4187-4199, XP011681876.
Cho K., et al., "A Low Power Dual CDS for a Column-Parallel CMOS Image Sensor," Journal of Semiconductor Technology and Science, Dec. 30, 2012, vol. 12 (4), pp. 388-396.
Chuxi L., et al., "A Memristor-Based Processing-in-Memory Architechture for Deep Convolutional Neural Networks Approximate Computation," Journal of Computer Research and Development, Jun. 30, 2017, vol. 54 (6), pp. 1367-1380.
Communication Pursuant Article 94(3) dated Dec. 23, 2021 for European Application No. 19744961.4, filed Jun. 28, 2019, 8 pages.
Communication Pursuant Article 94(3) dated Jan. 5, 2022 for European Application No. 19740456.9, filed Jun. 27, 2019, 12 pages.
Corrected Notice of Allowability dated Feb. 3, 2021 for U.S. Appl. No. 16/566,583, filed Sep. 10, 2019, 2 Pages.
Corrected Notice of Allowability dated Apr. 9, 2021 for U.S. Appl. No. 16/255,528, filed Jan. 23, 2019, 5 Pages.
Corrected Notice of Allowability dated Dec. 11, 2020 for U.S. Appl. No. 16/566,583, filed Sep. 10, 2019, 2 Pages.
Corrected Notice of Allowability dated Jul. 26, 2021 for U.S. Appl. No. 16/707,988, filed Dec. 9, 2019, 2 Pages.
Corrected Notice of Allowability dated Apr. 28, 2020 for U.S. Appl. No. 15/876,061, filed Jan. 19, 2018, 2 Pages.
Extended European Search Report for European Application No. 18179838.0, dated May 24, 2019, 17 Pages.
Extended European Search Report for European Application No. 18179846.3, dated Dec. 7, 2018, 10 Pages.
Extended European Search Report for European Application No. 18179851.3, dated Dec. 7, 2018, 8 Pages.
Extended European Search Report for European Application No. 18188684.7, dated Jan. 16, 2019, 10 Pages.
Extended European Search Report for European Application No. 18188962.7, dated Oct. 23, 2018, 8 Pages.
Extended European Search Report for European Application No. 18188968.4, dated Oct. 23, 2018, 8 Pages.
Extended European Search Report for European Application No. 18189100.3, dated Oct. 9, 2018, 8 Pages.
Extended European Search Report for European Application No. 19743908.6, dated Sep. 30, 2020, 9 Pages.
Final Office Action dated Dec. 3, 2021 for U.S. Appl. No. 17/072,840, filed Oct. 16, 2020, 23 pages.
Final Office Action dated Jul. 7, 2020 for U.S. Appl. No. 16/210,748, filed Dec. 5, 2018, 11 Pages.
Final Office Action dated Jul. 12, 2021 for U.S. Appl. No. 16/435,451, filed Jun. 7, 2019, 13 Pages.
Final Office Action dated Apr. 15, 2020 for U.S. Appl. No. 16/566,583, filed Sep. 10, 2019, 24 Pages.
Final Office Action dated Jun. 17, 2019 for U.S. Appl. No. 15/668,241, filed Aug. 3, 2017, 19 Pages.
Final Office Action dated Oct. 18, 2021 for U.S. Appl. No. 16/716,050, filed Dec. 16, 2019, 18 Pages.
Final Office Action dated Oct. 21, 2021 for U.S. Appl. No. 16/421,441, filed May 23, 2019, 23 Pages.
Final Office Action dated Dec. 26, 2019 for U.S. Appl. No. 15/801,216, filed Nov. 1, 2017, 5 Pages.
Final Office Action dated Feb. 27, 2020 for U.S. Appl. No. 16/177,971, filed Nov. 1, 2018, 9 Pages.
Final Office Action dated Jan. 27, 2021 for U.S. Appl. No. 16/255,528, filed Jan. 23, 2019, 31 Pages.
Final Office Action dated Jul. 28, 2021 for U.S. Appl. No. 17/083,920, filed Oct. 29, 2020, 19 Pages.
Final Office Action dated Apr. 29, 2020 for U.S. Appl. No. 15/719,345, filed Sep. 28, 2017, 14 Pages.
International Search Report and Written Opinion for International Application No. PCT/US2018/039350, dated Nov. 15, 2018, 11 Pages.
International Search Report and Written Opinion for International Application No. PCT/US2018/039352, dated Oct. 26, 2018, 8 Pages.
International Search Report and Written Opinion for International Application No. PCT/US2018/039431, dated Nov. 7, 2018, 12 Pages.
International Search Report and Written Opinion for International Application No. PCT/US2018/045661, dated Nov. 30, 2018, 11 Pages.
International Search Report and Written Opinion for International Application No. PCT/US2018/045666, dated Dec. 3, 2018, 13 Pages.
International Search Report and Written Opinion for International Application No. PCT/US2018/045673, dated Dec. 4, 2018, 13 Pages.
International Search Report and Written Opinion for International Application No. PCT/US2018/046131, dated Dec. 3, 2018, 10 Pages.
International Search Report and Written Opinion for International Application No. PCT/US2018/064181, dated Mar. 29, 2019, 10 Pages.
International Search Report and Written Opinion for International Application No. PCT/US2019/014044, dated May 8, 2019, 9 Pages.
International Search Report and Written Opinion for International Application No. PCT/US2019/014904, dated Aug. 5, 2019, 7 Pages.
International Search Report and Written Opinion for International Application No. PCT/US2019/019756, dated Jun. 13, 2019, 11 Pages.
International Search Report and Written Opinion for International Application No. PCT/US2019/019765, dated Jun. 14, 2019, 9 Pages.
International Search Report and Written Opinion for International Application No. PCT/US2019/025170, dated Jul. 9, 2019, 11 Pages.
International Search Report and Written Opinion for International Application No. PCT/US2019/027727, dated Jun. 27, 2019, 10 Pages.
International Search Report and Written Opinion for International Application No. PCT/US2019/027729, dated Jun. 27, 2019, 9 Pages.
International Search Report and Written Opinion for International Application No. PCT/US2019/031521, dated Jul. 11, 2019, 8 Pages.
International Search Report and Written Opinion for International Application No. PCT/US2019/034007, dated Oct. 28, 2019, 18 Pages.
International Search Report and Written Opinion for International Application No. PCT/US2019/035724, dated Sep. 10, 2019, 11 Pages.
International Search Report and Written Opinion for International Application No. PCT/US2019/036484, dated Sep. 19, 2019, 9 Pages.
International Search Report and Written Opinion for International Application No. PCT/US2019/036492, dated Sep. 25, 2019, 8 Pages.
International Search Report and Written Opinion for International Application No. PCT/US2019/036536, dated Sep. 26, 2019, 13 Pages.

(56) References Cited

OTHER PUBLICATIONS

International Search Report and Written Opinion for International Application No. PCT/US2019/036575, dated Sep. 30, 2019, 15 Pages.
International Search Report and Written Opinion for International Application No. PCT/US2019/039410, dated Sep. 30, 2019, 10 Pages.
International Search Report and Written Opinion for International Application No. PCT/US2019/039758, dated Oct. 11, 2019, 12 Pages.
International Search Report and Written Opinion for International Application No. PCT/US2019/047156, dated Oct. 23, 2019, 9 Pages.
International Search Report and Written Opinion for International Application No. PCT/US2019/048241, dated Jan. 28, 2020, 16 Pages.
International Search Report and Written Opinion for International Application No. PCT/US2019/049756, dated Dec. 16, 2019, 8 pages.
International Search Report and Written Opinion for International Application No. PCT/US2019/059754, dated Mar. 24, 2020, 11 Pages.
International Search Report and Written Opinion for International Application No. PCT/US2019/065430, dated Mar. 6, 2020, 11 Pages.
International Search Report and Written Opinion for International Application No. PCT/US2019/066805, dated Mar. 6, 2020, 9 Pages.
International Search Report and Written Opinion for International Application No. PCT/US2019/066831, dated Feb. 27, 2020, 11 Pages.
International Search Report and Written Opinion for International Application No. PCT/US2020/044807, dated Sep. 30, 2020, 12 Pages.
International Search Report and Written Opinion for International Application No. PCT/US2020/058097, dated Feb. 12, 2021, 09 Pages.
International Search Report and Written Opinion for International Application No. PCT/US2020/059636, dated Feb. 11, 2021, 18 Pages.
International Search Report and Written Opinion for International Application No. PCT/US2021/031201, dated Aug. 2, 2021, 13 Pages.
International Search Report and Written Opinion for International Application No. PCT/US2021/033321, dated Sep. 6, 2021, 11 pages.
International Search Report and Written Opinion for International Application No. PCT/US2021/041775, dated Nov. 29, 2021, 14 pages.
Kavusi S., et al., "Quantitative Study of High-Dynamic-Range Image Sensor Architecture," Proceedings of Society of Photo-Optical Instrumentation Engineers, Jun. 7, 2004, vol. 5301, 12 Pages, XP055186908.
Millet L., et al., "A 5500-Frames/s 85-GOPS/W 3-D Stacked BSI Vision Chip Based on Parallel In-Focal-Plane Acquisition and Processing," IEEE Journal of Solid-State Circuits, USA, Apr. 1, 2019, vol. 54 (4), pp. 1096-1105, XP011716786.
Non-Final Office Action dated Feb. 1, 2021 for U.S. Appl. No. 16/435,451, filed Jun. 7, 2019, 14 Pages.
Non-Final Office Action dated Jan. 1, 2021 for U.S. Appl. No. 16/715,792, filed Dec. 16, 2019, 15 Pages.
Non-Final Office Action dated May 1, 2019 for U.S. Appl. No. 15/927,896, filed Mar. 21, 2018, 10 Pages.
Non-Final Office Action dated May 1, 2020 for U.S. Appl. No. 16/384,720, filed Apr. 15, 2019, 6 Pages.
Non-Final Office Action dated Oct. 1, 2019 for U.S. Appl. No. 16/286,355, filed Feb. 26, 2019, 6 Pages.
Non-Final Office Action dated Oct. 1, 2019 for U.S. Appl. No. 16/566,583, filed Sep. 10, 2019, 10 Pages.
Non-Final Office Action dated Jul. 2, 2021 for U.S. Appl. No. 16/820,594, filed Mar. 16, 2020, 8 Pages.
Non-Final Office Action dated Sep. 2, 2021 for U.S. Appl. No. 16/910,844, filed Jun. 24, 2020, 7 Pages.
Non-Final Office Action dated Dec. 4, 2020 for U.S. Appl. No. 16/436,137, filed Jun. 10, 2019, 12 Pages.
Non-Final Office Action dated Mar. 4, 2020 for U.S. Appl. No. 16/436,049, filed Jun. 10, 2019, 9 Pages.
Non-Final Office Action dated May 7, 2021 for U.S. Appl. No. 16/421,441, filed May 23, 2019, 17 Pages.
Non-Final Office Action dated Jun. 8, 2021 for U.S. Appl. No. 17/072,840, filed Oct. 16, 2020, 7 Pages.
Non-Final Office Action dated Jul. 10, 2019 for U.S. Appl. No. 15/861,588, filed Jan. 3, 2018, 11 Pages.
Non-Final Office Action dated Jul. 10, 2020 for U.S. Appl. No. 16/255,528, filed Jan. 23, 2019, 27 Pages.
Non-Final Office Action dated May 14, 2021 for U.S. Appl. No. 16/716,050, filed Dec. 16, 2019, 16 Pages.
Non-Final Office Action dated Mar. 15, 2021 for U.S. Appl. No. 16/896,130, filed Jun. 8, 2020, 16 Pages.
Non-Final Office Action dated Sep. 18, 2019 for U.S. Appl. No. 15/876,061, filed Jan. 19, 2018, 23 Pages.
Non-Final Office Action dated Apr. 21, 2021 for U.S. Appl. No. 16/453,538, filed Jun. 26, 2019, 16 Pages.
Non-Final Office Action dated Apr. 21, 2021 for U.S. Appl. No. 17/083,920, filed Oct. 29, 2020, 17 Pages.
Non-Final Office Action dated Dec. 21, 2018 for U.S. Appl. No. 15/668,241, filed Aug. 3, 2017, 16 Pages.
Non-Final Office Action dated Oct. 21, 2021 for U.S. Appl. No. 17/083,920, filed Oct. 29, 2020, 19 Pages.
Non-Final Office Action dated Jul. 22, 2020 for U.S. Appl. No. 16/249,420, filed Jan. 16, 2019, 9 Pages.
Non-Final Office Action dated Jul. 22, 2020 for U.S. Appl. No. 16/369,763, filed Mar. 29, 2019, 15 Pages.
Non-Final Office Action dated Sep. 22, 2020 for U.S. Appl. No. 16/707,988, filed Dec. 9, 2019, 15 Pages.
Non-Final Office Action dated Nov. 23, 2018 for U.S. Appl. No. 15/847,517, filed Dec. 19, 2017, 21 Pages.
Non-Final Office Action dated Jul. 25, 2019 for U.S. Appl. No. 15/909,162, filed Mar. 1, 2018, 20 Pages.
Non-Final Office Action dated Nov. 25, 2019 for U.S. Appl. No. 15/719,345, filed Sep. 28, 2017, 14 Pages.
Non-Final Office Action dated Sep. 25, 2019 for U.S. Appl. No. 16/177,971, filed Nov. 1, 2018, 9 Pages.
Non-Final Office Action dated Jun. 30, 2020 for U.S. Appl. No. 16/436,049, filed Jun. 10, 2019, 11 Pages.
Non-Final Office Action dated Jan. 31, 2020 for U.S. Appl. No. 16/210,748, filed Dec. 5, 2018, 11 Pages.
Notice of Allowability dated May 6, 2020 for U.S. Appl. No. 15/876,061, filed Jan. 19, 2018, 2 Pages.
Notice of Allowance dated Apr. 1, 2021 for U.S. Appl. No. 16/255,528, filed Jan. 23, 2019, 7 Pages.
Notice of Allowance dated May 1, 2019 for U.S. Appl. No. 15/847,517, filed Dec. 19, 2017, 11 Pages.
Notice of Allowance dated Nov. 2, 2021 for U.S. Appl. No. 16/453,538, filed Jun. 26, 2019, 8 Pages.
Notice of Allowance dated Nov. 3, 2020 for U.S. Appl. No. 16/566,583, filed Sep. 10, 2019, 11 Pages.
Notice of Allowance dated Sep. 3, 2020 for U.S. Appl. No. 15/719,345, filed Sep. 28, 2017, 12 Pages.
Notice of Allowance dated Feb. 4, 2020 for U.S. Appl. No. 15/876,061, filed Jan. 19, 2018, 13 Pages.
Notice of Allowance dated Jun. 4, 2020 for U.S. Appl. No. 16/286,355, filed Feb. 26, 2019, 7 Pages.
Notice of Allowance dated Mar. 5, 2020 for U.S. Appl. No. 15/668,241, filed Aug. 3, 2017, 8 Pages.
Notice of Allowance dated May 5, 2021 for U.S. Appl. No. 16/707,988, filed Dec. 9, 2019, 14 Pages.
Notice of Allowance dated Jan. 7, 2022 for U.S. Appl. No. 16/899,908, filed Jun. 12, 2020, 10 pages.
Notice of Allowance dated Apr. 8, 2020 for U.S. Appl. No. 15/983,391, filed May 18, 2018, 8 Pages.
Notice of Allowance dated Dec. 8, 2021 for U.S. Appl. No. 16/829,249, filed Mar. 25, 2020, 6 pages.

(56) References Cited

OTHER PUBLICATIONS

Notice of Allowance dated Jul. 8, 2021 for U.S. Appl. No. 17/150,925, filed Jan. 15, 2021, 10 Pages.
Notice of Allowance dated Jul. 9, 2020 for U.S. Appl. No. 16/454,787, filed Jun. 27, 2019, 9 Pages.
Notice of Allowance dated Sep. 9, 2020 for U.S. Appl. No. 16/454,787, filed Jun. 27, 2019, 9 Pages.
Notice of Allowance dated Jun. 11, 2020 for U.S. Appl. No. 16/382,015, filed Apr. 11, 2019, 11 Pages.
Notice of Allowance dated Aug. 12, 2020 for U.S. Appl. No. 15/719,345, filed Sep. 28, 2017, 10 Pages.
Notice of Allowance dated Feb. 12, 2020 for U.S. Appl. No. 16/286,355, filed Feb. 26, 2019, 7 Pages.
Notice of Allowance dated Jul. 13, 2021 for U.S. Appl. No. 16/896,130, filed Jun. 8, 2020, 8 Pages.
Notice of Allowance dated Oct. 14, 2020 for U.S. Appl. No. 16/384,720, filed Apr. 15, 2019, 8 Pages.
Notice of Allowance dated Oct. 15, 2020 for U.S. Appl. No. 16/544,136, filed Aug. 19, 2019, 11 Pages.
Notice of Allowance dated Apr. 16, 2021 for U.S. Appl. No. 16/715,792, filed Dec. 16, 2019, 10 Pages.
Notice of Allowance dated Sep. 16, 2020 for U.S. Appl. No. 16/435,449, filed Jun. 7, 2019, 7 Pages.
Notice of Allowance dated Nov. 17, 2021 for U.S. Appl. No. 16/899,908, filed Jun. 12, 2020, 7 Pages.
Notice of Allowance dated Sep. 17, 2021 for U.S. Appl. No. 16/899,908, filed Jun. 12, 2020, 11 Pages.
Notice of Allowance dated Mar. 18, 2020 for U.S. Appl. No. 15/909,162, filed Mar. 1, 2018, 9 Pages.
Notice of Allowance dated Nov. 18, 2020 for U.S. Appl. No. 16/249,420, filed Jan. 16, 2019, 8 Pages.
Notice of Allowance dated Oct. 18, 2019 for U.S. Appl. No. 15/983,379, filed May 18, 2018, 9 Pages.
Notice of Allowance dated Dec. 21, 2021 for U.S. Appl. No. 16/550,851, filed Aug. 26, 2019, 10 pages.
Notice of Allowance dated Oct. 21, 2020 for U.S. Appl. No. 16/436,049, filed Jun. 10, 2019, 8 Pages.
Notice of Allowance dated Apr. 22, 2020 for U.S. Appl. No. 16/454,787, filed Jun. 27, 2019, 10 Pages.
Notice of Allowance dated Dec. 22, 2021 for U.S. Appl. No. 16/910,844, filed Jun. 24, 2020, 7 pages.
Notice of Allowance dated Jan. 22, 2021 for U.S. Appl. No. 16/369,763, filed Mar. 29, 2019, 8 Pages.
Notice of Allowance dated Nov. 22, 2021 for U.S. Appl. No. 16/820,594, filed Mar. 16, 2020, 18 pages.
Notice of Allowance dated Nov. 22, 2021 for U.S. Appl. No. 16/820,594, filed Mar. 16, 2020, 8 pages.
Notice of Allowance dated Jun. 23, 2020 for U.S. Appl. No. 15/801,216, filed Nov. 1, 2017, 5 Pages.
Notice of Allowance dated Apr. 24, 2020 for U.S. Appl. No. 16/177,971, filed Nov. 1, 2018, 6 Pages.
Notice of Allowance dated Jun. 24, 2020 for U.S. Appl. No. 16/431,693, filed Jun. 4, 2019, 7 Pages.
Notice of Allowance dated Nov. 24, 2021 for U.S. Appl. No. 16/910,844, filed Jun. 24, 2020, 6 Pages.
Notice of Allowance dated Aug. 25, 2021 for U.S. Appl. No. 16/715,792, filed Dec. 16, 2019, 9 Pages.
Notice of Allowance dated Oct. 25, 2021 for U.S. Appl. No. 16/435,451, filed Jun. 7, 2019, 8 Pages.
Notice of Allowance dated Aug. 26, 2020 for U.S. Appl. No. 16/384,720, filed Apr. 15, 2019, 8 Pages.
Notice of Allowance dated Nov. 26, 2019 for U.S. Appl. No. 15/861,588, filed Jan. 3, 2018, 9 Pages.
Notice of Allowance dated Oct. 26, 2021 for U.S. Appl. No. 16/896,130, filed Jun. 8, 2020, 8 Pages.
Notice of Allowance dated Jul. 27, 2020 for U.S. Appl. No. 16/435,449, filed Jun. 7, 2019, 8 Pages.
Notice of Allowance dated Jun. 29, 2020 for U.S. Appl. No. 15/668,241, filed Aug. 3, 2017, 8 Pages.
Notice of Allowance dated Aug. 30, 2021 for U.S. Appl. No. 16/829,249, filed Mar. 25, 2020, 8 pages.
Notice of Reason for Rejection dated Nov. 16, 2021 for Japanese Application No. 2019-571699, filed Jun. 25, 2018, 13 pages.
Office Action dated Jul. 3, 2020 for Chinese Application No. 201810821296, filed Jul. 24, 2018, 17 Pages.
Office Action dated Jul. 7, 2021 for European Application No. 19723902.3, filed Apr. 1, 2019, 3 Pages.
Office Action dated Jul. 7, 2021 for European Application No. 19737299.8, filed Jun. 11, 2019, 5 Pages.
Office Action dated Mar. 9, 2021 for Chinese Application No. 201810821296, filed Jul. 24, 2018, 10 Pages.
Office Action dated Aug. 14, 2019 for European Application No. 18188968.4, filed Aug. 14, 2018, 5 Pages.
Office Action dated Dec. 14, 2021 for Japanese Application No. 2019571598, filed Jun. 26, 2018, 12 pages.
Office Action dated Nov. 26, 2019 for European Application No. 18188684.7, filed Aug. 13, 2018, 9 Pages.
Office Action dated Aug. 28, 2019 for European Application No. 18188962.7, filed Aug. 14, 2018, 6 Pages.
Office Action dated Jun. 28, 2020 for Chinese Application No. 201810821296, filed Jul. 24, 2018, 2 Pages.
Office Action dated Sep. 30, 2021 for Taiwan Application No. 107124385, 17 Pages.
Partial European Search Report for European Application No. 18179838.0, dated Dec. 5, 2018, 13 Pages.
Partial International Search Report and Provisional Opinion for International Application No. PCT/US2021/041775, dated Oct. 8, 2021, 12 pages.
Restriction Requirement dated Feb. 2, 2021 for U.S. Appl. No. 16/716,050, filed Dec. 16, 2019, 7 Pages.
Sebastian A., et al., "Memory Devices and Applications for In-memory Computing," Nature Nanotechnology, Nature Publication Group, Inc, London, Mar. 30, 2020, vol. 15 (7), pp. 529-544, XP037194929.
Shi C., et al., "A 1000fps Vision Chip Based on a Dynamically Reconfigurable Hybrid Architecture Comprising a PE Array and Self-Organizing Map Neural Network," International Solid-State Circuits Conference, Session 7, Image Sensors, Feb. 10, 2014, pp. 128-130, XP055826878.
Snoeij M.F., et al., "A low Power Column-Parallel 12-bit ADC for CMOS Imagers," XP007908033, Jun. 1, 2005, pp. 169-172.
Snoeij M.F., et al., "A Low-Power Column-Parallel 12-bit ADC for CMOS Imagers," Harvestimaging [online], Proceedings IEEE Workshop on Charge-Coupled Devices and Advanced Image Sensors (CCDS & AIS), Published date: Jun. 1, 2005, pp. 169-172, XP007908033, Retrieved from the Internet: URL: http://www.harvestimaging.com/pubdocs/084_2005_june_workshop.pdf.
Supplemental Notice of Allowability dated Apr. 29, 2020 for U.S. Appl. No. 15/668,241, filed Aug. 3, 2017, 5 Pages.
Tanner S., et al., "Low-Power Digital Image Sensor for Still Picture Image Acquisition," Visual Communications and Image Processing, San Jose, Jan. 22, 2001, vol. 4306, pp. 358-365, XP008014232.
Xu C., et al., "A New Digital-Pixel Architecture for CMOS Image Sensor with Pixel-Level ADC and Pulse Width Modulation using a 0.18 um CMOS Technology," Electron Devices and Solid-State Circuits, IEEE Conference on Kowloon, Hong Kong, Piscataway, NJ, USA, Dec. 16, 2003, pp. 265-268, XP010695857.
International Preliminary Report on Patentability for International Application No. PCT/US2020/044807, dated Feb. 17, 2022, 10 pages.
Non-Final Office Action dated Aug. 1, 2022 for U.S. Appl. No. 16/550,851, filed Aug. 26, 2019, 7 pages.
Non-Final Office Action dated Sep. 14, 2022 for U.S. Appl. No. 17/364,763, filed Jun. 30, 2021, 13 pages.
Notice of Allowance dated Jun. 14, 2022 for U.S. Appl. No. 16/453,538, filed Jun. 26, 2019, 8 pages.
Notice of Allowance dated Aug. 16, 2022 for U.S. Appl. No. 16/453,538, filed Jun. 26, 2019, 2 pages.
Notice of Allowance dated Aug. 26, 2022 for U.S. Appl. No. 16/672,427, filed Nov. 1, 2019, 3 pages.
Notice of Allowance dated Jun. 29, 2022 for U.S. Appl. No. 16/672,427, filed Nov. 1, 2019, 8 pages.

(56) References Cited

OTHER PUBLICATIONS

Notice of Allowance dated Aug. 31, 2022 for U.S. Appl. No. 16/453,538, filed Jun. 26, 2019, 2 pages.
Office Action dated Jul. 6, 2022 for Chinese Application No. 201980024435.0, filed Apr. 1, 2019, 16 pages.
Advisory Action dated Oct. 1, 2021 for U.S. Appl. No. 17/083,920, filed Oct. 29, 2020, 4 pages.
Corrected Notice of Allowability dated Dec. 1, 2021 for U.S. Appl. No. 16/210,748, filed Dec. 5, 2018, 3 pages.
Corrected Notice of Allowability dated Dec. 7, 2021 for U.S. Appl. No. 16/210,748, filed Dec. 5, 2018, 3 pages.
Corrected Notice of Allowability dated Jan. 25, 2021 for U.S. Appl. No. 16/384,720, filed Apr. 15, 2019, 4 Pages.
Corrected Notice of Allowability dated Jan. 29, 2021 for U.S. Appl. No. 16/544,136, filed Aug. 19, 2019, 2 Pages.
Corrected Notice of Allowance dated Mar. 7, 2022 for U.S. Appl. No. 17/150,925, filed Jan. 15, 2021, 2 Pages.
Extended European Search Report for European Application No. 18886564.6, dated Jan. 26, 2021, 6 Pages.
Final Office Action dated Nov. 3, 2021 for U.S. Appl. No. 16/560,665, filed Sep. 4, 2019, 19 Pages.
Final Office Action dated Jul. 8, 2021 for U.S. Appl. No. 16/672,427, filed Nov. 1, 2019, 10 Pages.
International Preliminary Report on Patentability for International Application No. PCT/US2019/027727, dated Oct. 29, 2020, 8 Pages.
International Search Report and Written Opinion for International Application No. PCT/US2021/054327, dated Feb. 14, 2022, 8 pages.
International Search Report and Written Opinion for International Application No. PCT/US2021/057966, dated Feb. 22, 2022, 15 pages.
Non-Final Office Action dated Feb. 2, 2021 for U.S. Appl. No. 16/210,748, filed Dec. 5, 2018, 8 Pages.
Non-Final Office Action dated Mar. 2, 2022 for U.S. Appl. No. 17/127,670, filed Dec. 18, 2020, 18 pages.
Non-Final Office Action dated Dec. 7, 2020 for U.S. Appl. No. 16/672,427, filed Nov. 1, 2019, 9 Pages.
Non-Final Office Action dated Jan. 8, 2020 for U.S. Appl. No. 16/285,873, filed Feb. 26, 2019, 14 Pages.
Non-Final Office Action dated Feb. 11, 2022 for U.S. Appl. No. 16/672,427, filed Nov. 1, 2019, 9 pages.
Non-Final Office Action dated Dec. 24, 2020 for U.S. Appl. No. 16/407,072, filed May 8, 2019, 15 Pages.
Non-Final Office Action dated Apr. 29, 2021 for U.S. Appl. No. 16/560,665, filed Sep. 4, 2019, 17 Pages.
Notice of Allowance dated Apr. 1, 2021 for U.S. Appl. No. 16/436,049, filed Jun. 10, 2019, 8 Pages.
Notice of Allowance dated Dec. 1, 2021 for U.S. Appl. No. 16/210,748, filed Dec. 5, 2018, 11 pages.
Notice of Allowance dated Jun. 1, 2021 for U.S. Appl. No. 16/407,072, filed May 8, 2019, 11 Pages.
Notice of Allowance dated Mar. 2, 2022 for U.S. Appl. No. 16/453,538, filed Jun. 26, 2019, 8 pages.
Notice of Allowance dated Dec. 7, 2021 for U.S. Appl. No. 16/210,748, filed Dec. 5, 2018, 11 pages.
Notice of Allowance dated Mar. 7, 2022 for U.S. Appl. No. 16/421,441, filed May 23, 2019, 18 pages.
Notice of Allowance dated Jul. 9, 2021 for U.S. Appl. No. 16/210,748, filed Dec. 5, 2018, 6 Pages.
Notice of Allowance dated Nov. 10, 2021 for U.S. Appl. No. 16/672,427, filed Nov. 1, 2019, 6 Pages.
Notice of Allowance dated Mar. 11, 2022 for U.S. Appl. No. 16/716,050, filed Dec. 16, 2019, 13 pages.
Notice of Allowance dated Sep. 13, 2021 for U.S. Appl. No. 16/407,072, filed May 8, 2019, 10 Pages.
Notice of Allowance dated Feb. 14, 2022 for U.S. Appl. No. 16/715,792, filed Dec. 16, 2019, 9 pages.
Notice of Allowance dated Dec. 16, 2021 for U.S. Appl. No. 16/407,072, filed May 8, 2019, 2 pages.
Notice of Allowance dated Feb. 16, 2022 for U.S. Appl. No. 17/150,925, filed Jan. 15, 2021, 9 pages.
Notice of Allowance dated Jun. 18, 2020 for U.S. Appl. No. 16/285,873, filed Feb. 26, 2019, 10 Pages.
Notice of Allowance dated Feb. 22, 2022 for U.S. Appl. No. 17/083,920, filed Oct. 29, 2020, 10 pages.
Notice of Allowance dated Sep. 24, 2020 for U.S. Appl. No. 15/668,241, filed Aug. 3, 2017, 13 Pages.
Notice of Allowance dated Oct. 27, 2021 for U.S. Appl. No. 16/210,748, filed Dec. 5, 2018, 6 Pages.
Notice of Allowance dated Oct. 29, 2021 for U.S. Appl. No. 16/672,427, filed Nov. 1, 2019, 9 Pages.
Notification of the First Office Action dated Oct. 28, 2021 for Chinese Application No. 2019800218483, filed Jan. 24, 2019, 17 pages.
Supplemental Notice of Allowability dated Jul. 8, 2021 for U.S. Appl. No. 16/436,049, filed Jun. 10, 2019, 2 Pages.
Office Action dated May 10, 2022 for Taiwan Application No. 108122610, 19 pages.
International Search Report and Written Opinion for International Application No. PCT/US2022/044519, dated Dec. 8, 2022, 12 pages.
Non-Final Office Action dated May 3, 2023 for U.S. Appl. No. 16/550,851, filed Aug. 26, 2019, 7 pages.
Non-Final Office Action dated Jan. 11, 2023 for U.S. Appl. No. 17/180,207, filed Feb. 19, 2021, 19 pages.
Non-Final Office Action dated Oct. 13, 2022 for U.S. Appl. No. 17/538,092, filed Nov. 30, 2021, 10 pages.
Notice of Allowance dated Jan. 12, 2023 for U.S. Appl. No. 16/550,851, filed Aug. 26, 2019, 7 pages.
Notice of Allowance dated Feb. 14, 2023 for U.S. Appl. No. 17/538,092, filed Nov. 30, 2021, 8 pages.
Notice of Allowance dated Feb. 15, 2023 for U.S. Appl. No. 17/364,763, filed Jun. 30, 2021, 9 pages.
Notice of Allowance dated Oct. 5, 2022 for U.S. Appl. No. 16/672,427, filed Nov. 1, 2019, 13 pages.
Office Action dated Jan. 13, 2023 for Taiwan Application No. 108111979, filed Apr. 3, 2019, 38 pages.
Office Action dated Feb. 14, 2023 for Japanese Patent Application No. 2020-547367, filed Apr. 1, 2019, 12 pages.
Office Action dated Jan. 17, 2023 for Taiwan Patent Application No. 108129677, filed Aug. 20, 2019, 12 pages.
Office Action dated Dec. 19, 2022 for Taiwan Patent Application No. 108130644, filed Aug. 27, 2019, 23 pages.
Office Action dated Oct. 20, 2022 for European Application No. 19740456.9, filed Jun. 27, 2019, 6 pages.
Office Action dated Oct. 26, 2022 for Taiwan Application No. 108122610, 9 pages.
Office Action dated May 9, 2023 for Japanese Patent Application No. 2020-564441, filed on Nov. 16, 2020, 13 pages.
Advisory Action dated Feb. 8, 2022 for U.S. Appl. No. 16/560,665, filed Sep. 4, 2019, 3 pages.
Corrected Notice of Allowance dated Aug. 1, 2023 for U.S. Appl. No. 17/364,763, filed Jun. 30, 2021, 2 pages.
Final Office Action dated Oct. 12, 2022 for U.S. Appl. No. 16/560,665, filed Sep. 4, 2019, 17 pages.
Non-Final Office Action dated May 4, 2023 for U.S. Appl. No. 17/849,264, filed Jun. 24, 2022, 9 pages.
Non-Final Office Action dated Mar. 16, 2022 for U.S. Appl. No. 16/560,665, filed Sep. 4, 2019, 19 pages.
Non-Final Office Action dated Apr. 26, 2023 for U.S. Appl. No. 16/560,665, filed Sep. 4, 2019, 22 pages.
Notice of Allowance dated Jun. 9, 2023 for U.S. Appl. No. 17/538,092, filed Nov. 30, 2021, 8 pages.
Notice of Allowance dated Mar. 16, 2022 for U.S. Appl. No. 16/210,748, filed Dec. 5, 2018, 6 pages.
Notice of Allowance dated Jun. 26, 2023 for U.S. Appl. No. 17/364,763, filed Jun. 30, 2021, 8 pages.
Office Action dated Jul. 4, 2023 for Japanese Patent Application No. 2020-569903, filed on Dec. 14, 2020, 05 pages.
Office Action dated Aug. 8, 2023 for Japanese Patent Application No. 2020-547367, filed on Apr. 1, 2019, 6 pages.

(56) References Cited

OTHER PUBLICATIONS

Office Action dated Jun. 20, 2023 for Japanese Patent Application No. 2020-569765, filed on Dec. 14, 2020, 10 pages.
Non-Final Office Action dated Oct. 5, 2023 for U.S. Appl. No. 17/236,433, filed Apr. 21, 2021, 14 pages.
Notice of Allowance dated Oct. 12, 2023 for U.S. Appl. No. 17/364,763, filed Jun. 30, 2021, 8 pages.
Notice of Allowance dated Sep. 15, 2023 for U.S. Appl. No. 17/538,092, filed Nov. 30, 2021, 9 pages.
Notice of Allowance dated Aug. 23, 2023 for U.S. Appl. No. 17/180,207, filed Feb. 19, 2021, 11 pages.

\* cited by examiner

PIXEL SENSOR HAVING MULTIPLE PHOTODIODES

RELATED APPLICATION

This patent application is a continuation of U.S. Non-Provisional application Ser. No. 16/453,538, filed Jun. 26, 2019, entitled "PIXEL SENSOR HAVING MULTIPLE PHOTODIODES," which claims priority to U.S. Provisional Patent Application No. 62/690,571, filed Jun. 27, 2018, entitled "Digital Pixel Sensor with Multiple Photodiodes," and which are assigned to the assignee hereof and are incorporated herein by reference in their entirety for all purposes.

BACKGROUND

The disclosure relates generally to image sensors, and more specifically to pixel cell structure including interfacing circuitries for determining light intensity for image generation.

A typical pixel in an image sensor includes a photodiode to sense incident light by converting photons into charge (e.g., electrons or holes). The incident light can include components of different wavelength ranges for different applications, such as 2D and 3D sensing. Moreover, to reduce image distortion, a global shutter operation can be performed in which each photodiode of the array of photodiodes senses the incident light simultaneously in a global exposure period to generate the charge. The charge can be converted by a charge sensing unit (e.g., a floating diffusion) to convert to a voltage. The array of pixel cells can measure different components of the incident light based on the voltages converted by the charge sensing unit and provide the measurement results for generation of 2D and 3D images of a scene.

SUMMARY

The present disclosure relates to image sensors. More specifically, and without limitation, this disclosure relates to a pixel cell. This disclosure also relates to operating the circuitries of pixel cells to generate a digital representation of the intensity of incident light.

In one example, an apparatus comprises: a plurality of photodiodes, each photodiode being configured to convert a component of incident light of a wavelength range to charge; one or more charge sensing units; one or more analog-to-digital converters (ADCs); a memory; and a controller configured to: enable the each photodiode to generate charge in response to a different component of the incident light; transfer the charge from the plurality of photodiodes to the one or more charge sensing units to convert to voltages; receive a selection of one or more quantization processes of a plurality of quantization processes corresponding to a plurality of intensity ranges; based on the selection, control the one or more ADCs to perform the selected one or more quantization processes to quantize the voltages from the one or more charge sensing units to digital values representing components of a pixel of different wavelength ranges; store at least some of the digital values in the memory; and generate a pixel value based on the at least some of the digital values stored in the memory.

In some aspects, the each photodiode is configured to, within an integration period, accumulate at least a part of the charge as residual charge until the each photodiode saturates, and to transfer the remaining charge as overflow charge to the one or more charge sensing unit after the photodiode saturates. The one or more charge sensing unit comprises a charge storage device having a configurable capacitance. The plurality of quantization operations comprise: a first quantization operation to generate a first digital value representing a quantity of the overflow charge received by the charge storage device configured at a maximum capacitance, the first quantization operating being associated with a first intensity range; and a second quantization operation to, after the residual charge is transferred to the charge storage device configured at a minimum capacitance, generate a second digital value representing a quantity of the residual charge stored at the charge storage device, the second quantization operation being associated with a second intensity range lower than the first intensity range.

In some aspects, the plurality of quantization operations comprises a third quantization operation to generate a third digital value representing a time-of-saturation of the charge storage device caused by the overflow charge.

In some aspects, the apparatus further comprises a light receiving surface through which the plurality of the photodiodes receives the incident light. The plurality of photodiodes forms a stack structure with respect to the light receiving surface such that the each photodiode is separated from the light receiving surface by a different distance. The component converted by the each photodiode is based on the respective distance between the each photodiode and the light receiving surface.

In some aspects, the apparatus further comprises a filter array on a first side of the light receiving surface, the filter array having filter elements positioned at a plurality of locations on the first side of the light receiving surface to set a component of the incident light that enters the light receiving surface at the respective location. The plurality of photodiodes correspond to a plurality of sub-pixels and are positioned at the plurality of locations on a second side of the light receiving surface to receive the respective components of the incident light.

In some aspects, the apparatus further comprises a single microlens over a plurality of filter arrays including the filter array and configured to project the incident light received from one spot of a scene towards the plurality of locations on the first side of the light receiving surface.

In some aspects, the apparatus further comprises a plurality of microlenses including a first microlens, the first microlens covering the filter array and configured to project the incident light received from one spot of a scene towards the plurality of locations on the first side of the light receiving surface.

In some aspects, the one or more sensing unit comprises a single charge sensing unit. The one or more ADCs comprises a single ADC coupled with an output of the single charge sensing unit. The apparatus further comprises a plurality of switches, each switch coupled between a photodiode of the plurality of photodiodes and an input of the single charge sensing unit. The controller is configured to: control the plurality of switches to transfer the charge generated by the each photodiode to the single charge sensing unit to convert to voltages; and control the single ADC to quantize the voltages generated by the single charge sensing unit.

In some aspects, the controller is configured to: control a first switch of the plurality of switches to transfer a first overflow charge from a first photodiode of the plurality of photodiodes to the single charge sensing unit to convert to a first voltage; based on the selection, control the single ADC to perform at least one of the first or third quantization operations of the first voltage to generate a first digital value; control the first switch to transfer a first residual charge from the first photodiode to the single charge sensing unit to convert to a second voltage; based on the selection, control the single ADC to perform the second quantization operation of the second voltage to generate a second digital value; control a second switch of the plurality of switches to transfer a second residual charge from a second photodiode of the plurality of photodiodes to the single charge sensing unit to convert to a third voltage; based on the selection, control the single ADC to perform the second quantization operation of the third voltage to generate a third digital value; and output, from the memory, generate the pixel value based on one of first digital value and the second digital value.

In some aspects, each of the photodiodes has a different full well capacity for storing the residual charge. The controller is configured to: control the plurality of switches to transfer overflow charge from each photodiode of the plurality of photodiodes to the single charge storage unit simultaneously to generate a first voltage; and based on the selection, control the single ADC to quantize the first voltage using at least one of the first or third quantization operations to generate a first digital value; control the plurality of switches to transfer residual charge from the each photodiode to the single charge storage unit at different times to generate second voltages each corresponding the respective residual charge from the each photodiode; based on the selection, control the single ADC to quantize the second voltages using the second quantization operation to generate second digital values; and generate the pixel value based on the first digital value and the second digital values.

In some aspects, the controller is configured to, within a first time period: control the plurality of switches to transfer overflow charge from each photodiode of the plurality of photodiodes to the single charge sensing unit at different times to generate first voltages each corresponding the respective overflow charge from the each photodiode; and based on the selection, control the single ADC to quantize the first voltages using at least one of the first or third quantization operations to generate first digital values. The controller is further configured to, within a second time period: control the plurality of switches to transfer residual charge from the each photodiode to the single charge storage unit at different times to generate second voltages each corresponding to the respective residual charge from the each photodiode; and based on the selection, control the single ADC to quantize the second voltages using the second quantization operation to generate second digital values; and generate the pixel value based on at least some of the first digital values and the second digital values.

In some aspects, the one or more sensing unit comprises a plurality of charge sensing units corresponding to the plurality of photodiodes. The apparatus further comprises a plurality of switches each coupled between each charge sensing unit of the plurality of charge sensing units and a corresponding photodiode of the plurality of photodiodes.

In some aspects, the controller is configured to: enable a first photodiode of the plurality of the photodiodes to transfer a first charge to a first charge sensing unit of the plurality of charge sensing units to generate a first voltage; enable a second photodiode of the plurality of the photodiodes to transfer a second charge to a second charge sensing unit of the plurality of charge sensing units to generate a second voltage; based on the selection, control the one or more ADCs to perform the first quantization operation of the first voltage to generate a first digital value, followed by the second or third quantization operations of the second voltage to generate a second digital value; and generate the pixel value based on the first digital value and the second digital value.

In some aspects, the controller is configured to, within a first time period: enable a first photodiode of the plurality of the photodiodes to generate a first charge in response to the incident light; enable the first photodiode to transfer a first overflow charge of the first charge to a first charge sensing unit of the plurality of charge sensing units to generate a first voltage; and based on the selection, control the one or more ADCs to perform the third quantization operation of the first voltage to generate a first digital value representing a first time-to-saturation. The controller is further configured to, within a second time period: enable a second photodiode of the plurality of the photodiodes to generate a second charge in response to the incident light; enable the second photodiode to transfer a second overflow charge of the second charge to a second charge sensing unit of the plurality of charge sensing units to generate a second voltage; and based on the selection, control the one or more ADCs to perform the third quantization operation of the second voltage to generate a second digital value representing a second time-to-saturation. The controller is further configured to generate the pixel value based on the first digital value and the second digital value.

In some aspects, the plurality of charge sensing units comprises a first charge sensing unit, a second charge sensing unit, a third charge sensing unit, and a fourth charge sensing unit. The one or more ADCs comprise a first ADC and a second ADC. The controller is configured to: control the first ADC to quantize a first voltage from the first charge sensing unit and a second voltage from the second charge sensing unit; and control the second ADC to quantize a third voltage from the third charge sensing unit and a third voltage from the second charge sensing unit.

In some aspects, the controller is configured to store each of the digital values in the memory.

In some aspects, the controller is configured to: control the one or more ADC to generate a first digital value based on quantizing a first voltage corresponding to charge generated by a first photodiode of the plurality of photodiodes; store the first digital value in the memory; read the first digital value to compute the pixel value; control the one or more ADC to generate a second digital value based on quantizing a second voltage corresponding to charge generated by a second photodiode of the plurality of photodiodes; overwrite the first digital value with a second digital value in the memory; and read the second digital value to compute the pixel value.

In one example, a method is provided. The method comprises: enabling each photodiode of a plurality of photodiodes of a pixel cell to generate charge in response to a different component of incident light received by the pixel cell; transferring the charge from the plurality of photodiodes to the one or more charge sensing units to convert to voltages; receiving, for each photodiode of the plurality of photodiodes, a selection of one or more quantization processes of a plurality of quantization processes corresponding to a plurality of intensity ranges; based on the selection, controlling the one or more ADCs to perform the selected one or more quantization processes to quantize the voltages from the one or more charge sensing units to digital values representing components of a pixel of different wavelength ranges; storing at least some of the digital values in a memory; and generating a pixel value based on the at least some of the digital values stored in the memory.

In some aspects, the plurality of quantization processes comprises a first quantization process to measure a quantity of residual charge accumulated at a first photodiode of the plurality of photodiodes before the first photodiode saturates, a second quantization process to measure a quantity of overflow charge transferred by the first photodiode after the first photodiode saturates, and a third quantization process to measure a time-to-saturation of the one or more charge sensing units caused by the overflow charge from the first photodiode.

BRIEF DESCRIPTION OF THE DRAWINGS

Illustrative examples are described with reference to the following figures.

Figure 1A:
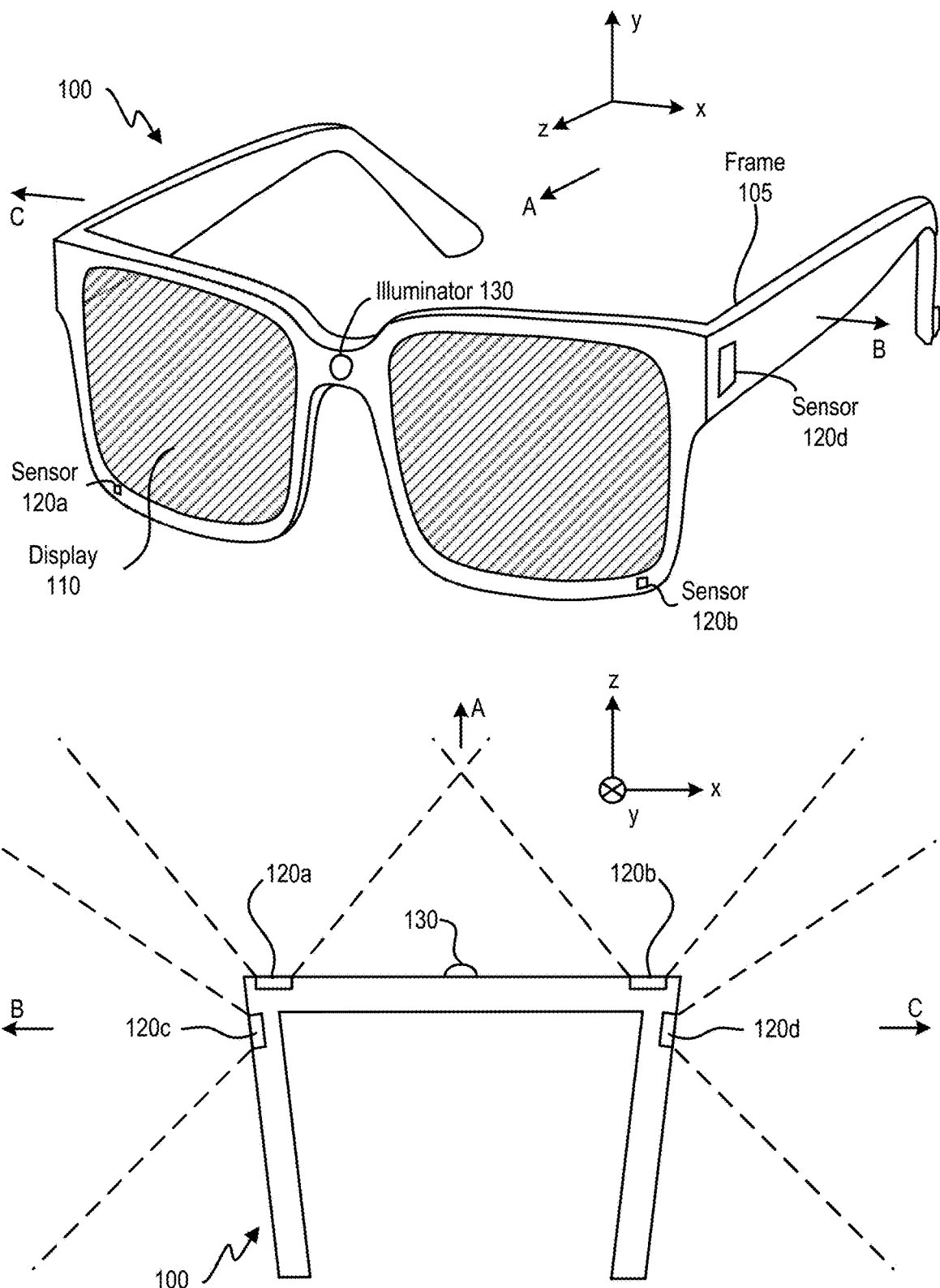
FIGS. 1A and 1B are diagrams of an example of a near-eye display.

The figures depict examples of the present disclosure for purposes of illustration only. One skilled in the art will readily recognize from the following description that alternative examples of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive examples. However, it will be apparent that various examples may be practiced without these specific details. The figures and description are not intended to be restrictive.

A typical image sensor includes an array of pixel cells. Each pixel cell includes a photodiode to measure the intensity incident light by converting photons into charge (e.g., electrons or holes). The charge generated by the photodiode can be converted to a voltage by a charge sensing unit, which can include a floating drain node. The voltage can be quantized by an analog-to-digital converter (ADC) into a digital value. The digital value can represent an intensity of light received by the pixel cell and can form a pixel, which can correspond to light received from a spot of a scene. An image comprising an array of pixels can be derived from the digital outputs of the array of pixel cells.

An image sensor can be used to perform different modes of imaging, such as 2D and 3D sensing. The 2D and 3D sensing can be performed based on light of different wavelength ranges. For example, visible light can be used for 2D sensing, whereas invisible light (e.g., infra-red light) can be used for 3D sensing. An image sensor may include an optical filter array to allow visible light of different optical wavelength ranges and colors (e.g., red, green, blue, monochrome, etc.) to a first set of pixel cells assigned for 2D sensing, and invisible light to a second set of pixel cells assigned for 3D sensing.

To perform 2D sensing, a photodiode at a pixel cell can generate charge at a rate that is proportional to an intensity of visible light component (e.g., red, green, blue, monochrome, etc.) incident upon the pixel cell, and the quantity of charge accumulated in an exposure period can be used to represent the intensity of visible light (or a certain color component of the visible light). The charge can be stored temporarily at the photodiode and then transferred to a capacitor (e.g., a floating diffusion) to develop a voltage. The voltage can be sampled and quantized by an analog-to-digital converter (ADC) to generate an output corresponding to the intensity of visible light. An image pixel value can be generated based on the outputs from multiple pixel cells configured to sense different color components of the visible light (e.g., red, green, and blue colors).

Moreover, to perform 3D sensing, light of a different wavelength range (e.g., infra-red light) can be projected onto an object, and the reflected light can be detected by the pixel cells. The light can include structured light, light pulses, etc. The pixel cells outputs can be used to perform depth sensing operations based on, for example, detecting patterns of the reflected structured light, measuring a time-of-flight of the light pulse, etc. To detect patterns of the reflected structured light, a distribution of quantities of charge generated by the pixel cells during the exposure time can be determined, and pixel values can be generated based on the voltages corresponding to the quantities of charge. For time-of-flight measurement, the timing of generation of the charge at the photodiodes of the pixel cells can be determined to represent the times when the reflected light pulses are received at the pixel cells. Time differences between when the light pulses are projected to the object and when the reflected light pulses are received at the pixel cells can be used to provide the time-of-flight measurement.

A pixel cell array can be used to generate information of a scene. In some examples, a subset (e.g., a first set) of the pixel cells within the array can detect visible components of light to perform 2D sensing of the scene, and another subset (e.g., a second set) of the pixel cells within the array can detect an infra-red component of the light to perform 3D sensing of the scene. The fusion of 2D and 3D imaging data are useful for many applications that provide virtual-reality (VR), augmented-reality (AR) and/or mixed reality (MR) experiences. For example, a wearable VR/AR/MR system may perform a scene reconstruction of an environment in which the user of the system is located. Based on the reconstructed scene, the VR/AR/MR can generate display effects to provide an interactive experience. To reconstruct a scene, a subset of pixel cells within a pixel cell array can perform 3D sensing to, for example, identify a set of physical objects in the environment and determine the distances between the physical objects and the user. Another subset of pixel cells within the pixel cell array can perform 2D sensing to, for example, capture visual attributes including textures, colors, and reflectivity of these physical objects. The 2D and 3D image data of the scene can then be merged to create, for example, a 3D model of the scene including the visual attributes of the objects. As another example, a wearable VR/AR/MR system can also perform a head tracking operation based on a fusion of 2D and 3D image data. For example, based on the 2D image data, the VR/AR/AR system can extract certain image features to identify an object. Based on the 3D image data, the VR/AR/AR system can track a location of the identified object relative to the wearable device worn by the user. The VR/AR/AR system can track the head movement based on, for example, tracking the change in the location of the identified object relative to the wearable device as the user's head moves.

Using different sets of pixel cells for sensing different incident light components (e.g., different visible light components, visible light versus infra-red light, etc.) can pose a number of challenges. First, because only a subset of the pixel cells of the array is used to measure a particular incident light component, the spatial resolution of the imaging can be reduced. For example, in a case where different subsets of the pixel cells are used for 2D imaging or 3D imaging, the spatial resolutions of both of the 2D image and 3D image are lower than the maximum spatial resolution available at the pixel cell array. Likewise, the spatial resolution for imaging of a particular visible light component is also lower than the maximum spatial resolution available at the pixel cell array. Although the resolutions can be improved by including more pixel cells, such an approach can lead to increases in the form-factor of the image sensor as well as power consumption, both of which are undesirable especially for a wearable device.

Moreover, since pixel cells assigned to measure light of different wavelength ranges are not collocated, different pixel cells may capture information of different spots of a scene, which can complicate the mapping between images of different incident light components. For example, a pixel cell that receives a certain color component of visible light (for 2D imaging) and a pixel cell that receives invisible light (for 3D imaging) may also capture information of different spots of the scene. The output of these pixel cells cannot be simply merged to generate the 2D and 3D images. The lack of correspondence between the output of the pixel cells due to their different locations can be worsened when the pixel cell array is capturing 2D and 3D images of a moving object. While there are processing techniques available to correlate different pixel cell outputs to generate pixels for a 2D image, and to correlate between 2D and 3D images (e.g., interpolation), these techniques are typically computation-intensive and can also increase power consumption. Similar problems can occur in the mapping of pixel cells associated with different visible light components for reconstruction of a 2D image.

The present disclosure relates to an image sensor having an array of pixel cells and can provide collocated imaging of different components of incident light from a spot of a scene, and to provide a global shutter operation. Specifically, each pixel cell can include a plurality of photodiodes, one or more charge sensing units, one or more analog-to-digital converters (ADCs), a memory, and a controller. Each photodiode of the plurality of photodiodes is configured to convert a component of incident light to charge. The controller can transfer the charge from the plurality of photodiodes to the one or more charge sensing units to convert to voltages. The controller can also receive a selection of one or more quantization processes of a plurality of quantization processes corresponding to a plurality of intensity ranges and, based on the selection, control the ADCs to perform the selected one or more quantization processes to quantize the voltages from the one or more charge sensing units to digital values representing components of a pixel, which can correspond to the spot of the scene. The controller can also store at least some of the digital values in the memory, and generate a pixel value based on the at least some of the digital values stored in the memory. The pixel values from the array of the pixel cells can represent the incident light received by each pixel cell within a global exposure period to support the global shutter operation.

Various techniques are proposed to enable the plurality of photodiodes to convert different components of incident light from a spot of a scene. the pixel cell includes a light receiving surface through which the plurality of the photodiodes receives the incident light. In some examples, the plurality of photodiodes forms a stack structure with respect to the light receiving surface such that the each photodiode is separated from the light receiving surface by a different distance. As the incident light propagates through the stack structure, different components can be absorbed and converted by the each photodiode based on the respective distance between the each photodiode and the light receiving surface. In some examples, each photodiode can be formed in a semiconductor substrate. The pixel cell can be formed by stacking a plurality of semiconductor substrates comprising the plurality of photodiodes with the light receiving surface being formed on the top or the bottom semiconductor substrate in the stack.

In some examples, the plurality of photodiodes can be arranged laterally and having the same distance from the receiving surface, with each photodiode corresponding to a sub-pixel and configured to receive incident light from the same spot of the scene. A filter array can be positioned on a first side of the light receiving surface of the pixel cell. The filter array may include filter elements positioned at a plurality of locations on the first side of the light receiving surface to set a component of the incident light that enters the light receiving surface at the respective location. The plurality of photodiodes can be in a single semiconductor substrate and positioned at the plurality of locations on a second side of the light receiving surface to receive the respective components of the incident light. In some examples, one or more microlens can be positioned over the filter array to project the incident light received from that same spot of the scene towards the plurality of locations on the first side of the light receiving surface, such that each photodiode, as a sub-pixel, can receive incident light from that same spot.

The one or more charge sensing units may include a configurable charge storage device and a buffer to convert the charge generated by the plurality of photodiodes to voltages. The configurable charge storage device may include a floating drain to accumulate the charge from the plurality of photodiodes to generate the voltages. An auxiliary capacitor (e.g., a metal capacitor, a metal-oxide-semiconductor (MOS) capacitor, etc.) can be connected or disconnected from the floating drain to expand or reduce the capacitance of the charge storage device. A buffer can buffer the voltage at the charge storage device to increase its driving strength. In one example, the one or more charge sensing units may include a single charge sensing unit which can be shared among the plurality of photodiodes to perform charge-to-voltage conversion. In one example, the one or more charge sensing units may include a plurality of charge sensing units each corresponding to a photodiode of the plurality of photodiodes and configured to convert the charge generated by the respective photodiode to a voltage. In both examples, the pixel cell further includes a plurality of switches, with each switch coupled between a photodiode and the shared/corresponding charge sensing unit, which can be controlled by the controller to control the transfer of the charge from the photodiode to the charge sensing unit. In a case where the one or more ADCs are shared among the plurality of charge sensing units, each charge sensing unit can also include a switch coupled between the buffer and the one or more ADCs which can be controlled by the controller to select which of the charge sensing unit to provide an output voltage to the one or more ADCs.

The controller can control the one or more ADCs to quantize the output voltages output by the one or more charge sensing units. The one or more ADCs can be shared between the charge sensing units (in a case where the pixel cell includes multiple charge sensing units), or may include a single ADC coupled with a single charge sensing unit of the pixel cell. The one or more ADCs can quantize the voltages based on different quantization operations associated with different intensity ranges, which can increase the dynamic range of the light intensity measurement operation. Specifically, each photodiode can generate a quantity of charge within an exposure period, with the quantity of charge representing the incident light intensity. Each photodiode also has a quantum well to store at least some of the charge as residual charge. For a low light intensity range, the photodiode can store the entirety of the charge as residual charge in the quantum well. For a medium light intensity range, the quantum well can be saturated by the residual charge, and the photodiode can transfer the remaining charge as overflow charge to the one or more charge sensing units. The quantum well capacity can be set based on a bias voltage on the switch between the photodiode and the charge sensing unit. For a high light intensity range, the charge storage device in the one or more charge sensing unit can be saturated by the overflow charge. The controller can control the one or more ADCs to perform different quantization operations for the high intensity range, the medium intensity range, and for the low intensity range based on measuring the overflow charge and residual charge.

Specifically, for measurement of the high light intensity range, the controller can control the one or more ADCs to perform a time-to-saturation (TTS) measurement operation by quantizing the time it takes for the charge storage device to become saturated by the overflow charge. The TTS measurement can be performed within the exposure time, and when the photodiode is coupled with the charge sensing unit and the output of the charge sensing unit is coupled with the one or more ADCs. The capacity of the charge storage device can be maximized by connecting the floating drain with the auxiliary capacitor for the TTS operation. In the TTS operation, a counter can start at the beginning of the exposure time. The one or more ADCs can compare the output voltage of the charge sensing unit with a static threshold representing the saturation limit of the charge storage device to generate a decision. When the decision indicates that the output of the charge sensing unit reaches the threshold, a count value from the counter can be stored in the memory to represent a time-to-saturation. The TTS operation can be performed when the light intensity is so high that the charge storage device becomes saturated and the output of the charge sensing unit no longer correlates with the quantity of charge generated (and the light intensity), which can extend the upper limit of the dynamic range.

For measurement of the medium intensity range in which the charge storage device is not saturated by the overflow charge, the controller can control the one or more ADCs to perform a FD ADC measurement operation to measure a quantity of the overflow charge stored in the charge storage device. The FD ADC measurement can be performed within the exposure period, and when the photodiode is coupled with the charge sensing unit which can temporarily store the overflow charge and convert the stored charge to a first voltage. The one or more ADCs can compare the first voltage with a first ramping voltage to generate a decision. The counter can start counting at the starting point of the ramping voltage, and the memory can store the count value when the first ramping voltage reaches the first voltage. The stored count value can represent the quantity of the overflow charge. In a case where multiple charge sensing units share an ADC, the ADC can compare the first voltages output by each charge sensing unit sequentially with the ramping voltage to generate the count values.

For measurement of the low intensity range in which the photodiode's quantum well is not saturated by the residual charge, the controller can control the one or more ADCs to perform a PD ADC measurement operation to measure a quantity of the residual charge stored in photodiode. To perform the PD ADC measurement operation, the controller can control the switch between the photodiode and the charge sensing unit to transfer the residual charge out of the photodiode into the charge storage device to convert to a second voltage. The capacitance of the charge storage device can also be reduced (e.g., by disconnecting the auxiliary capacitor) to maximize the charge-to-voltage conversion gain, which can reduce the quantization error. The one or more ADCs can compare the second voltage with a second ramping voltage to generate a decision. The counter can start counting at the starting point of the second ramping voltage, and the memory can store the count value when the second ramping voltage reaches the second voltage. The stored count value can represent the quantity of the residual charge. The PD ADC operation (and the transfer of the residual charge) can be performed after the exposure period. In a case where multiple photodiodes share a charge sensing unit, the controller can the perform the PD ADC operation for each photodiode sequentially, in which the controller can control the switches to transfer the residual charge from one photodiode to the charge sensing unit to generate the second voltage, and control the ADC to quantize the second voltage, and then repeat the operation for other photodiodes. As the residual charge is typically much less susceptible to dark current in the photodiode, the noise floor of the low light intensity measurement can be lowered, which can further extend the lower limit of the dynamic range.

The controller can control the ADCs to perform one or more of the aforementioned quantization operations for each photodiode based on the sharing arrangements of the one or more charge sensing units and the one or more ADCs among the plurality of the photodiodes, as well as the selection of the quantization operations. As described above, a single charge sensing unit can be shared among the plurality of photodiodes. In some examples, the controller can control the switches to allow each photodiode to take turn to transfer overflow charge to the single charge sensing unit to generate the first voltage, which can then be quantized by the ADC in a TTS operation and/or a FD ADC operation based on the selection. The charge sensing unit can be reset between the start of quantization operations for a photodiode. Followed by the completion of the quantization of the overflow charge, the controller can control the switches to allow each photodiode to take turn in transferring residual charge to the charge sensing unit, followed by a PD ADC operation to measure the residual charge. While such arrangements allow each photodiode to have the same access to the charge sensing unit and the same set of quantization operations can be performed on the outputs of each photodiode, each photodiode may have different effective exposure periods for accumulating overflow charge, which can degrade the global shutter operation.

In some examples, the controller can also allow, based on the selection, a first photodiode to transfer overflow charge to the charge sensing unit to perform the TTS and FD ADC operations within the exposure period. After the exposure period ends, the controller can control the switches to allow all of the photodiodes to take turn to transfer residual charge to the charge sensing unit and to perform the PD ADC operations. Such arrangements can be used when, for example, the intensity of a particular component is very high compared with other components (e.g., in a dark environment with strong infra-red illumination for 3D sensing). The same exposure period can be provided for each photodiode to either accumulate charge for the strong infra-red component or for the other much weaker visible light components. The TTS and FD ADC operations can be performed on the output of the photodiode that detects the strong infra-red component, while PD ADC operations can be performed on the outputs of other photodiodes, which can improve the dynamic range of both the low intensity (for visible light) and the high intensity (for infra-red light) measurement operations.

In some examples, the controller can also some or all of the photodiodes to transfer overflow charge to the charge sensing unit simultaneously. For example, photodiodes configured to detect the same wavelength range can transfer overflow charge to the charge sensing unit simultaneously. Moreover, for photodiodes that detect different wavelength ranges, the controller can set the biases of their switches to set different quantum well capacities for these photodiodes. For example, the controller can lower the quantum well capacity for a photodiode associated with a particular wavelength range which is expected to the be strongest among other wavelength ranges, such that that photodiode is more likely to transfer overflow charge to the charge sensing unit than other photodiodes. Such arrangements not only provide same exposure period for each photodiode, as in the example described above, but also enhance flexibility in the light measurement operation. Specifically, while the TTS/FD ADC operation output is more likely to represent the output of the expected strongest component of the incident light, when the operation condition changes and the intensities of other components also increase, the TTS/FD ADC operation output can reflect the other high intensity components of the incident light as well.

In a case where each photodiode has full access to a charge sensing unit, but the charge sensing units share one or more ADCs, the controller can also adapt the quantization operations based on the sharing of the ADCs. For example, based on the selection, the controller can control the switches in the charge sensing units to connect one of the photodiode (and its charge sensing unit) to the ADC to perform the TTS operation within the integration period. After the TTS operation completes, the controller can control the ADC to perform a FD ADC operation and/or a PD ADC operation (e.g., based on the selection) for each of the photodiodes and the corresponding charge sensing unit. In some examples, the controller can also control the switches in the charge sensing units to take turn in connecting with the ADC to perform the TTS operation. After the TTS operations for all of the photodiodes complete, the controller can control the ADC to perform a FD ADC operation and/or a PD ADC operation for each of the photodiodes sequentially.

The memory can be configured to store the quantization results for each of the photodiodes. In some examples, the memory can be configured to store the quantization results for all of the photodiodes simultaneously. In some examples, the quantization results of each photodiode can be stored in the memory sequentially. The quantization results of one photodiode of the pixel cell can be stored in the memory, read out for generation of the pixel value, and then overwritten by the quantization results of another photodiode of the pixel cell.

With examples of the present disclosure, a pixel cell can perform collocated imaging for different components of incident light, which can support collocated 2D and 3D imaging operations. Having the same set of pixel cells to perform sensing of different components can facilitate the correspondence between images of different components generated by the pixel cells. Moreover, given that every pixel cell of a pixel cell array can be used to generate the image, the full spatial resolution of the pixel cell array can be utilized. As a result, the spatial resolutions of the images can also be improved. Further, typically the ADCs consume a lot of power and occupies a lot of space. By sharing the ADCs among the photodiodes of each pixel cell, the form factor and power consumption of the image sensor can also be reduced, while the ADCs of each pixel cell of a pixel cell array can generate a pixel value based on incident light received by each pixel cell within the same global exposure period to support a global shutter operation to reduce image distortion.

The disclosed techniques may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some examples, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1A is a diagram of an example of a near-eye display 100. Near-eye display 100 presents media to a user. Examples of media presented by near-eye display 100 include one or more images, video, and/or audio. In some examples, audio is presented via an external device (e.g., speakers and/or headphones) that receives audio information from the near-eye display 100, a console, or both, and presents audio data based on the audio information. Near-eye display 100 is generally configured to operate as a virtual reality (VR) display. In some examples, near-eye display 100 is modified to operate as an augmented reality (AR) display and/or a mixed reality (MR) display.

Near-eye display 100 includes a frame 105 and a display 110. Frame 105 is coupled to one or more optical elements. Display 110 is configured for the user to see content presented by near-eye display 100. In some examples, display 110 comprises a waveguide display assembly for directing light from one or more images to an eye of the user.

Near-eye display 100 further includes image sensors 120a, 120b, 120c, and 120d. Each of image sensors 120a, 120b, 120c, and 120d may include a pixel cell array configured to generate image data representing different fields of views along different directions. For example, sensors 120a and 120b may be configured to provide image data representing two fields of view towards a direction A along the Z axis, whereas sensor 120c may be configured to provide image data representing a field of view towards a direction B along the X axis, and sensor 120d may be configured to provide image data representing a field of view towards a direction C along the X axis.

In some examples, sensors 120a-120d can be configured as input devices to control or influence the display content of the near-eye display 100, to provide an interactive VR/AR/MR experience to a user who wears near-eye display 100. For example, sensors 120a-120d can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some examples, the location tracking system may operate a SLAM algorithm to track a set of objects in the physical environment and within a view of field of the user as the user moves within the physical environment. The location tracking system can construct and update a map of the physical environment based on the set of objects, and track the location of the user within the map. By providing image data corresponding to multiple fields of views, sensors 120a-120d can provide the location tracking system a more holistic view of the physical environment, which can lead to more objects to be included in the construction and updating of the map. With such an arrangement, the accuracy and robustness of tracking a location of the user within the physical environment can be improved.

In some examples, near-eye display 100 may further include one or more active illuminators 130 to project light into the physical environment. The light projected can be associated with different frequency spectrums (e.g., visible light, infra-red light, ultra-violet light, etc.), and can serve various purposes. For example, illuminator 130 may project light in a dark environment (or in an environment with low intensity of infra-red light, ultra-violet light, etc.) to assist sensors 120a-120d in capturing images of different objects within the dark environment to, for example, enable location tracking of the user. Illuminator 130 may project certain markers onto the objects within the environment, to assist the location tracking system in identifying the objects for map construction/updating.

In some examples, illuminator 130 may also enable stereoscopic imaging. For example, one or more of sensors 120a or 120b can include both a first pixel cell array for visible light sensing and a second pixel cell array for infra-red (IR) light sensing. The first pixel cell array can be overlaid with a color filter (e.g., a Bayer filter), with each pixel of the first pixel cell array being configured to measure intensity of light associated with a particular color (e.g., one of red, green or blue colors). The second pixel cell array (for IR light sensing) can also be overlaid with a filter that allows only IR light through, with each pixel of the second pixel cell array being configured to measure intensity of IR lights. The pixel cell arrays can generate an RGB image and an IR image of an object, with each pixel of the IR image being mapped to each pixel of the RGB image. Illuminator 130 may project a set of IR markers on the object, the images of which can be captured by the IR pixel cell array. Based on a distribution of the IR markers of the object as shown in the image, the system can estimate a distance of different parts of the object from the IR pixel cell array, and generate a stereoscopic image of the object based on the distances. Based on the stereoscopic image of the object, the system can determine, for example, a relative position of the object with respect to the user, and can update the image data provided to display 100 based on the relative position information to provide the interactive experience.

As discussed above, near-eye display 100 may be operated in environments associated with a very wide range of light intensities. For example, near-eye display 100 may be operated in an indoor environment or in an outdoor environment, and/or at different times of the day. Near-eye display 100 may also operate with or without active illuminator 130 being turned on. As a result, image sensors 120a-120d may need to have a wide dynamic range to be able to operate properly (e.g., to generate an output that correlates with the intensity of incident light) across a very wide range of light intensities associated with different operating environments for near-eye display 100.

Figure 1B:
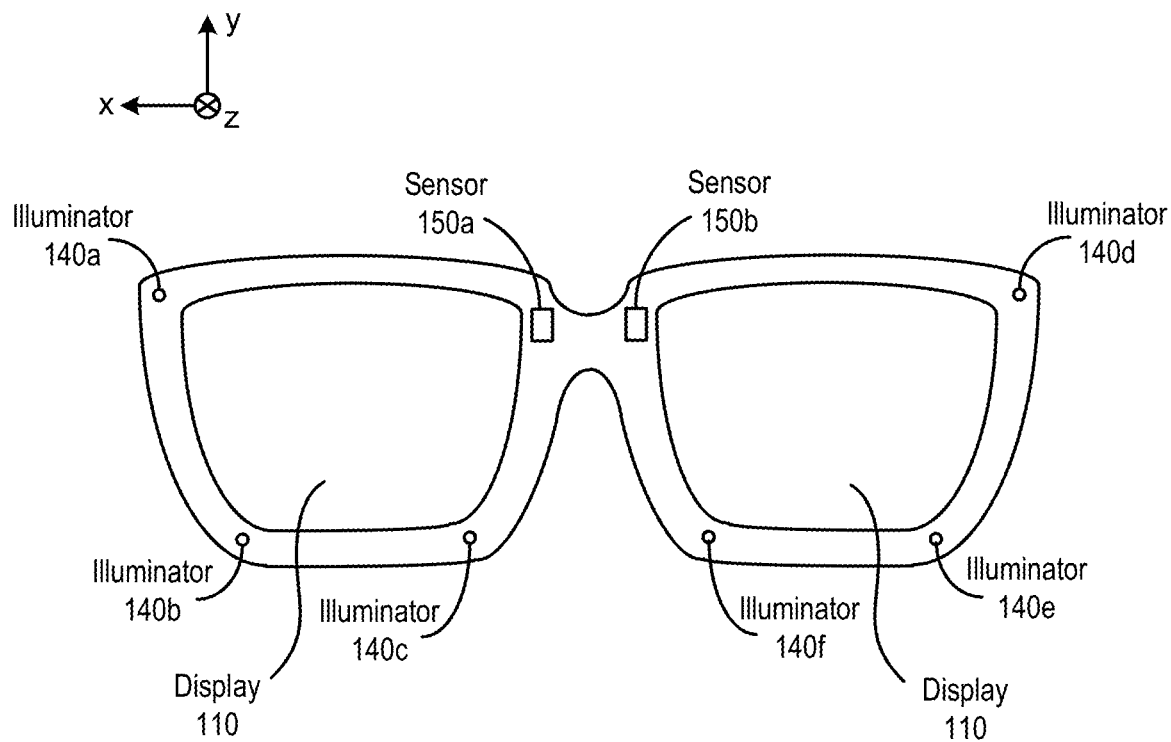

FIG. 1B is a diagram of another example of near-eye display 100. FIG. 1B illustrates a side of near-eye display 100 that faces the eyeball(s) 135 of the user who wears near-eye display 100. As shown in FIG. 1B, near-eye display 100 may further include a plurality of illuminators 140a, 140b, 140c, 140d, 140e, and 140f. Near-eye display 100 further includes a plurality of image sensors 150a and 150b. Illuminators 140a, 140b, and 140c may emit lights of certain frequency range (e.g., NIR) towards direction D (which is opposite to direction A of FIG. 1A). The emitted light may be associated with a certain pattern, and can be reflected by the left eyeball of the user. Sensor 150a may include a pixel cell array to receive the reflected light and generate an image of the reflected pattern. Similarly, illuminators 140d, 140e, and 140f may emit NIR lights carrying the pattern. The NIR lights can be reflected by the right eyeball of the user, and may be received by sensor 150b. Sensor 150b may also include a pixel cell array to generate an image of the reflected pattern. Based on the images of the reflected pattern from sensors 150a and 150b, the system can determine a gaze point of the user, and update the image data provided to display 100 based on the determined gaze point to provide an interactive experience to the user.

As discussed above, to avoid damaging the eyeballs of the user, illuminators 140a, 140b, 140c, 140d, 140e, and 140f are typically configured to output lights of very low intensities. In a case where image sensors 150a and 150b comprise the same sensor devices as image sensors 120a-120d of FIG. 1A, the image sensors 120a-120d may need to be able to generate an output that correlates with the intensity of incident light when the intensity of the incident light is very low, which may further increase the dynamic range requirement of the image sensors.

Moreover, the image sensors 120a-120d may need to be able to generate an output at a high speed to track the movements of the eyeballs. For example, a user's eyeball can perform a very rapid movement (e.g., a saccade movement) in which there can be a quick jump from one eyeball position to another. To track the rapid movement of the user's eyeball, image sensors 120a-120d need to generate images of the eyeball at high speed. For example, the rate at which the image sensors generate an image frame (the frame rate) needs to at least match the speed of movement of the eyeball. The high frame rate requires short total exposure time for all of the pixel cells involved in generating the image frame, as well as high speed for converting the sensor outputs into digital values for image generation. Moreover, as discussed above, the image sensors also need to be able to operate at an environment with low light intensity.

Figure 1B:
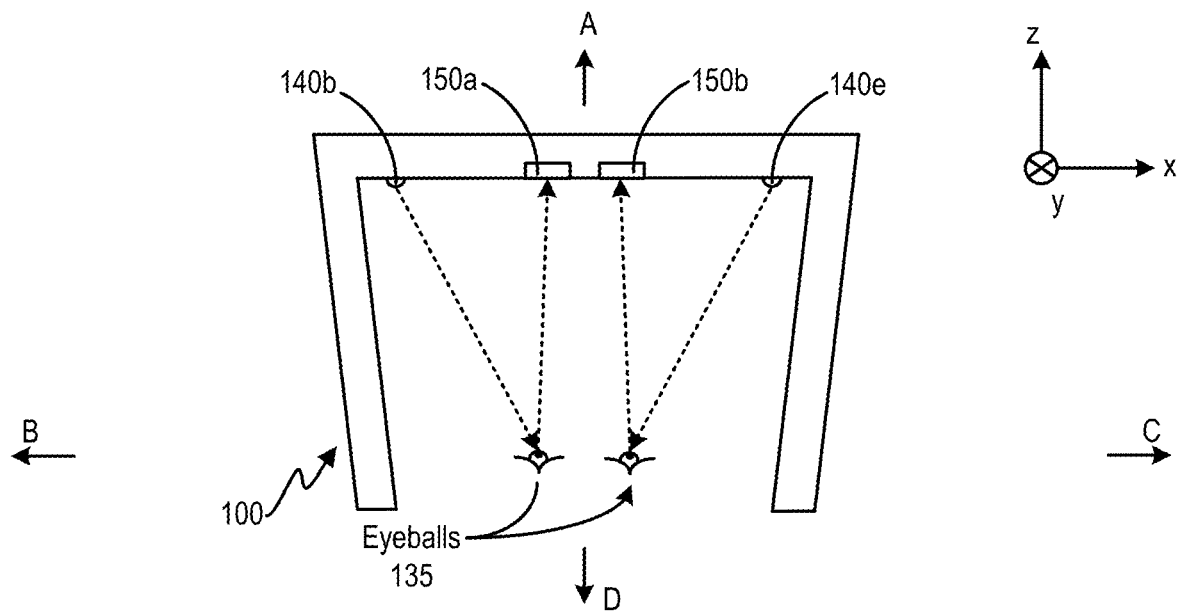
Figure 2:
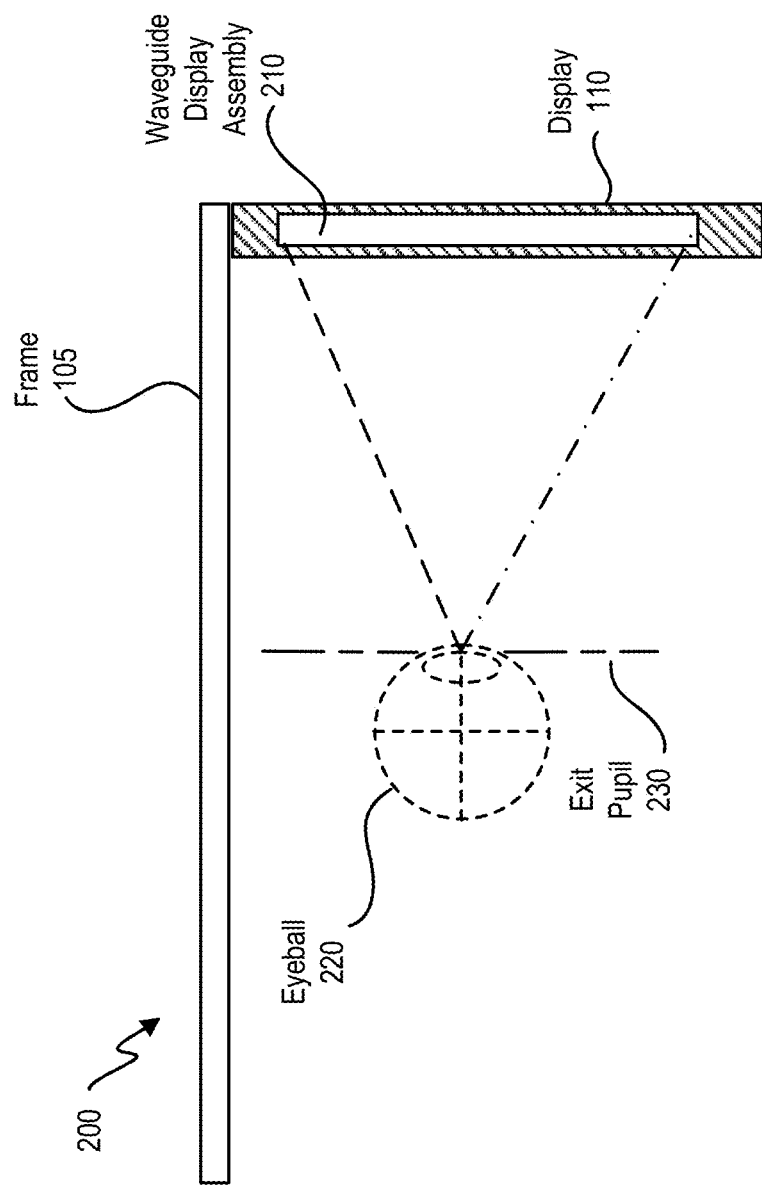
FIG. 2 is an example of a cross section of the near-eye display.

FIG. 2 is an example of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass, etc.) with one or more refractive indices. In some examples, near-eye display 100 includes one or more optical elements between waveguide display assembly 210 and eyeball 220.

In some examples, waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate examples, waveguide display assembly 210 may include the stacked waveguide display and the varifocal waveguide display.

Figure 3:
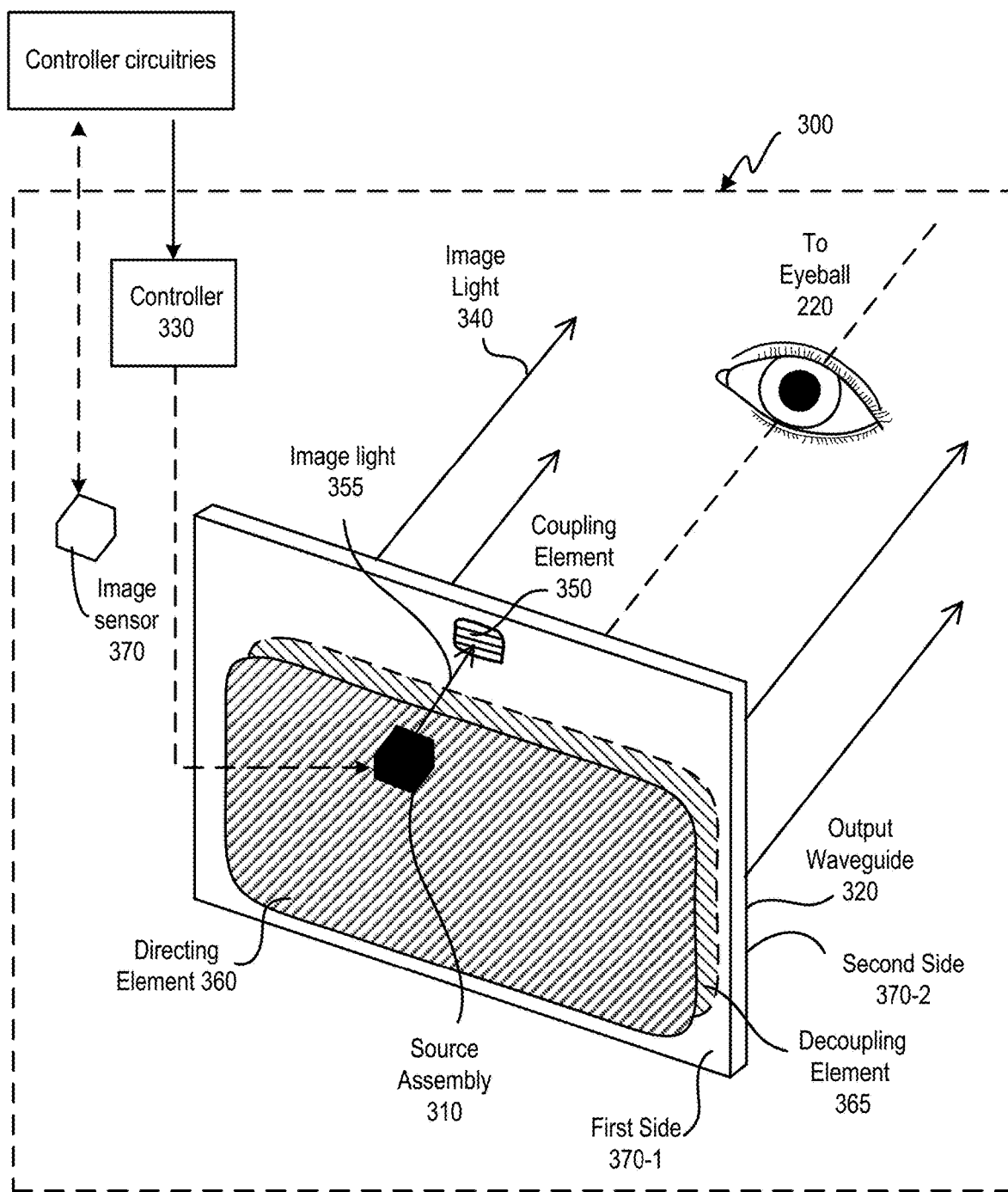
FIG. 3 illustrates an isometric view of an example of a waveguide display with a single source assembly.

FIG. 3 illustrates an isometric view of an example of a waveguide display 300. In some examples, waveguide display 300 is a component (e.g., waveguide display assembly 210) of near-eye display 100. In some examples, waveguide display 300 is part of some other near-eye display or other system that directs image light to a particular location.

Waveguide display 300 includes a source assembly 310, an output waveguide 320, and a controller 330. For purposes of illustration, FIG. 3 shows the waveguide display 300 associated with a single eyeball 220, but in some examples, another waveguide display separate, or partially separate, from the waveguide display 300 provides image light to another eye of the user.

Source assembly 310 generates image light 355. Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some examples, coupling element 350 couples the image light 355 from source assembly 310 into output waveguide 320. Coupling element 350 may be, e.g., a diffraction grating, a holographic grating, one or more cascaded reflectors, one or more prismatic surface elements, and/or an array of holographic reflectors.

Directing element 360 redirects the received input image light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365. Directing element 360 and/or decoupling element 365 may be, e.g., a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of e.g., silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. The controller 330 determines scanning instructions for the source assembly 310. In some examples, the output waveguide 320 outputs expanded image light 340 to the user's eyeball 220 with a large field of view (FOV). For example, the expanded image light 340 is provided to the user's eyeball 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Moreover, controller 330 also controls image light 355 generated by source assembly 310, based on image data provided by image sensor 370. Image sensor 370 may be located on first side 370-1 and may include, for example, image sensors 120a-120d of FIG. 1A to generate image data of a physical environment in front of the user (e.g., for location determination). Image sensor 370 may also be located on second side 370-2 and may include image sensors 150a and 150b of FIG. 1B to generate image data of eyeball 220 (e.g., for gaze point determination) of the user. Image sensor 370 may interface with a remote console that is not located within waveguide display 300. Image sensor 370 may provide image data to the remote console, which may determine, for example, a location of the user, a gaze point of the user, etc., and determine the content of the images to be displayed to the user. The remote console can transmit instructions to controller 330 related to the determined content. Based on the instructions, controller 330 can control the generation and outputting of image light 355 by source assembly 310.

Figure 4:
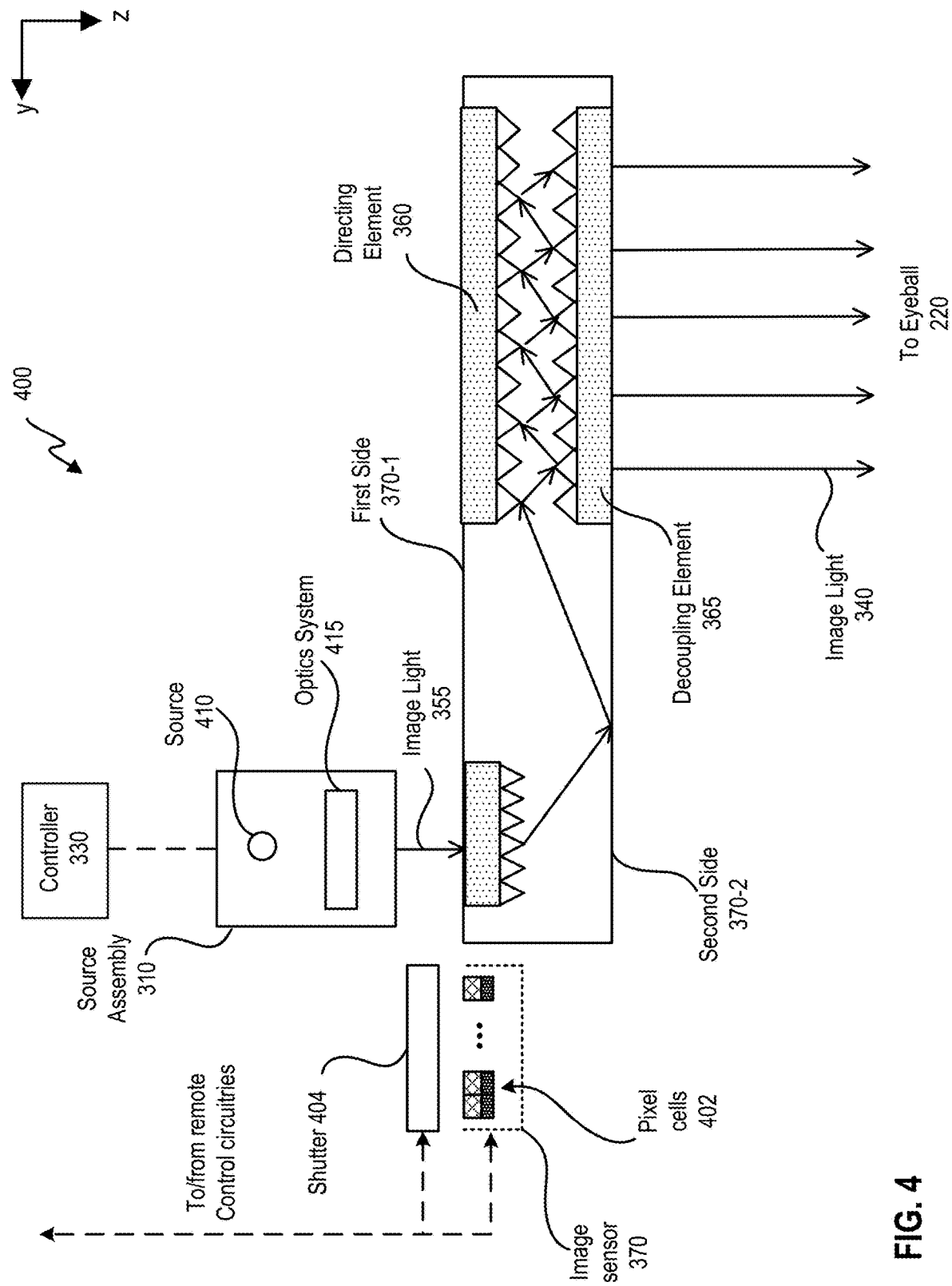
FIG. 4 illustrates a cross section of an example of the waveguide display.

FIG. 4 illustrates an example of a cross section 400 of the waveguide display 300. The cross section 400 includes source assembly 310, output waveguide 320, and image sensor 370. In the example of FIG. 4, image sensor 370 may include a set of pixel cells 402 located on first side 370-1 to generate an image of the physical environment in front of the user. In some examples, there can be a mechanical shutter 404 interposed between the set of pixel cells 402 and the physical environment to control the exposure of the set of pixel cells 402. In some examples, the mechanical shutter 404 can be replaced by an electronic shutter gate, as to be discussed below. Each of pixel cells 402 may correspond to one pixel of the image. Although not shown in FIG. 4, it is understood that each of pixel cells 402 may also be overlaid with a filter to control the frequency range of the light to be sensed by the pixel cells.

After receiving instructions from the remote console, mechanical shutter 404 can open and expose the set of pixel cells 402 in an exposure period. During the exposure period, image sensor 370 can obtain samples of lights incident on the set of pixel cells 402, and generate image data based on an intensity distribution of the incident light samples detected by the set of pixel cells 402. Image sensor 370 can then provide the image data to the remote console, which determines the display content, and provide the display content information to controller 330. Controller 330 can then determine image light 355 based on the display content information.

Source assembly 310 generates image light 355 in accordance with instructions from the controller 330. Source assembly 310 includes a source 410 and an optics system 415. Source 410 is a light source that generates coherent or partially coherent light. Source 410 may be, e.g., a laser diode, a vertical cavity surface emitting laser, and/or a light emitting diode.

Optics system 415 includes one or more optical components that condition the light from source 410. Conditioning light from source 410 may include, e.g., expanding, collimating, and/or adjusting orientation in accordance with instructions from controller 330. The one or more optical components may include one or more lenses, liquid lenses, mirrors, apertures, and/or gratings. In some examples, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In examples where coupling element 350 is diffraction grating, a pitch of the diffraction grating is chosen such that total internal reflection occurs in output waveguide 320, and image light 355 propagates internally in output waveguide 320 (e.g., by total internal reflection), toward decoupling element 365.

Directing element 360 redirects image light 355 toward decoupling element 365 for decoupling from output waveguide 320. In examples where directing element 360 is a diffraction grating, the pitch of the diffraction grating is chosen to cause incident image light 355 to exit output waveguide 320 at angle(s) of inclination relative to a surface of decoupling element 365.

In some examples, directing element 360 and/or decoupling element 365 are structurally similar. Expanded image light 340 exiting output waveguide 320 is expanded along one or more dimensions (e.g., may be elongated along x-dimension). In some examples, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
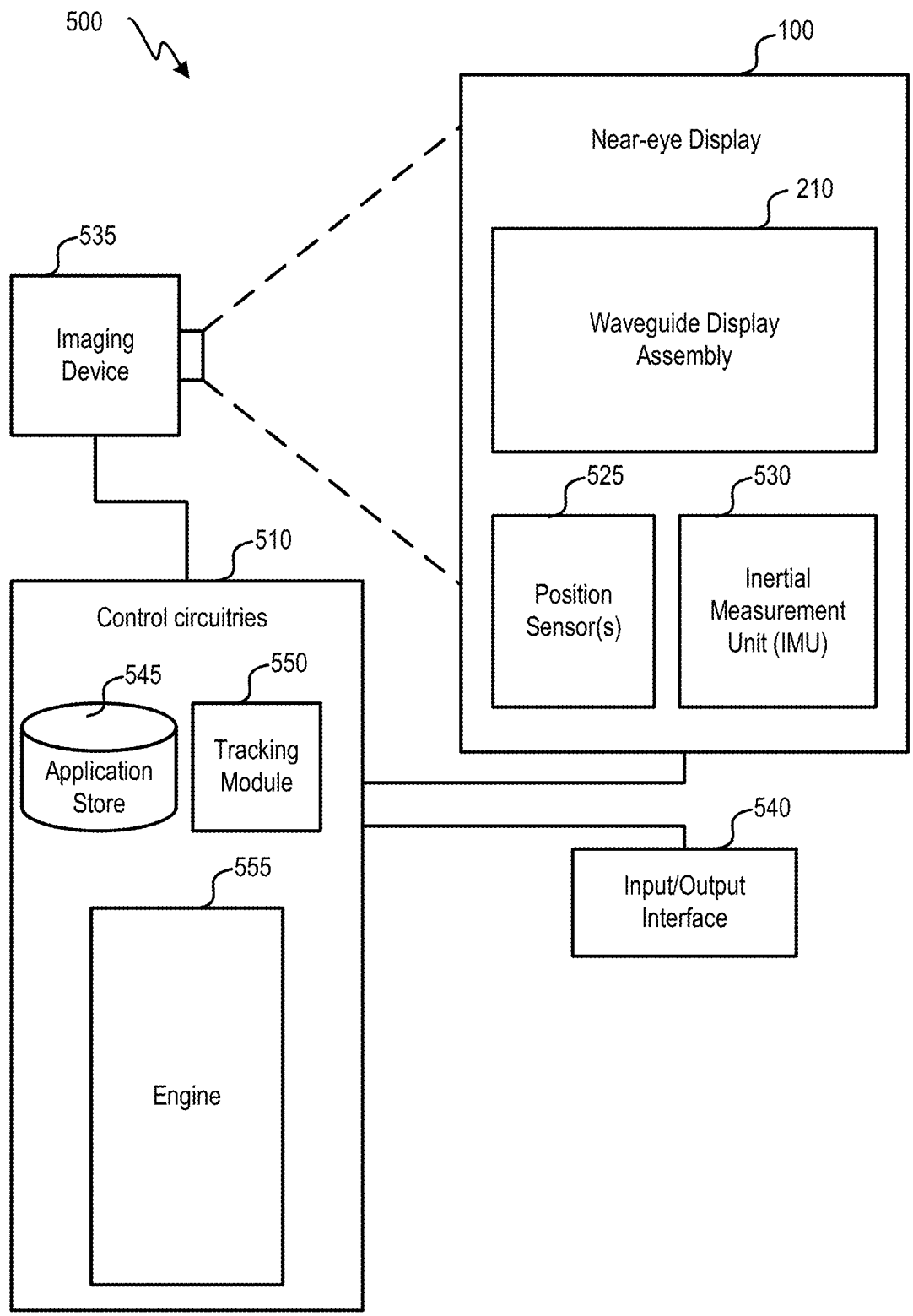
FIG. 5 is a block diagram of an example of a system including the near-eye display.

FIG. 5 is a block diagram of an example of a system 500 including the near-eye display 100. The system 500 comprises near-eye display 100, an imaging device 535, an input/output interface 540, and image sensors 120a-120d and 150a-150b that are each coupled to control circuitries 510. System 500 can be configured as a head-mounted device, a wearable device, etc.

Near-eye display 100 is a display that presents media to a user. Examples of media presented by the near-eye display 100 include one or more images, video, and/or audio. In some examples, audio is presented via an external device (e.g., speakers and/or headphones) that receives audio information from near-eye display 100 and/or control circuitries 510 and presents audio data based on the audio information to a user. In some examples, near-eye display 100 may also act as an AR eyewear glass. In some examples, near-eye display 100 augments views of a physical, real-world environment, with computer-generated elements (e.g., images, video, sound, etc.).

Near-eye display 100 includes waveguide display assembly 210, one or more position sensors 525, and/or an inertial measurement unit (IMU) 530. Waveguide display assembly 210 includes source assembly 310, output waveguide 320, and controller 330.

IMU 530 is an electronic device that generates fast calibration data indicating an estimated position of near-eye display 100 relative to an initial position of near-eye display 100 based on measurement signals received from one or more of position sensors 525.

Imaging device 535 may generate image data for various applications. For example, imaging device 535 may generate image data to provide slow calibration data in accordance with calibration parameters received from control circuitries 510. Imaging device 535 may include, for example, image sensors 120a-120d of FIG. 1A for generating image data of a physical environment in which the user is located, for performing location tracking of the user. Imaging device 535 may further include, for example, image sensors 150a-150b of FIG. 1B for generating image data for determining a gaze point of the user, to identify an object of interest of the user.

The input/output interface 540 is a device that allows a user to send action requests to the control circuitries 510. An action request is a request to perform a particular action. For example, an action request may be to start or end an application or to perform a particular action within the application.

Control circuitries 510 provide media to near-eye display 100 for presentation to the user in accordance with information received from one or more of: imaging device 535, near-eye display 100, and input/output interface 540. In some examples, control circuitries 510 can be housed within system 500 configured as a head-mounted device. In some examples, control circuitries 510 can be a standalone console device communicatively coupled with other components of system 500. In the example shown in FIG. 5, control circuitries 510 include an application store 545, a tracking module 550, and an engine 555.

The application store 545 stores one or more applications for execution by the control circuitries 510. An application is a group of instructions, that, when executed by a processor, generates content for presentation to the user. Examples of applications include: gaming applications, conferencing applications, video playback applications, or other suitable applications.

Tracking module 550 calibrates system 500 using one or more calibration parameters and may adjust one or more calibration parameters to reduce error in determination of the position of the near-eye display 100.

Tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some examples, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), or a gaze point of the user (e.g., based on image data provided by imaging device 535), a distance between an object and user (e.g., based on image data provided by imaging device 535).

Figure 6:
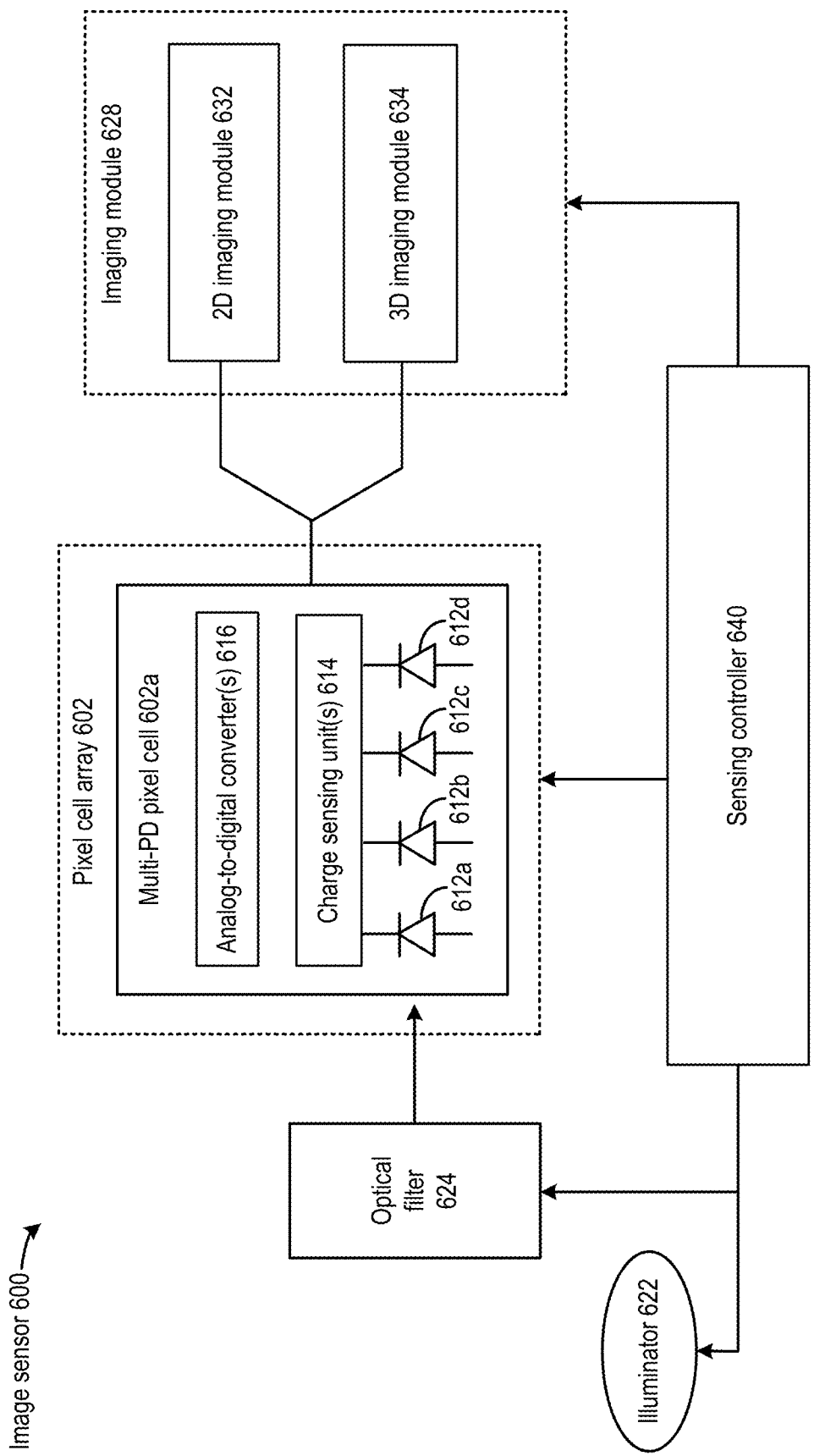
FIG. 6 illustrates block diagrams of examples of an image sensor.

FIG. 6 illustrates an example of an image sensor 600. Image sensor 600 can be part of near-eye display 100, and can provide 2D and 3D image data to control circuitries 510 of FIG. 5 to control the display content of near-eye display 100. As shown in FIG. 6, image sensor 600 may include an array of pixel cells 602 including pixel cell 602*a*. Pixel cell 602*a* can include a plurality of photodiodes 612 including, for example, photodiodes 612*a*, 612*b*, 612*c*, and 612*d*, one or more charge sensing units 614, and one or more analog-to-digital converters 616. The plurality of photodiodes 612 can convert different components of incident light to charge. For example, photodiode 612*a*-612*c* can correspond to different visible light channels, in which photodiode 612*a* can convert a visible blue component (e.g., a wavelength range of 450-490 nanometers (nm)) to charge. Photodiode 612*b* can convert a visible green component (e.g., a wavelength range of 520-560 nm) to charge. Photodiode 612*c* can convert a visible red component (e.g., a wavelength range of 635-700 nm) to charge. Moreover, photodiode 612*d* can convert an infra-red component (e.g., 700-1000 nm) to charge. Each of the one or more charge sensing units 614 can include a charge storage device and a buffer to convert the charge generated by photodiodes 612*a*-612*d* to voltages, which can be quantized by one or more ADCs 616 into digital values. The digital values generated from photodiodes 612*a*-612*c* can represent the different visible light components of a pixel, and each can be used for 2D sensing in a particular visible light channel. Moreover, the digital value generated from photodiode 612*d* can represent the infra-red light component of the same pixel and can be used for 3D sensing. Although FIG. 6 shows that pixel cell 602*a* includes four photodiodes, it is understood that the pixel cell can include a different number of photodiodes (e.g., two, three, etc.).

In addition, image sensor 600 also includes an illuminator 622, an optical filter 624, an imaging module 628, and a sensing controller 630. Illuminator 622 may be an infra-red illuminator, such as a laser, a light emitting diode (LED), etc., that can project infra-red light for 3D sensing. The projected light may include, for example, structured light, light pulses, etc. Optical filter 624 may include an array of filter elements overlaid on the plurality of photodiodes 612*a*-612*d* of each pixel cell including pixel cell 606*a*. Each filter element can set a wavelength range of incident light received by each photodiode of pixel cell 606*a*. For example, a filter element over photodiode 612*a* may transmit the visible blue light component while blocking other components, a filter element over photodiode 612*b* may transmit the visible green light component, a filter element over photodiode 612*c* may transmit the visible red light component, whereas a filter element over photodiode 612*d* may transmit the infra-red light component.

Image sensor 600 further includes an imaging module 628. Imaging module 628 may further include a 2D imaging module 632 to perform 2D imaging operations and a 3D imaging module 634 to perform 3D imaging operations. The operations can be based on digital values provided by ADCs 616. For example, based on the digital values from each of photodiodes 612*a*-612*c*, 2D imaging module 632 can generate an array of pixel values representing an intensity of an incident light component for each visible color channel, and generate an image frame for each visible color channel. Moreover, 3D imaging module 634 can generate a 3D image based on the digital values from photodiode 612*d*. In some examples, based on the digital values, 3D imaging module 634 can detect a pattern of structured light reflected by a surface of an object, and compare the detected pattern with the pattern of structured light projected by illuminator 622 to determine the depths of different points of the surface with respect to the pixel cells array. For detection of the pattern of reflected light, 3D imaging module 634 can generate pixel values based on intensities of infra-red light received at the pixel cells. As another example, 3D imaging module 634 can generate pixel values based on time-of-flight of the infra-red light transmitted by illuminator 622 and reflected by the object.

Figure 7A:
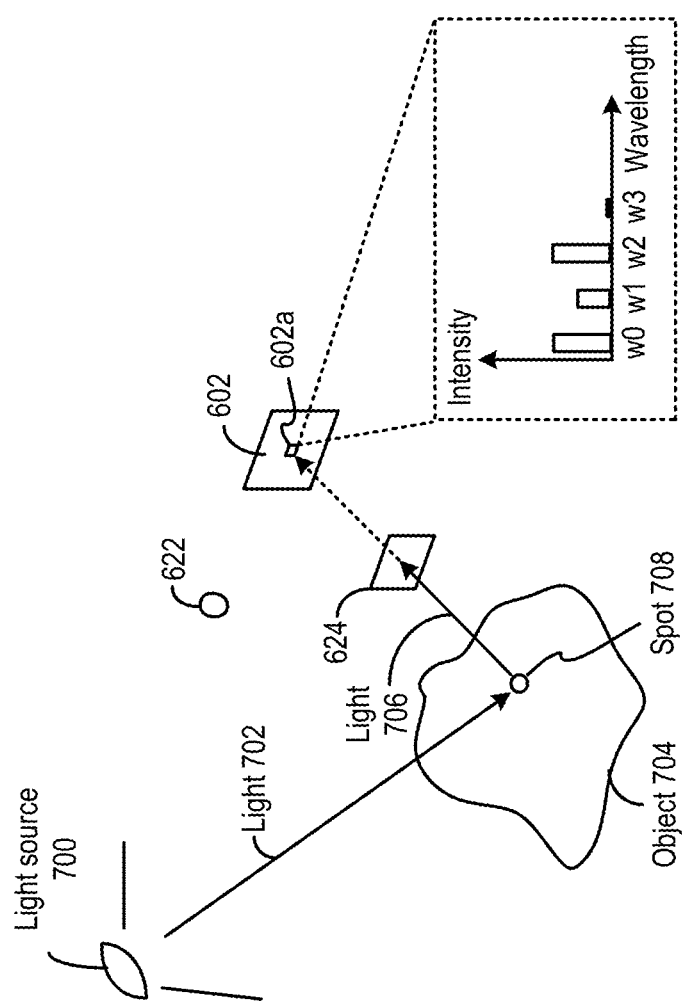
FIGS. 7A, 7B, and 7C illustrates example operations by the image sensor of FIG. 6.
Figure 7B:
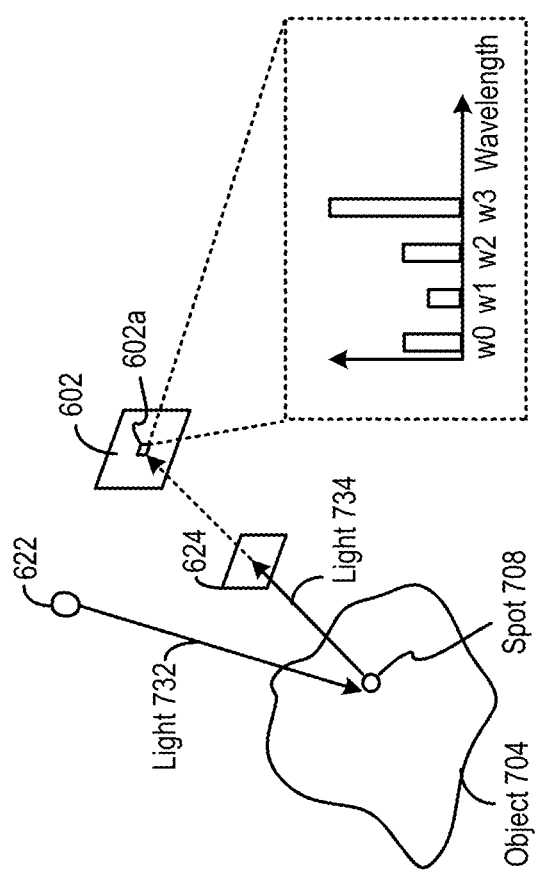
Figure 7C:
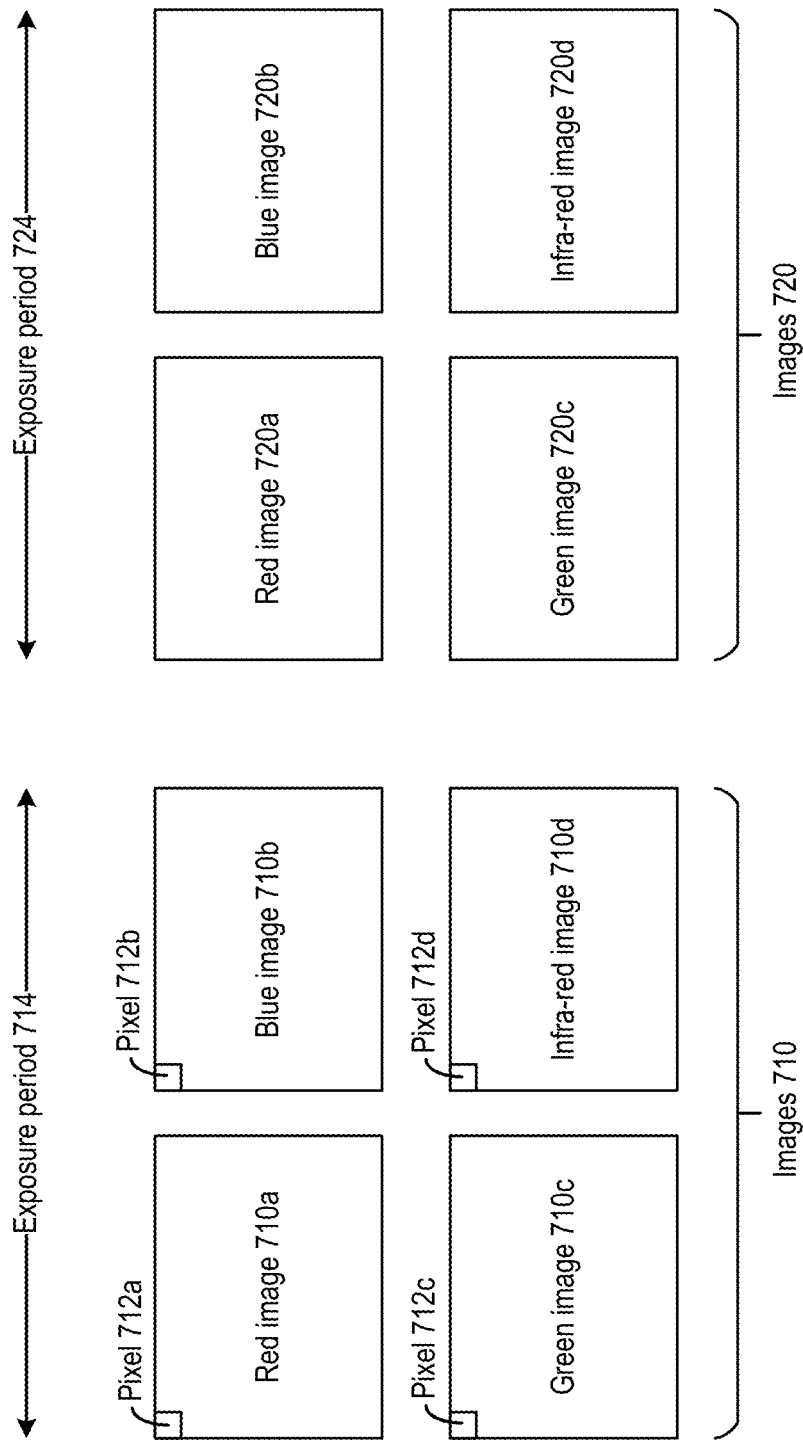

Image sensor 600 further includes a sensing controller 640 to control different components of image sensor 600 to perform 2D and 3D imaging of an object. Reference is now made to FIG. 7A-FIG. 7C, which illustrate examples of operations of image sensor 600 for 2D and 3D imaging. FIG. 7A illustrates an example of operations for 2D imaging. For 2D imaging, pixel cells array 602 can detect visible light in the environment including visible light reflected off an object. For example, referring to FIG. 7A, visible light source 700 (e.g., a light bulb, the sun, or other sources of ambient visible light) can project visible light 702 onto an object 704. Visible light 706 can be reflected off a spot 708 of object 704. Visible light 706 can also include the ambient infra-red light component. Visible light 706 can be filtered by optical filter array 624 to pass different components of visible light 706 of wavelength ranges w0, w1, w2, and w3 to, respectively, photodiodes 612*a*, 612*b*, 612*c*, and 612*d* of pixel cell 602*a*. Wavelength ranges w0, w1, w2, and w3 an correspond to, respectively, blue, green, red, and infra-red.

As shown in FIG. 7A, as the infra-red illuminator 622 is not turned on, the intensity of infra-red component (w3) is contributed by the ambient infra-red light and can be very low. Moreover, different visible components of visible light 706 can also have different intensities. Charge sensing units 614 can convert the charge generated by the photodiodes to voltages, which can be quantized by ADCs 616 into digital values representing the red, blue, and green components of a pixel representing spot 708. Referring to FIG. 7C, after the digital values are generated, sensing controller 640 can control 2D imaging module 632 to generate, based on the digital values, sets of images including a set of images 710, which includes a red image frame 710a, a blue image frame 710b, and a green image frame 710c each representing one of red, blue, or green color image of a scene captured with the same exposure period 714. Each pixel from the red image (e.g., pixel 712a), from the blue image (e.g., pixel 712b), and from the green image (e.g., pixel 712c) can represent visible components of light from the same spot (e.g., spot 708) of a scene. A different set of images 720 can be generated by 2D imaging module 632 in a subsequent exposure period 724. Each of red image 710a, blue image 710b, and green image 710c can represent the scene in a specific color channel and can be provided to an application to, for example, extract image features from the specific color channel. As each image represents the same scene and each corresponding pixel of the images represent light from the same spot of the scene, the correspondence of images between different color channels can be improved.

Furthermore, image sensor 600 can also perform 3D imaging of object 704. Referring to FIG. 7B, sensing controller 610 can control illuminator 622 to project infra-red light 732, which can include a light pulse, structured light, etc., onto object 704. Infra-red light 732 can have a wavelength range of 700 nanometers (nm) to 1 millimeter (mm). Infra-red light 734 can reflect off spot 708 of object 704 and can propagate towards pixel cells array 602 and pass through optical filter 624, which can provide the infra-red component (of wavelength range w3) to photodiode 612d to convert to charge. Charge sensing units 614 can convert the charge to a voltage, which can be quantized by ADCs 616 into digital values. Referring to FIG. 7C, after the digital values are generated, sensing controller 640 can control 3D imaging module 634 to generate, based on the digital values, an infra-red image 710d of the scene as part of images 710 captured within exposure period 714. As infra-red image 710d can represent the same scene in the infra-red channel and a pixel of infra-red image 710d (e.g., pixel 712d) represents light from the same spot of the scene as other corresponding pixels (pixels 712a-712c) in other images within images 710, the correspondence between 2D and 3D imaging can be improved as well.

Figure 8A:
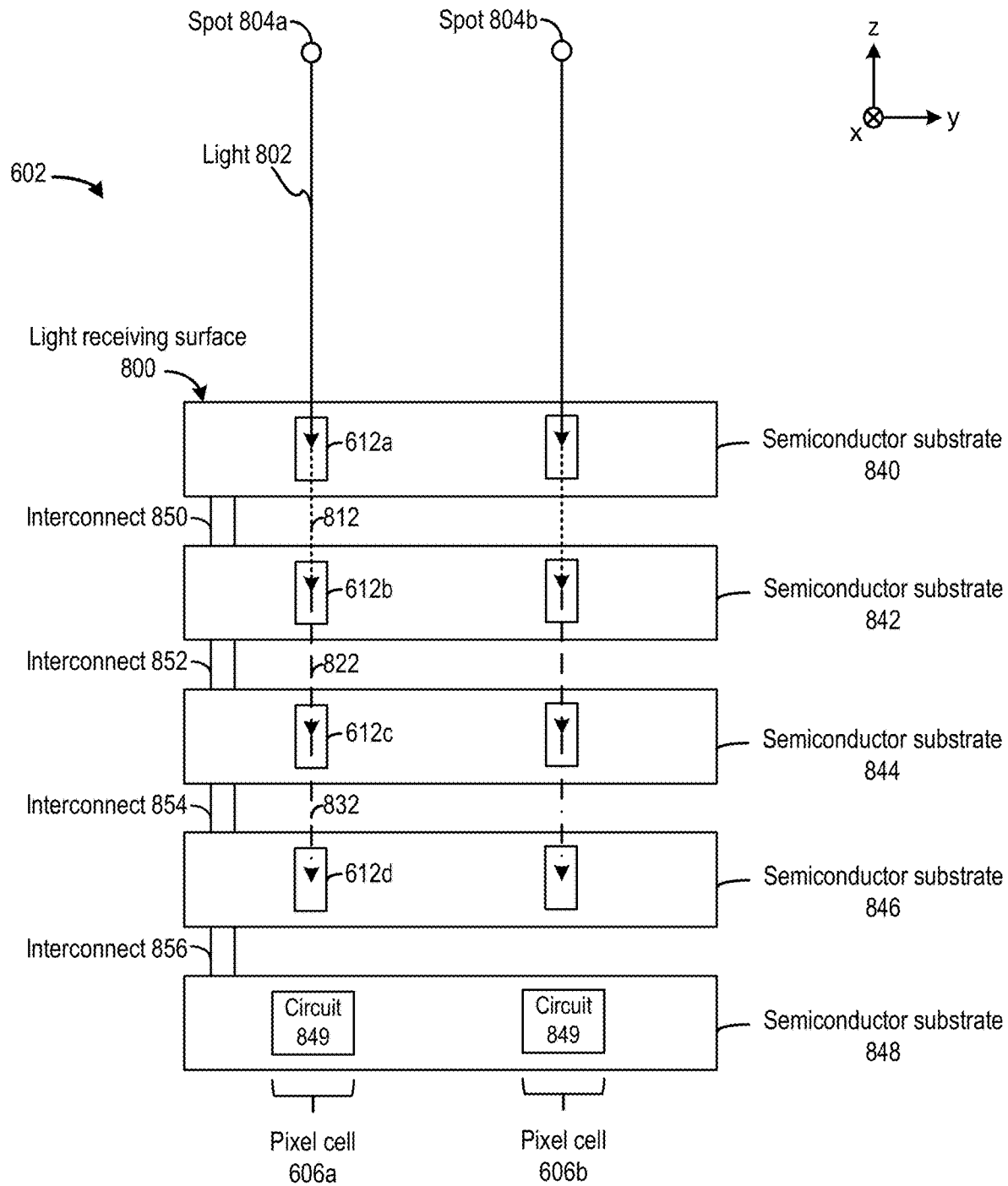
FIGS. 8A, 8B, 8C, and 8D illustrates examples of arrangements of photodiodes of the image sensor of FIG. 6.

FIG. 8A-FIG. 8D illustrate examples of arrangements of photodiodes 612 in a pixel cell. As shown in FIG. 8A, the photodiodes 612a-612d in a pixel cell 602a can form a stack along an axis that is perpendicular to a light receiving surface 800 through which pixel cell 602a receives incident light 802 from a spot 804a. For example, the photodiodes 612a-612d can form a stack along a vertical axis (e.g., the z-axis) when the light receiving surface 800 is parallel with the x and y axes. Each photodiode can have a different distance from light receiving surface 800, and the distance can set the component of incident light 802 being absorbed and converted to charge by each photodiode. For example, photodiode 612a is closest to light receiving surface 800 and can absorb and convert the blue component to charge, which is of the shortest wavelength range among the other components. Light 812 includes the remaining components of light 802 (e.g., green, red, and infra-red) and can propagate to photodiode 612b, which can absorb and convert the green component. Light 822 includes the remaining components of light 812 (e.g., red and infra-red) and can propagate to photodiode 612c, which can absorb and convert the red component. The remaining infra-red component 832 can propagate to photodiode 612d to be converted to charge.

Each the photodiodes 612a, 612b, 612c, and 612d can be in a separate semiconductor substrate, which can be stacked to form image sensor 600. For example, photodiode 612a can be in a semiconductor substrate 840, photodiode 612b can be in a semiconductor substrate 842, photodiode 612c can be in a semiconductor substrate 844, whereas photodiode 612d can be in a semiconductor substrate 846. Each semiconductor substrate can include other photodiodes of other pixel cells, such as pixel cells 602b to receive light from spot 804b. Image sensor 600 can include another semiconductor substrate 848 which can include pixel cell processing circuits 849 which can include, for example, charge sensing units 614, ADCs 616, etc. Each semiconductor substrate can be connected to a metal interconnect, such as metal interconnects 850, 852, 854, and 856 to transfer the charge generated at each photodiode to processing circuit 849.

Figure 8B:
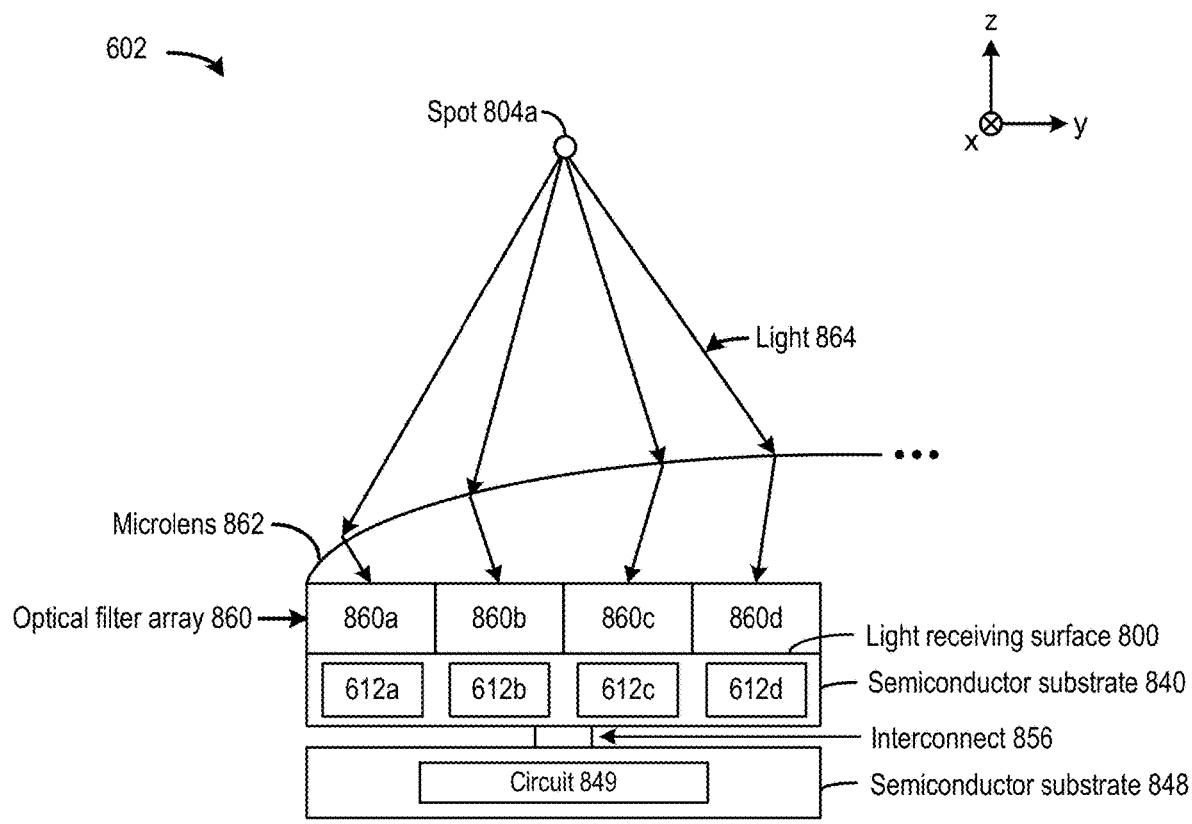
Figure 8B:
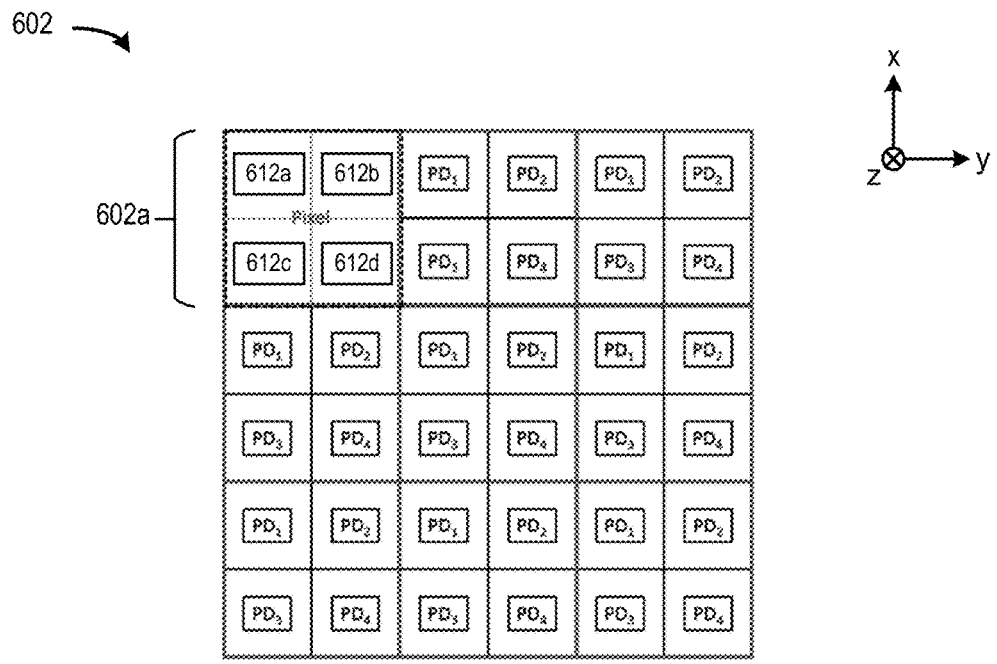
Figure 8C:
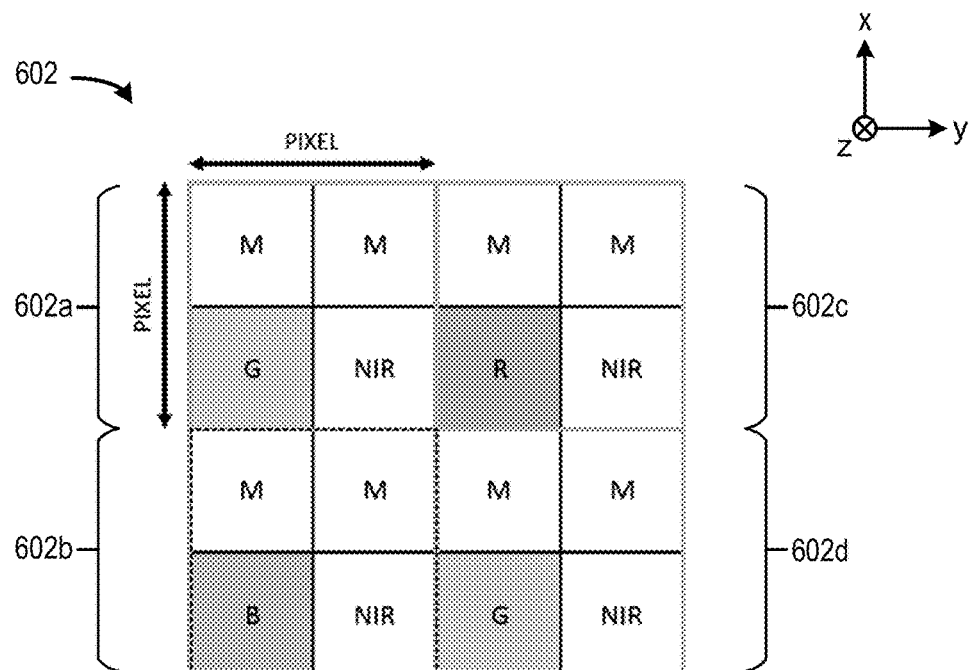
Figure 8C:
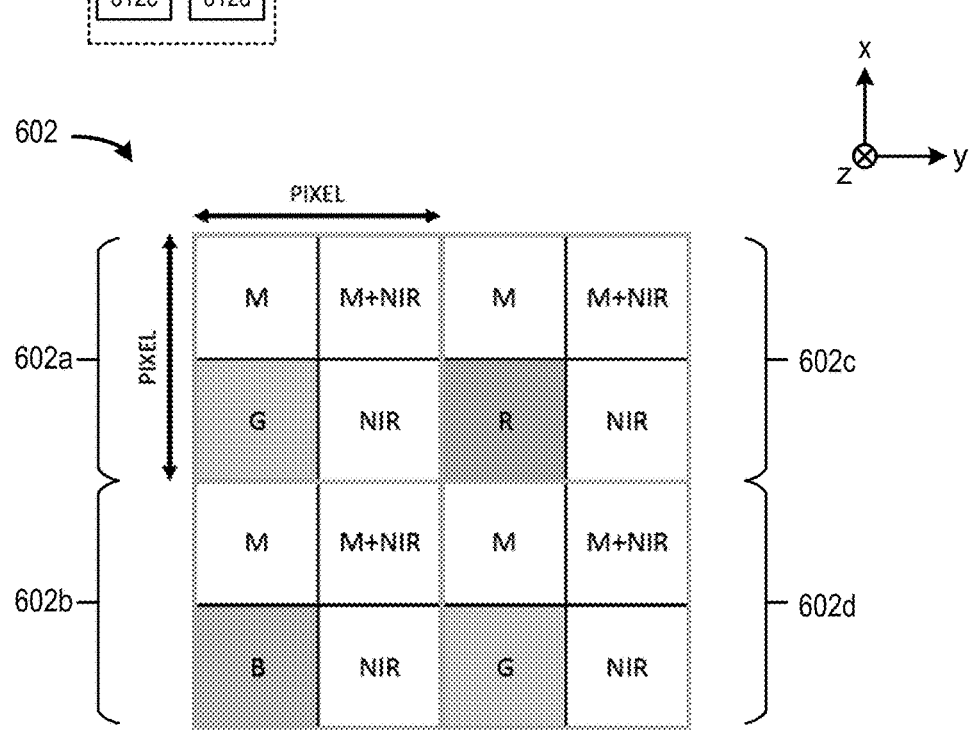
Figure 8D:
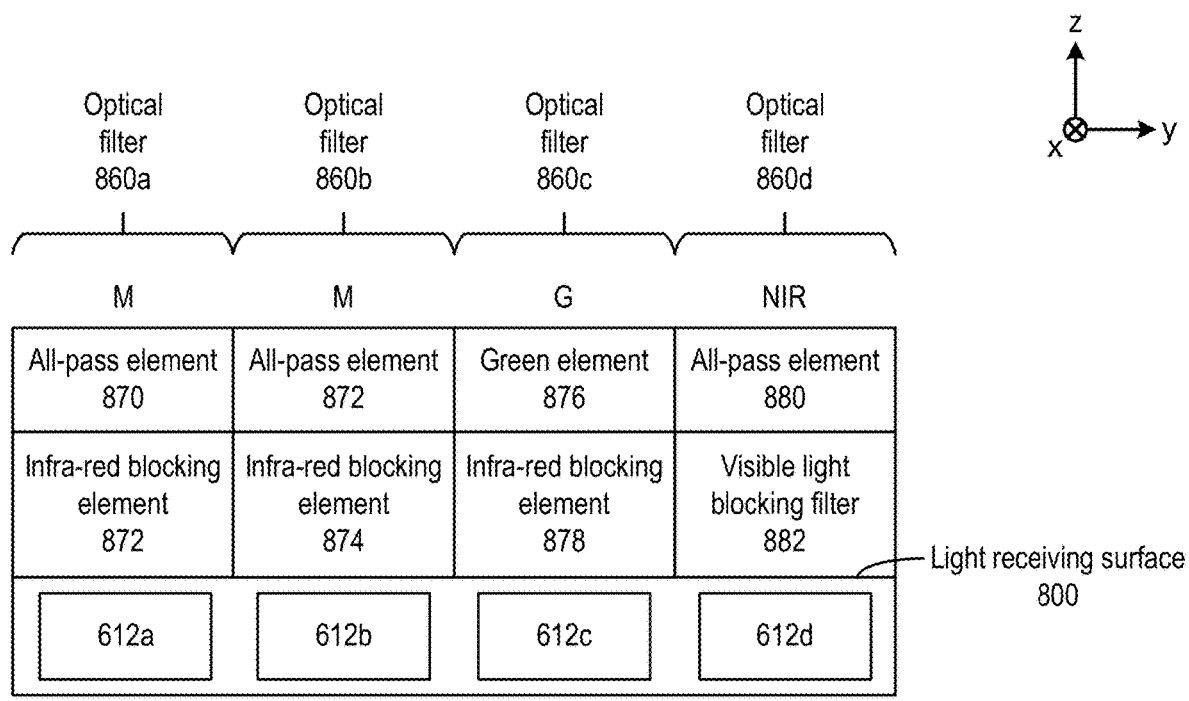
Figure 8D:
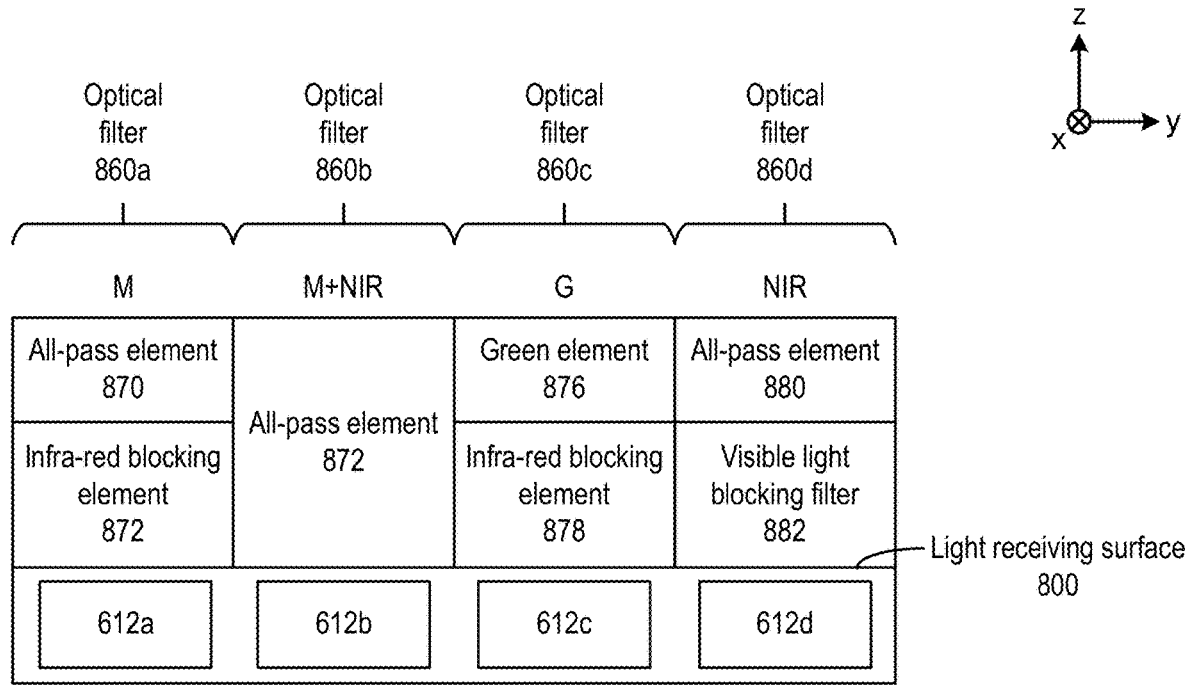

FIG. 8B-FIG. 8D illustrate other example arrangements of photodiodes 612. As shown in FIG. 8B-FIG. 8D, the plurality of photodiodes 612 can be arranged laterally parallel with light receiving surface 800. The top graph of FIG. 8B illustrates a side view of an example of a pixel cell array 602 including pixel cell 602a, whereas the bottom graph of FIG. 8B illustrates a top view of pixel cell array 602 including pixel cell 602a. As shown in FIG. 8B, with light receiving surface 800 being parallel with the x and y axes, photodiodes 612a, 612b, 612c, and 612d can be arranged adjacent to each other also along the x and y axes in semiconductor substrate 840. Pixel cell 602a further includes an optical filter array 860 overlaid on the photodiodes. Optical filter array 860 can be part of optical filter 624. Optical filter array 860 can include a filter element overlaid on each of photodiodes 612a, 612b, 612c, and 612d to set a wavelength range of incident light component received by the respective photodiode. For example, filter element 860a is overlaid on photodiode 612a and can allow only visible blue light to enter photodiode 612a. Moreover, filter element 860b is overlaid on photodiode 612b and can allow only visible green light to enter photodiode 612b. Further, filter element 860c is overlaid on photodiode 612c and can allow only visible red light to enter photodiode 612c. Filter element 860d is overlaid on photodiode 612d and can allow only infra-red light to enter photodiode 612d. Pixel cell 602a further includes one or more microlens 862 which can project light 864 from a spot of a scene (e.g., spot 804a) via optical tiler array 860 to different lateral locations of light receiving surface 800, which allows each photodiode to become a sub-pixel of pixel cell 602a and to receive components of light from the same spot corresponding to a pixel. In some examples, the one or more microlens 862 can include a microlens covering all pixel cells of pixel cell array 602. In some examples, the one or more microlens 862 may include a microlens over each pixel cell, and multiple microlens cover multiple pixel cells. Pixel cell 602a can also include semiconductor substrate 848 which can include circuit 849 (e.g., charge sensing units 614, ADCs 616, etc.) to generate digital values from the charge generated by the photodiodes. Semiconductor substrates 840 and 848 can form a stack and can be connected with interconnect 856.

The arrangements of FIG. 8B, in which the photodiodes are arranged laterally and an optical filter array is used to control the light components received by the photodiodes, can offer numerous advantages. For example, the number of stacks and the number of semiconductor substrates can be reduced, which not only reduce the vertical height but also the interconnects among the semiconductor substrates. Moreover, relying on filter elements rather than the propagation distance of light to set the wavelength ranges of the components absorbed by each photodiode can offer flexibilities in selecting the wavelength ranges. As shown in top graph of FIG. 8C, pixel cells array 602 can include different optical filter arrays 860 for different pixel cells. For example, each pixel cell of pixel cells array 602 can have an optical filter array that provides monochrome channel of a wavelength range of 380-740 nm (labelled with "M") for photodiodes 612a and 612b, and an infra-red channel of a wavelength range of 700-1000 nm (labelled with "NIR") for photodiode 612d. But the optical filter arrays may also provide a different visible color channel for the different pixel cells. For example, the optical filter arrays 860 for pixel cells array 602a, 602b, 602c, and 602d may provide, respectively, a visible green channel (labelled with "G"), a visible red channel (labelled with "R"), a visible blue channel (labelled with "B"), and a visible green channel for photodiode 612c of the pixel cells arrays. As another example, as shown in the bottom graph of FIG. 8C, each optical filter array 860 can provide a monochrome and infra-red channel (labelled "M+NIR") which spans a wavelength range of 380-1000 nm for photodiode 612b of each pixel cells array.

FIG. 8D illustrates examples of optical filter array 860 to provide the example channels shown in FIG. 8C. As shown in FIG. 8D, optical filter array 860 can include a stack of optical filters to select a wavelength range of light received by each photodiode within a pixel cell array. For example, referring to the top graph of FIG. 8D, optical filter 860a can include an all-pass element 870 (e.g., a transparent glass that passes both visible light and infra-red light) and an infra-red blocking element 872 forming a stack to provide a monochrome channel for photodiode 612a. Optical filter 860b can also include an all-pass element 874 and an infra-red blocking element 876 to also provide a monochrome channel for photodiode 612b. Further, optical filter 860c can include a green-pass element 876 which passes green visible light (but reject other visible light component), and an infra-red blocking element 878, to provide a green channel for photodiode 612c. Lastly, optical filter 860d can include an all-pass element 880 and a visible light blocking filter 882 (which can block out visible light but allows infra-red light to go through) to provide an infra-red channel for photodiode 612d. In another example, as shown in the bottom graph of FIG. 8D, optical filter 860b can include only all-pass element 872 to provide a monochrome and infra-red channel for photodiode 612b.

Reference is now made to FIGS. 9A-9F, which illustrates additional components of pixel cell 602a including an example of charge sensing unit 614 and ADC 616. As shown in FIG. 9A, pixel cell 602a can include a photodiode PD (e.g., photodiode 612a), a shutter switch M0, a transfer switch M1, a charge sensing unit 614 comprising a charge storage device 902 and a switchable buffer 904, and an ADC 616 comprising a CC capacitor, a comparator 906, and output logic circuits 908. The output of comparator 906 is coupled, via output logic circuits 908, with a memory 912 and a counter 914 which can be internal to or external to pixel cell 602a. Pixel cell 602 further includes a controller 920 to control the switches, charge sensing unit 614, as well as ADC 616, As to be described below, controller 920 can set an exposure period to accumulate charge based on incident light, and can control charge sensing unit 614 and ADC 616 to perform multiple quantization operations associated with different light intensity ranges to generate a digital representation of the intensity of the incident light. Controller 920 can receive a selection 922 to selection which of the multiple quantization operations to be performed (and which is to be skipped). The selection can come from a host device which hosts an application that uses the digital representation of incident light intensity. Controller 920 can be internal to pixel cell 602a or part of sensing controller 640. Each switch can be a transistor such as, for example, a metal-oxide-semiconductor field-effect transistor (MOSFET), a bipolar junction transistor (BJT), etc.

Specifically, shutter switch M0 can be controlled by an AB signal provided by controller 920 to start an exposure period, in which the photodiode PD can generate and accumulate charge in response to incident light. Transfer switch M1 can be controlled by a TG signal provided by controller 920 to transfer some of the charge to charge storage device 902. In one quantization operation, transfer switch M1 can be biased at a partially-on state to set a quantum well capacity of photodiode PD, which also sets a quantity of residual charge stored at the photodiode PD. After the photodiode PD is saturated by the residual charge, overflow charge can flow through transfer switch M1 to charge storage device 902. In another quantization operation, transfer switch M1 can be fully turned on to transfer the residual charge from the photodiode PD to charge storage device for measurement.

Charge storage device 902 has a configurable capacity and can convert the charge transferred from switch M1 to a voltage at the OF node. Charge storage device 902 includes a $C_{FD}$ capacitor (e.g., a floating drain) and a $C_{EXT}$ capacitor (e.g., an MOS capacitor) connected by a M6 switch. M6 switch can be enabled by a LG signal to expand the capacity of charge storage device 902 by connecting $C_{FD}$ and $C_{EXT}$ capacitors in parallel, or to reduce the capacity by disconnecting the capacitors from each other. The capacity of charge storage device 902 can be reduced for measurement of residual charge to increase the charge-to-voltage gain and to reduce the quantization error. Moreover, the capacity of charge storage device 902 can also be increased for measurement of overflow charge to reduce the likelihood of saturation and to improve non-linearity. As to be described below, the capacity of charge storage device 902 can be adjusted for measurement of different light intensity ranges. Charge storage device 902 is also coupled with a reset switch M2 which can be controlled by a reset signal RST, provided by controller 920, to reset $C_{FD}$ and $C_{EXT}$ capacitors between different quantization operations.

Switchable buffer 904 can be include a switch M3 configured as a source follower to buffer the voltage at the OF node to improve its driving strength. The buffered voltage can be at the input node PIXEL_OUT of ADC 616. The M4 transistor provides a current source for switchable buffer 904 and can be biased by a VB signal. Switchable buffer 904 also includes a switch M5 which be enabled or disabled by a SEL signal. When switch M5 is disabled, source follower M3 can be disconnected from the PIXEL_OUT node. As to be described below, pixel cell 602a may include multiple charge sensing units 614 each including a switchable buffer 904, and one of the charge sensing units can be coupled with PIXEL_OUT (and ADC 616) at one time based on the SEL signal.

Figure 10:
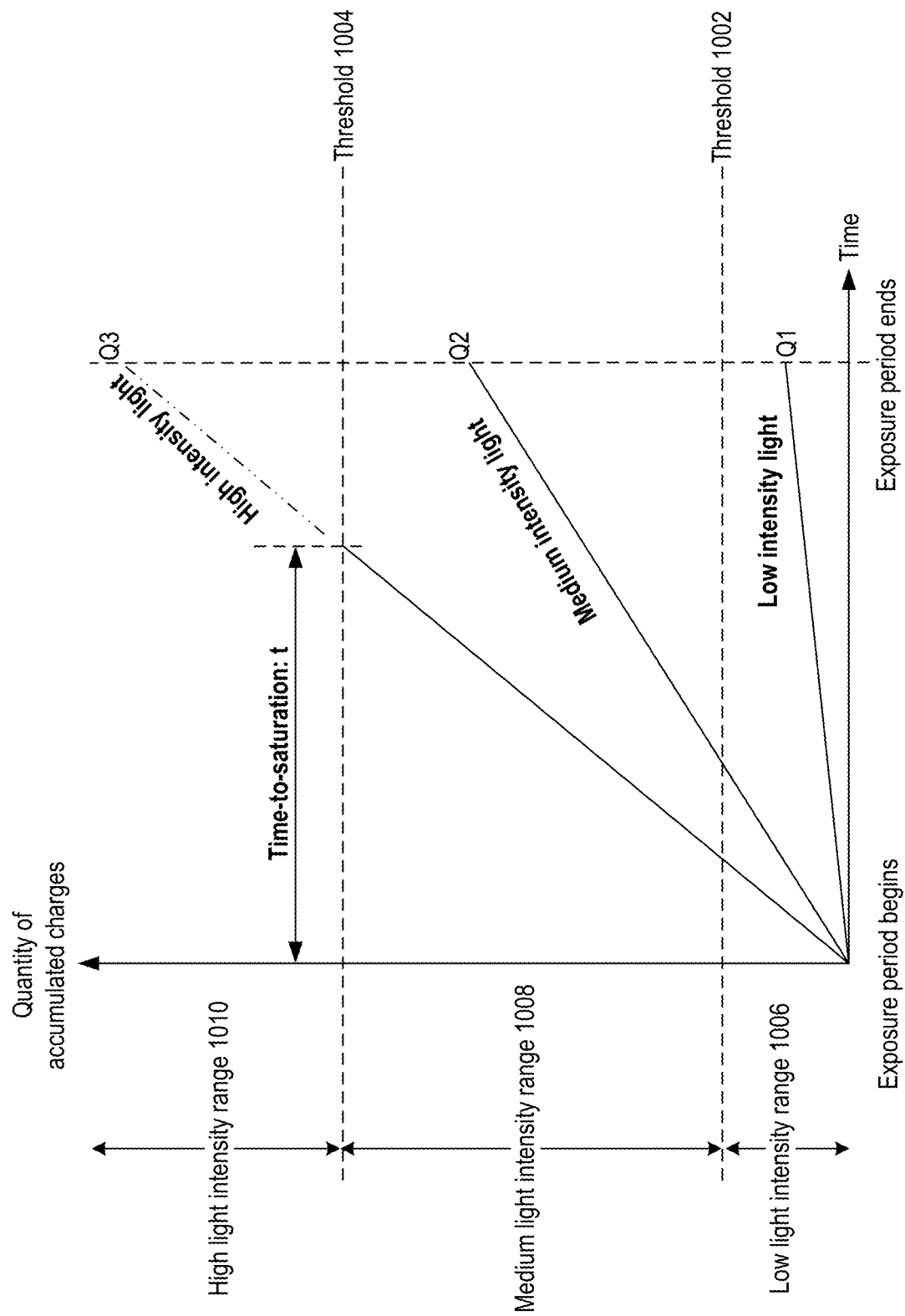
FIG. 10 illustrates examples of charge accumulated with respect to time for different light intensity ranges by the pixel cell of FIG. 10.

As described above, charge generated by photodiode PD within an exposure period can be temporarily stored in charge storage device 902 and converted to a voltage. The voltage can be quantized to represent an intensity of the incident light based on a pre-determined relationship between the charge and the incident light intensity. Reference is now made to FIG. 10, which illustrates a quantity of charge accumulated with respect to time for different light intensity ranges. The total quantity of charge accumulated at a particular time point can reflect the intensity of light incident upon photodiode PD of FIG. 6 within an exposure period. The quantity can be measured when the exposure period ends. A threshold 1002 and a threshold 1004 can be defined for a threshold's quantity of charge defining a low light intensity range 1006, a medium light intensity range 1008, and a high light intensity range 1010 for the intensity of the incident light. For example, if the total accumulated charge is below threshold 1002 (e.g., Q1), the incident light intensity is within low light intensity range 1006. If the total accumulated charge is between threshold 1004 and threshold 1002 (e.g., Q2), the incident light intensity is within medium light intensity range 1008. If the total accumulated charge is above threshold 1004, the incident light intensity is within medium light intensity range 1010. The quantity of the accumulated charge, for low and medium light intensity ranges, can correlate with the intensity of the incident light, if the photodiode does not saturate within the entire low light intensity range 1006 and the measurement capacitor does not saturate within the entire medium light intensity range 1008.

The definitions of low light intensity range 1006 and medium light intensity range 1008, as well as thresholds 1002 and 1004, can be based on the full well capacity of photodiode PD and the capacity of charge storage device 902. For example, low light intensity range 706 can be defined such that the total quantity of residual charge stored in photodiode PD, at the end of the exposure period, is below or equal to the storage capacity of the photodiode, and threshold 1002 can be based on the full well capacity of photodiode PD. Moreover, medium light intensity range 1008 can be defined such that the total quantity of charge stored in charge storage device 902, at the end of the exposure period, is below or equal to the storage capacity of the measurement capacitor, and threshold 1004 can be based on the storage capacity of charge storage device 902. Typically threshold 1004 is can be based on a scaled storage capacity of charge storage device 902 to ensure that when the quantity of charge stored in charge storage device 902 is measured for intensity determination, the measurement capacitor does not saturate, and the measured quantity also relates to the incident light intensity. As to be described below, thresholds 1002 and 1004 can be used to detect whether photodiode PD and charge storage device 902 saturate, which can determine the intensity range of the incident light.

In addition, in a case where the incident light intensity is within high light intensity range 1010, the total overflow charge accumulated at charge storage device 902 may exceed threshold 1004 before the exposure period ends. As additional charge is accumulated, charge storage device 902 may reach full capacity before the end of the exposure period, and charge leakage may occur. To avoid measurement error caused due to charge storage device 902 reaching full capacity, a time-to-saturation measurement can be performed to measure the time duration it takes for the total overflow charge accumulated at charge storage device 902 to reach threshold 1004. A rate of charge accumulation at charge storage device 902 can be determined based on a ratio between threshold 1004 and the time-to-saturation, and a hypothetical quantity of charge (Q3) that could have been accumulated at charge storage device 902 at the end of the exposure period (if the capacitor had limitless capacity) can be determined by extrapolation according to the rate of charge accumulation. The hypothetical quantity of charge (Q3) can provide a reasonably accurate representation of the incident light intensity within high light intensity range 1010.

Referring back to FIG. 9, to measure high light intensity range 1010 and medium light intensity range 1008, transfer switch M1 can be biased by TG signal in a partially turned-on state. For example, the gate voltage of transfer switch M1 (TG) can be set based on a target voltage developed at photodiode PD corresponding to the full well capacity of the photodiode. With such arrangements, only overflow charge (e.g., charge generated by the photodiode after the photodiode saturates) will transfer through transfer switch M1 to reach charge storage device 902, to measure time-to-saturation (for high light intensity range 1010) and/or the quantity of charge stored in charge storage device 902 (for medium light intensity range 1008). For measurement of medium and high light intensity ranges, the capacitance of charge storage device 902 (by connecting $C_{EXT}$ and $C_{FD}$) can also be maximized to increase threshold 1004.

Moreover, to measure low light intensity range 1006, transfer switch M1 can be controlled in a fully turned-on state to transfer the residual charge stored in photodiode PD to charge storage device 902. The transfer can occur after the quantization operation of the overflow charge stored at charge storage device 902 completes and after charge storage device 902 is reset. Moreover, the capacitance of charge storage device 902 can be reduced. As described above, the reduction in the capacitance of charge storage device 902 can increase the charge-to-voltage conversion ratio at charge storage device 902, such that a higher voltage can be developed for a certain quantity of stored charge. The higher charge-to-voltage conversion ratio can reduce the effect of measurement errors (e.g., quantization error, comparator offset, etc.) introduced by subsequent quantization operation on the accuracy of low light intensity determination. The measurement error can set a limit on a minimum voltage difference that can be detected and/or differentiated by the quantization operation. By increasing the charge-to-voltage conversion ratio, the quantity of charge corresponding to the minimum voltage difference can be reduced, which in turn reduces the lower limit of a measurable light intensity by pixel cell 602a and extends the dynamic range.

Figure 9:
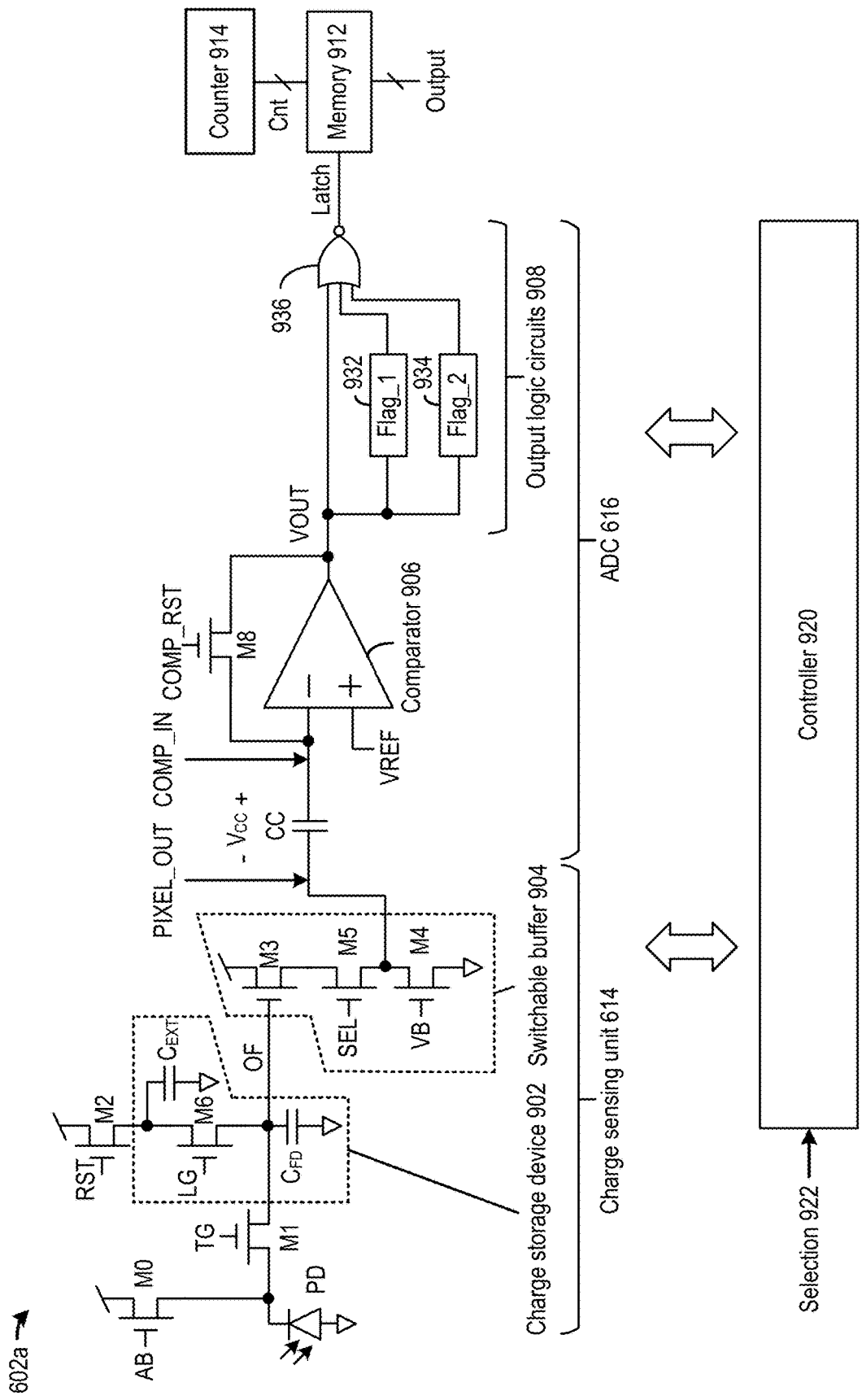
FIG. 9 illustrates block diagrams of an example of a pixel cell.

The charge (residual charge and/or overflow charge) accumulated at charge storage device 902 can develop an analog voltage at the OF node, which can be buffered by switchable buffer 904 at PIXEL_OUT and quantized by ADC 616. As shown in FIG. 9, ADC 616 includes a comparator 906 which can be reset by a switch M8, and output logic circuits 908. ADC 616 is also coupled with memory 912 and counter 914. Counter 914 can generate a set of count values based on a free-running clock signal, whereas memory 912 can be controlled, by comparator 906 via output logic circuits 908, to store a count value (e.g., the latest count value) generated by counter 914. Memory 912 can be, for example, a latch circuit to store the counter value based on local pixel value as described below. The stored count value can be output via pixel output buses 816.

Comparator 906 can compare an analog voltage COMP_IN, which is derived from PIXEL_OUT by the CC capacitor, against a threshold VREF, and generate a decision VOUT based on the comparison result. The CC capacitor can be used in a noise/offset compensation scheme to store the reset noise and comparator offset information in a VCC voltage, which can be added to the PIXEL_OUT voltage to generate the COMP_IN voltage, to cancel the reset noise component in the PIXEL_OUT voltage. The offset component remains in the COMP_IN voltage and can be cancelled out by the offset of comparator 906 when comparator 906 compares the COMP_IN voltage against threshold VREF to generate the decision VOUT. Comparator 906 can generate a logical one for VOUT if the COMP_IN voltage equals or exceeds VREF. Comparator 906 can also generate a logical zero for VOUT if the COMP_IN voltage falls below VREF. VOUT can control a latch signal which controls memory 912 to store a count value from counter 914.

Figure 11B:
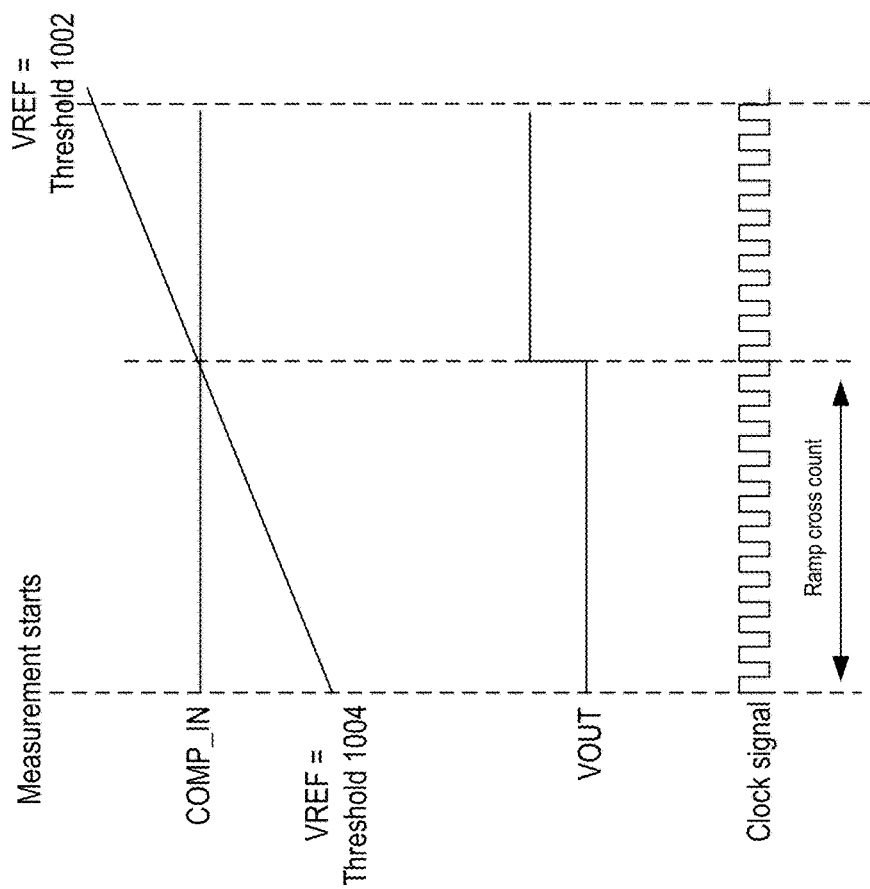
FIGS. 11A, 11B, 11C, and 11D illustrate techniques for performing quantization.
Figure 11A:
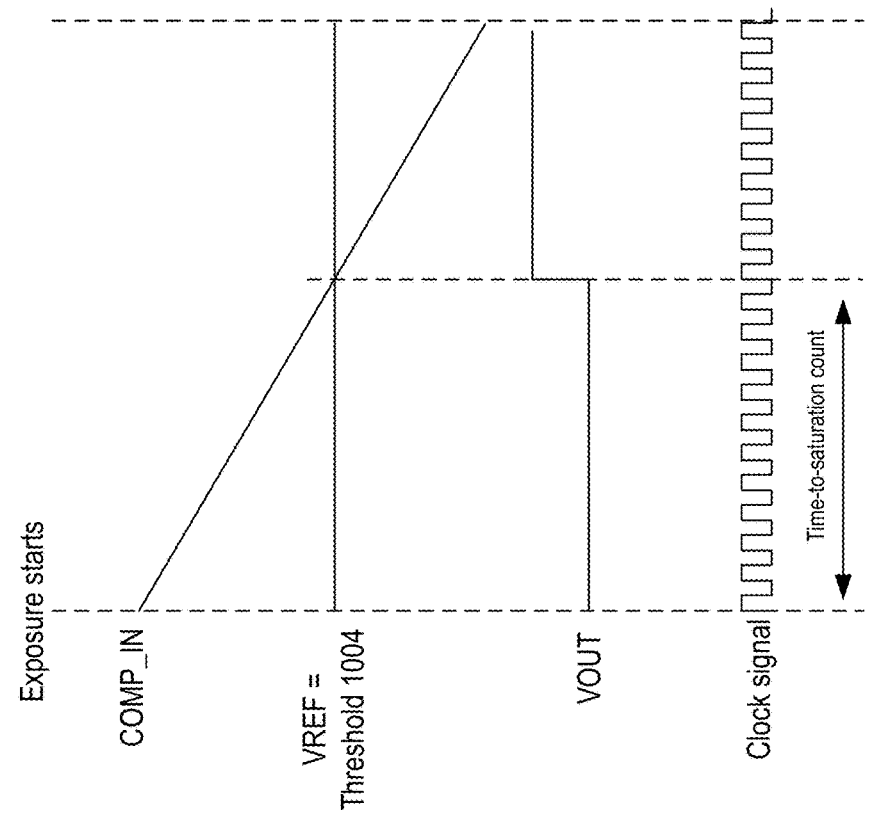

FIG. 11A illustrates an example of time-to-saturation measurement by ADC 616. To perform the time-to-saturation measurement, a threshold generator (which can be external to pixel cell 602a) can generate a fixed VREF. Fixed VREF can be set at a voltage corresponding a charge quantity threshold for saturation of charge storage device 902 (e.g., threshold 1004 of FIG. 10). Counter 914 can start counting right after the exposure period starts (e.g., right after shutter switch M0 is disabled). As the COMP_IN voltage ramps down (or up depending on the implementation) due to accumulation of overflow charge at charge storage device 902, clock signal keeps toggling to update the count value at counter 914. The COMP_IN voltage may reach the fixed VREF threshold at a certain time point, which causes VOUT to flip from low to high. The change of VOUT may stop the counting of counter 914, and the count value at counter 914 may represent the time-to-saturation.

FIG. 11B illustrates an example of measurement of a quantity of charge stored at charge storage device 902. After measurement starts, the threshold generator can generate a ramping VREF, which can either ramp up (in the example of FIG. 11B) or ramp down depending on implementation. The rate of ramping can be based on the frequency of the clock signal supplied to counter 914. In a case where overflow charge is measured, the voltage range of ramping VREF can be between threshold 1004 (charge quantity threshold for saturation of charge storage device 902) and threshold 1002 (charge quantity threshold for saturation of photodiode PD), which can define the medium light intensity range. In a case where residual charge is measured, the voltage range of the ramping VREF can be based on threshold 1002 and scaled by the reduced capacity of charge storage device 902 for residual charge measurement. In the example of FIG. 11B, the quantization process can be performed with uniform quantization steps, with VREF increasing (or decreasing) by the same amount for each clock cycle. The amount of increase (or decrease) of VREF corresponds to a quantization step. When VREF reaches within one quantization step of the COMP_IN voltage, VOUT of comparator 906 flips, which can stop the counting of counter 914, and the count value can correspond to a total number of quantization steps accumulated to match, within one quantization step, the COMP_IN voltage. The count value can become a digital representation of the quantity of charge stored at charge storage device 902, as well as the digital representation of the incident light intensity.

As discussed above, ADC 616 can introduce quantization errors when there is a mismatch between a quantity of charge represented by the quantity level output by ADC 616 (e.g., represented by the total number of quantization steps) and the actual input quantity of charge that is mapped to the quantity level by ADC 808. The quantization error can be reduced by using a smaller quantization step size. In the example of FIG. 11B, the quantization error can be reduced by the amount of increase (or decrease) in VREF per clock cycle.

Although quantization error can be reduced by using smaller quantization step sizes, area and performance speed may limit how far the quantization step can be reduced. With smaller quantization step size, the total number of quantization steps needed to represent a particular range of charge quantities (and light intensity) may increase. A larger number of data bits may be needed to represent the increased number of quantization steps (e.g., 8 bits to represent 255 steps, 7 bits to represent 127 steps, etc.). The larger number of data bits may require additional buses to be added to pixel output buses 816, which may not be feasible if pixel cell 601 is used on a head-mounted device or other wearable devices with very limited spaces. Moreover, with a larger number of quantization step size, ADC 808 may need to cycle through a larger number of quantization steps before finding the quantity level that matches (with one quantization step), which leads to increased processing power consumption and time, and reduced rate of generating image data. The reduced rate may not be acceptable for some applications that require a high frame rate (e.g., an application that tracks the movement of the eyeball).

Figure 11C:
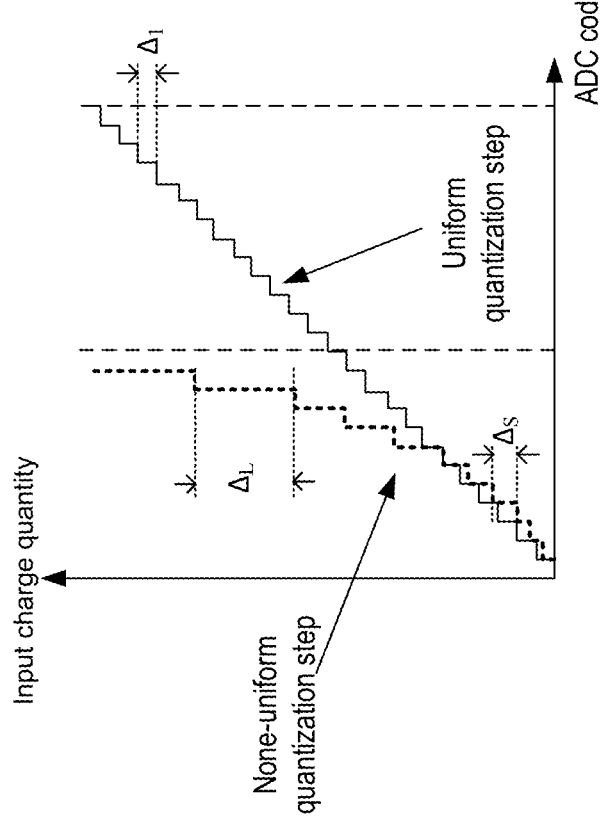

One way to reduce quantization error is by employing a non-uniform quantization scheme, in which the quantization steps are not uniform across the input range. FIG. 11C illustrates an example of a mapping between the ADC codes (the output of the quantization process) and the input charge quantity level for a non-uniform quantization process and a uniform quantization process. The dotted line illustrates the mapping for the non-uniform quantization process, whereas the solid line illustrates the mapping for the uniform quantization process. For the uniform quantization process, the quantization step size (denoted by $\Delta_1$) is identical for the entire range of input charge quantity. In contrast, for the non-uniform quantization process, the quantization step sizes are different depending on the input charge quantity. For example, the quantization step size for a low input charge quantity (denoted by $\Delta_S$) is smaller than the quantization step size for a large input charge quantity (denoted by $\Delta_L$). Moreover, for the same low input charge quantity, the quantization step size for the non-uniform quantization process ($\Delta_S$) can be made smaller than the quantization step size for the uniform quantization process ($\Delta_1$).

One advantage of employing a non-uniform quantization scheme is that the quantization steps for quantizing low input charge quantities can be reduced, which in turn reduces the quantization errors for quantizing the low input charge quantities, and the minimum input charge quantities that can be differentiated by ADC 616 can be reduced. Therefore, the reduced quantization errors can push down the lower limit of the measureable light intensity of the image sensor, and the dynamic range can be increased. Moreover, although the quantization errors are increased for the high input charge quantities, the quantization errors may remain small compared with high input charge quantities. Therefore, the overall quantization errors introduced to the measurement of the charge can be reduced. On the other hand, the total number of quantization steps covering the entire range of input charge quantities may remain the same (or even reduced), and the aforementioned potential problems associated with increasing the number of quantization steps (e.g., increase in area, reduction in processing speed, etc.) can be avoided.

Figure 11D:
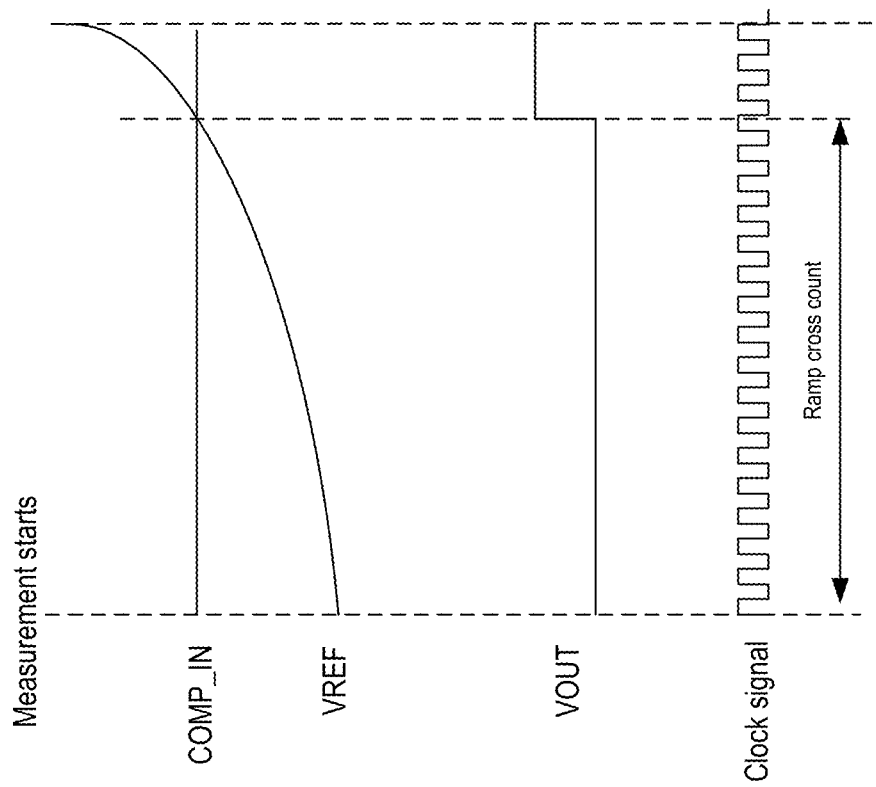

FIG. 11D illustrates an example of quantizing an analog voltage by pixel ADC 808 using a non-uniform quantization process. Compared with FIG. 11B (which employs a uniform quantization process), VREF increases in a non-linear fashion with each clock cycle, with a shallower slope initially and a steeper slope at a later time. The differences in the slopes are attributed to the uneven quantization step sizes. For lower counter count values (which correspond to a lower input quantity range), the quantization steps are made smaller, hence VREF increases at a slower rate. For higher counter count values (which correspond to a higher input quantity range), the quantization steps are made larger, hence VREF increases at a higher rate. The non-uniform VREF slope can be generated based on, for example, changing the frequency of counting of counter 814, changing the relationship between the VREF voltage and the count values of counter 914, etc. In some examples, the non-uniform quantization process of FIG. 11D can be employed for light intensity determination for low light intensity range 1006 and medium light intensity range 1008.

Referring back to FIG. 9, controller 920 can, based on selection 922, performs a TTS quantization operation, a quantization operation to measure a quantity of overflow charge (herein after, "FD ADC" operation), and a quantization operation to measure a quantity of residual charge (hereinafter "PD ADC" operation). Controller 920 can also skip one or more of the quantization operations. Output logic circuits 908 can determine which of the quantization operations to store the count value at memory 912. Specifically, output logic circuits 908 include a set of registers 932 and 934 to store the decision outputs of the quantization operations as FLAG_1 and FLAG_2 signals. Based on the FLAG_1 and FLAG_2 signals, controller 920 can select the count value output in one of the three phases to represent the incident light intensity. The selected count value can be stored in memory 912, and memory 912 can be locked based on a combination of the FLAG_1 and FLAG_2 signals by NOR gate 936 to prevent subsequent measurement phases from overwriting the selected ADC code output in memory 912. At the end of the three-phase measurement process, controller 920 can retrieve the count value stored in memory 912 and provide the count value as the digital output representing the incident light intensity.

Figure 12:
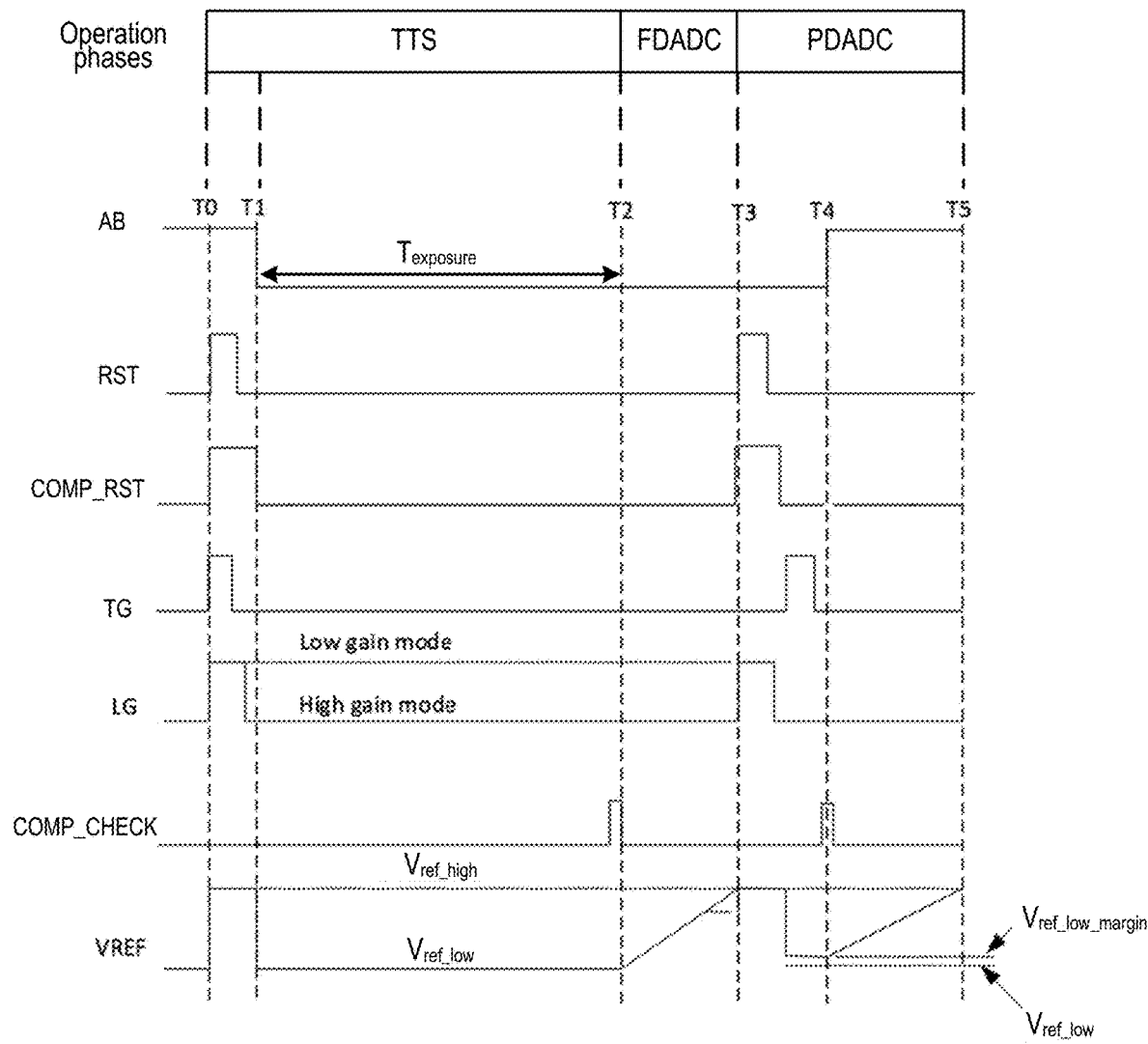
FIG. 12 illustrates an example sequence of control signals to perform light intensity measurement.

Reference is now made to FIG. 12, which illustrate an example sequence of the control signals of pixel cell 602a generated by controller 920. FIG. 12 illustrates the change of AB, RST, COMP_RST, TG, LG, and VREF with respect to time. Referring to FIG. 12, the period between times T0 and T1 can correspond to a first reset phase, in which charge storage device 902 and comparator 906 can be put in a reset state by controller 920 by asserting the RST and COMP_RST signals, while the shutter signal AB can be asserted to prevent charge generated by photodiode PD from reaching charge storage device 902. Both RST and LG signals are asserted to reset $C_{FD}$ and $C_{EXT}$ capacitors to set PIXEL_OUT at the reset level. With COMP_RST signal asserted and the positive terminal of comparator 906 connected to $V_{ref\_high}$, COMP_IN can be set to a sum of $V_{ref\_high}$ and comparator offset $V_{comp\_offset}$. Moreover, with RST signal asserted, PIXEL_OUT can be set the reset voltage $V_{pixel\_out\_rst}$ and can include reset noise $V\sigma_{KTC}$. A first sampling operation can be performed by the CC cap to store a $V_{CC}$ voltage including the components of the comparator offset, the reset noise, and PIXEL_OUT voltage at the reset level, as follows:

$$V_{cc}(T1) = (V_{ref\_high} + V_{comp\_offset}) - (V_{pixel\_out\_rst} + V\sigma_{KTC}) \quad \text{(Equation 1)}$$

At time T1, the RST signal, the AB signal, and the COMP_RST signal are released, which starts an exposure period (labelled $T_{exposure}$) in which photodiode PD can accumulate and transfer charge. Exposure period $T_{exposure}$ can end at time T2. Between times T1 and T3, TG signal can set transfer switch M1 in a partially turned-on state to allow PD to accumulate residual charge before photodiode PD saturates. If the light intensity in the medium or high intensity ranges of FIG. 7, photodiode PD can saturate and transfer overflow charge via transfer switch M1. LG signal can remain asserted to operate in low gain mode, in which both $C_{FD}$ capacitor and $C_{EXT}$ capacitor are connected in parallel to form charge storage device 902 to store the overflow charge. The overflow charge develops a new PIXEL_OUT voltage, $V_{pixel\_out\_sig1}$. The CC capacitor can AC couple the new PIXEL_OUT voltage $V_{pixel\_out\_sig1}$ into COMP_IN voltage by adding the $V_{CC}$ voltage, which includes the reset noise and comparator offset component. The new PIXEL_OUT voltage also includes reset noise, which can be cancelled by the reset noise component of the $V_{CC}$ voltage. The COMP_IN voltage at time Tx between times T1 and T3 can be as follows:

$$V_{comp\_in}(Tx) = V_{pixel\_out\_sig1} - V_{pixel\_out\_rst} + V_{ref\_high} + V_{comp\_offset} \quad \text{(Equation 2)}$$

In Equation 2, the difference between $V_{pixel\_out\_sig1} - V_{pixel\_out\_rst}$ represents the quantity of overflow charge stored in charge storage device 902. The comparator offset in the COMP_IN voltage can also cancel out the comparator offset introduced by comparator 906 when performing the comparison.

Between times T1 and T3, two phases of measurement of the COMP_IN voltage can be performed, including a time-to-saturation (TTS) measurement phase for high light intensity range 1010 and an FD ADC phase for measurement of overflow charge for medium light intensity 1008. Between times T1 and T2 ($T_{exposure}$) the TTS measurement can be performed by comparing COMP_IN voltage with a static $V_{ref\_low}$ representing a saturation level of charge storage device 902 by comparator 906. When PIXEL_OUT voltage reaches the static VREF, the output of comparator 906 (VOUT) can trip, and a count value from counter 914 at the time when VOUT trips can be stored into memory 912. At time T2, controller 920 can determine the state of VOUT of comparator 906 at the end of the TTS phase, and can assert FLAG_1 signal if VOUT is asserted. The assertion of the FLAG_1 signal can indicate that charge storage device 902 saturates and can prevent subsequent measurement phases (FD ADC and PD ADC) from overwriting the count value stored in memory 912. The count value from TTS can then be provided to represent the intensity of light received by the photodiode PD during the integration period.

Between times T2 and T3 (labelled $T_{FDADC}$), the FD ADC operation can be performed by comparing COMP_IN voltage with a ramping VREF voltage that ramps from $V_{ref\_low}$ to $V_{ref\_high}$, which represents the saturation level of photodiode PD (e.g., threshold 1002), as described in FIG. 9B. If VOUT of comparator 906 trips during FD ADC, the count value of counter 914 at the time when VOUT trips can be stored in memory 912, if FLAG_1 is low which indicates that charge storage device 902 does not saturate. Although exposure period ends at time T2, between times T2 and T3 the photodiode PD remains capable of accumulating residual charge (if not saturated) or transferring overflow charge to charge storage device 902.

Between times T3 and T4 (labelled $T_{PDADC-transfer}$) can be the second reset phase, in which both RST and COMP_RST signals are asserted to reset charge storage device 902 (comprising the parallel combination of $C_{FD}$ capacitor and $C_{EXT}$ capacitor) and comparator 906 to prepare for the subsequent PD ADC operation. The $V_{CC}$ voltage can be set according to Equation 1.

After RST and COMP_RST are released, LG is turned off to disconnect $C_{EXT}$ from CF to increase the charge-to-voltage conversion rate for the PD ADC operation. TG is set at a level to fully turn on the M1 transfer switch to transfer the residual charge stored in the photodiode PD to Co. The residual charge develops a new PIXEL_OUT voltage, $V_{pixel\_out\_sig2}$. The CC capacitor can AC couple the new PIXEL_OUT voltage $V_{pixel\_out\_sig2}$ into COMP_IN voltage by adding the $V_{CC}$ voltage. Between times T3 and T4, the photodiode PD remains capable of generating additional charge in addition to the charge generated between times T1 to T3, and transferring the additional charge to charge storage device 902. The $V_{pixel\_out\_sig2}$ also represents the additional charge transferred between times T3 and T4. At time T4, the COMP_IN voltage can be as follows:

$$V_{comp\_in}(T4) = V_{pixel\_out\_sig2} - V_{pixel\_out\_rst} + V_{ref\_high} + V_{comp\_offset} \quad \text{(Equation 3)}$$

In Equation 3, the difference between $V_{pixel\_out\_sig2} - V_{pixel\_out\_rst}$ represents the quantity of charge transferred by the photodiode to charge storage device 902 between times T3 and T4. The comparator offset in the COMP_IN voltage can also cancel out the comparator offset introduced by comparator 906 when performing the comparison.

At time T4, the AB signal is asserted to prevent the photodiode PD from accumulating and transferring additional charge. Moreover, VREF can be set a static level $V_{ref\_low}$ margin. Comparator 906 can compare the COMP_IN voltage with $V_{ref\_low\_margin}$ to determine whether the photodiode PD saturates. $V_{ref\_low\_margin}$ is slightly higher than $V_{ref\_low}$, which represents the saturation level of photodiode PD (e.g., threshold 1002), to prevent false tripping of comparator 906 when the quantity of residual charge is close to but does not exceed the saturation level. Controller 920 can determine the state of VOUT of comparator 906 and can assert FLAG_2 if VOUT is asserted to indicate that photodiode PD saturates. If the FLAG_2 is asserted, memory 912 can be locked to preserve the count value stored in memory 912 (from FD ADC) and prevents memory 912 from be overwritten by the subsequent PD ADC operation.

Between times T4 and T5, controller 920 can perform the PD ADC operation by comparing the COMP_IN voltage with a VREF ramp that starts from $V_{ref\_low}$ margin to $V_{ref\_high}$. In PD ADC phase, $V_{ref\_high}$ can represent the minimum detectable quantity of residual charge stored in photodiode PD, whereas $V_{ref\_low\_margin}$ can represent the saturation threshold of photodiode PD with margin to account for dark current, as described above. If neither FLAG_1 nor FLAG_2 is asserted prior to PD ADC, the count value obtained when comparator 906 trips during PD ADC can be stored into memory 912, and the count value from PD ADC can be provided to represent the intensity of light.

Although FIG. 12 shows TTS, FD ADC and PD ADC operations are performed, it is understood that ADC 616 (and pixel cell 602a) needs not perform all of these operations, and can skip some of them based on selection 922. As to be described below, the quantization operations may vary for different photodiodes within pixel cell 602a.

Figure 13A:
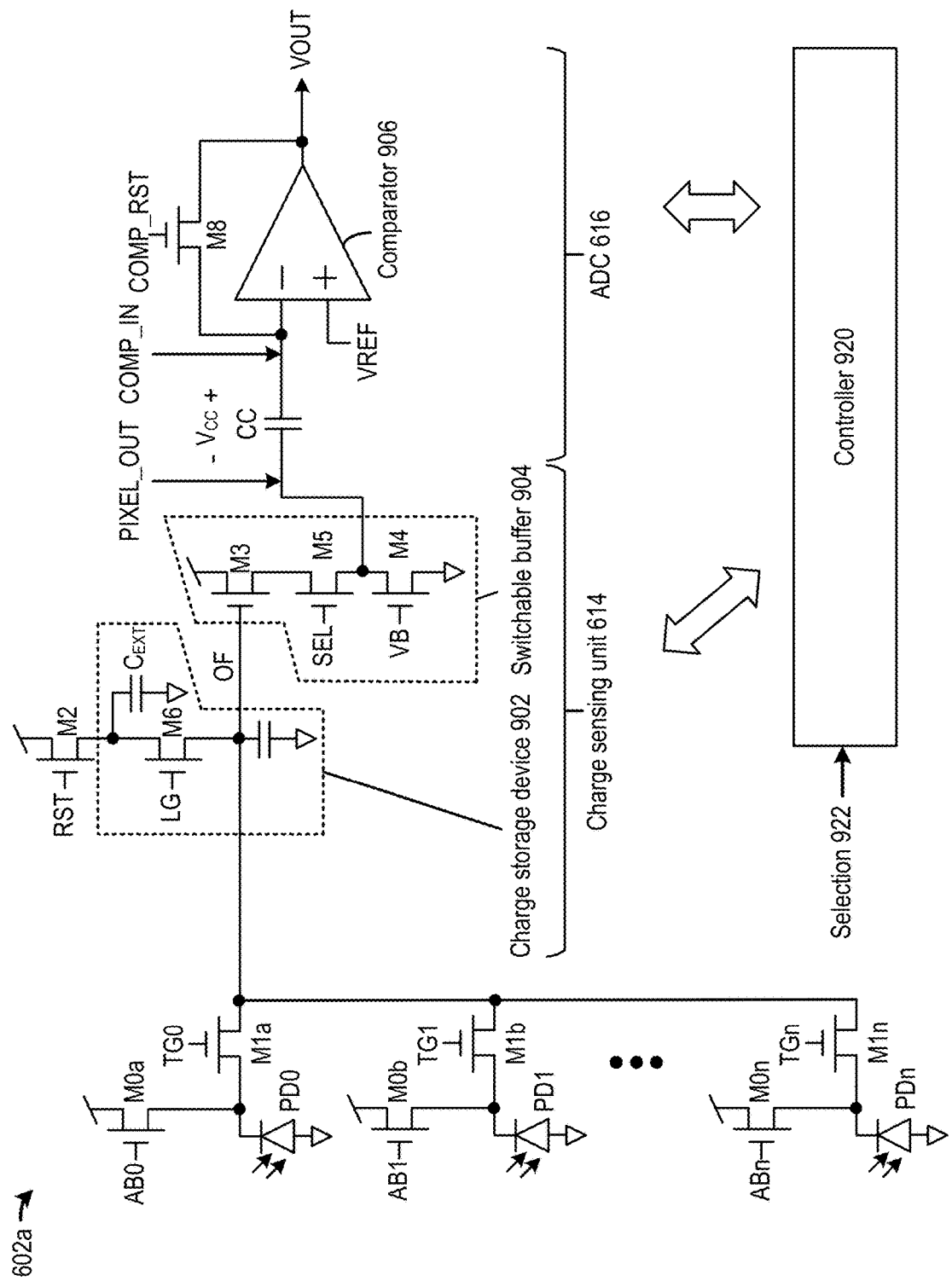
FIGS. 13A and 13B illustrate block diagrams of an example of a pixel cell having multiple photodiodes and its operations.

Reference is now made to FIG. 13A, which illustrates an example of pixel cell 602a including multiple photodiodes.

As shown in FIG. 13A, pixel cell 602a includes a plurality of photodiodes including PD0, PD1, PDn, etc. PD0, PD1, and PDn can share a single charge sensing unit 614 and a single ADC 616. Photodiodes PD0, PD1, PDn can correspond to, photodiodes 612a, 612b, and 612c. Each photodiode is coupled with a respective shutter switch and a respective transfer switch. For example, photodiode PD0 is coupled with shutter switch M0a and transfer switch M1a, photodiode PD1 is coupled with shutter switch M0b and transfer switch M1b, whereas photodiode PDn is coupled with shutter switch M0n and transfer switch M1n. Each transfer switch is coupled with the OF node of charge storage device 902. Controller 920 can control the timing of control signals AB0, AB1, and ABn (for shutter switches M0a, M0b, and M0n) and the timing of control signals TG0, TG1, and TGn (for transfer switches M1a, M1b, M1n) to individually enable each photodiode to generate/accumulate residual charge, and to transfer overflow charge to charge sensing unit 614. In addition, based on selection 922, controller 920 can also perform the quantization operations for each photodiode.

Figure 13B:
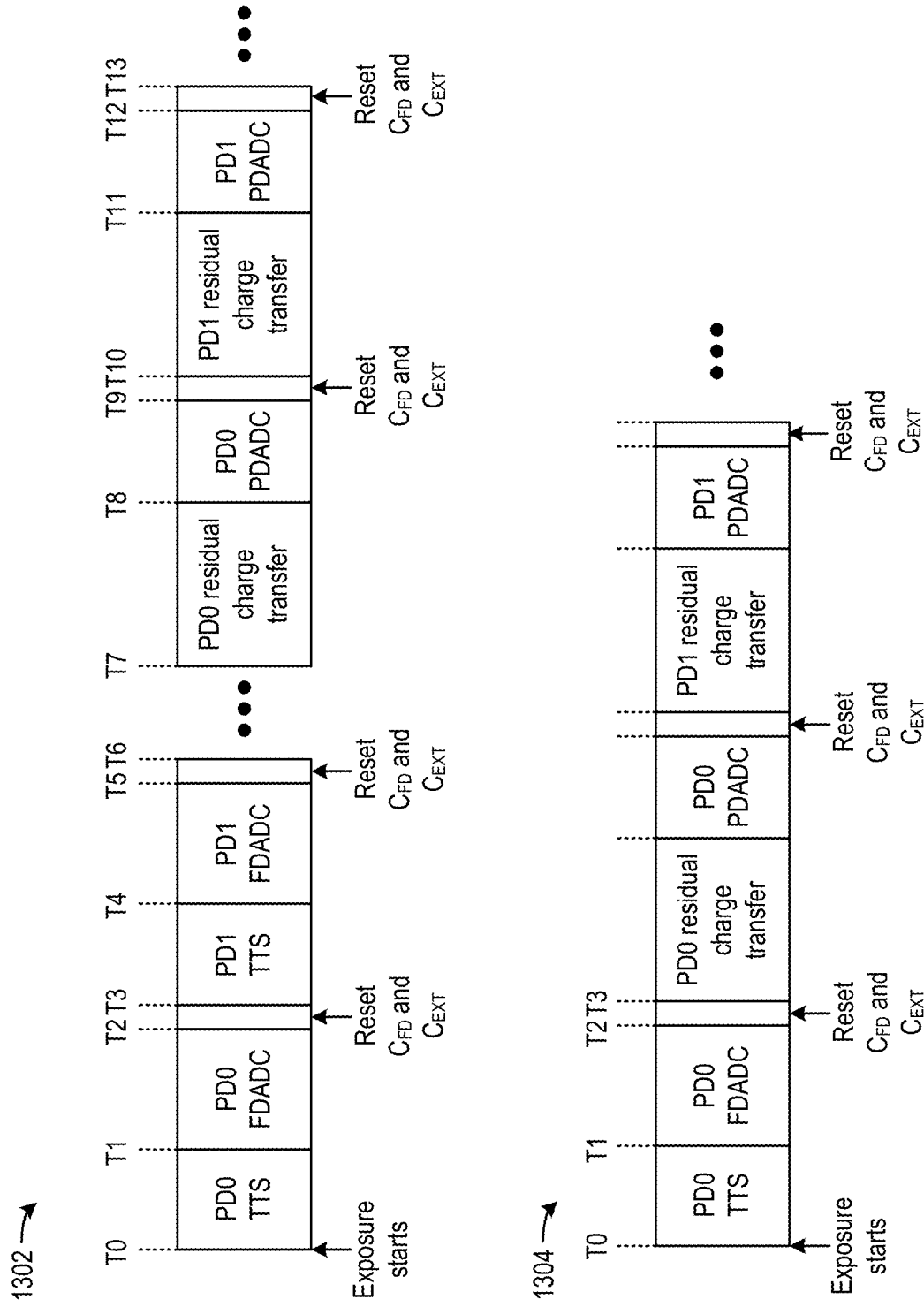

FIG. 13B illustrates example operations of pixel cell 602a of FIG. 13A. In operation 1302, controller 920 can control shutter switches M0a-M0n and transfer switches M1a-M1n to enable each photodiode to take turn to transfer overflow charge to the single charge sensing unit to generate the first voltage, which can then be quantized by ADC 616 in a TTS operation and/or a FD ADC operation based on selection 922. For example, in operation 1302, controller 920 can de-assert control signals AB0, AB1, and ABn for shutter switches M0a, M0b, and M0n to start the exposure time for photodiodes PD0, PD1, and PDn, such that each photodiode can generate and accumulate charge in response to a component of the incident light. Between times T0 and T2, controller 920 can configure charge storage device 902 at maximum capacity, and enable photodiode PD0 to transfer overflow charge to charge sensing unit 614 by biasing transfer switch M1a at the partially-on state, while disabling other transfer switches such as M1b and M1n to prevent other photodiodes from transferring overflow charge to charge sensing unit 614. Based on selection 922, controller 920 can control ADC 616 to perform a TTS operation between times T0 and T1, followed by a FD ADC operation between times T1 and T2. A digital value representing the output of the TTS operation or the FD ADC operation for PD0 can be stored in memory 912 based on whether charge storage device 902 (configured at maximum capacity) saturates. Controller 920 can reset charge storage device 902 between times T2 and T3, and repeat the aforementioned operations for PD1 between times T3 and T5, followed by other photodiodes.

After ADC 616 completes the quantization operations of the overflow charge from each photodiode, controller 920 can allow each photodiode to take turn in transferring residual charge to charge sensing unit 614 followed by a PD ADC operation. For example, between times T7 and T8 controller 920 can configure charge storage device 902 at minimum capacity, and bias transfer switch M0a at the fully-on state to transfer the residual charge from PD0 to charge sensing unit 614, followed by a PD ADC operation to quantize the residual charge between times T8 and T9. Controller 920 can reset charge storage device 902 between times T9 and T10 to remove the residual charge, and then repeat these operations for other photodiodes (e.g., PD1, PDn) after time T10.

While the arrangements of operation 1302 allow each photodiode to have the same access to the charge sensing unit and the same set of quantization operations can be performed on the outputs of each photodiode, each photodiode may have different integration periods for the overflow charge, which can degrade the global shutter operation. For example, the integration period of overflow charge for photodiode PD0 is between times T0 and T2, whereas the integration period of overflow charge for photodiode PD1 is between times T3 and T5. The different integration periods can cause motion blur as the different photodiodes may capture light from different spots when the image sensor is moving at a high speed, which can distort the images and degrade the global shutter operation.

In operation 1304, on the other hand, controller 920 can control shutter switches M0a-M0n and transfer switches M1a-M1n to allow only one photodiode to transfer overflow charge to charge sensing unit 614 to perform the TTS and FD ADC operations within the exposure period. For example, controller 920 can set shutter switch M0a at a partially-on state to allow photodiode PD0 to transfer overflow charge between times T0 and T2, in which ADC 616 can perform TTS and FD ADC operations. Controller 920 can reset charge storage device 902 between times T2 and T3. After time T3, controller 920 can control transfer switches M1a-M1n to allow all of the photodiodes to take turn to transfer residual charge to the charge sensing unit and to perform the PD ADC operations. For example, between times T3 and T5, photodiode PD0 can transfer residual charge, followed by a PD ADC operation. After charge storage device 902 is reset between times T5 and T6, another photodiode can transfer residual charge, followed by another PD ADC operation. Such arrangements can be used when, for example, the intensity of a particular component is very high compared with other components (e.g., in a dark environment with strong infra-red illumination for 3D sensing). The same exposure period can be provided for each photodiode to either accumulate charge for the strong infrared component or for the other much weaker visible light components. The TTS and FD ADC operations can be performed on the output of the photodiode that detects the strong infra-red component (e.g., photodiode PD0), while PD ADC operations can be performed on the outputs of other photodiodes, which can improve the dynamic range of both the low intensity (for visible light) and the high intensity (for infra-red light) measurement operations.

In some examples, controller 920 can also allow some or all the photodiodes to transfer overflow charge or residual charge to the charge sensing unit simultaneously. Such arrangements can be part of a binning operation, in which the transfer switches of photodiodes configured detect the same component of incident light (e.g., photodiodes 612a and 612b of FIG. 8D, both of which detect monochrome light) can be partially or fully turned on to transfer overflow charge or residual charge to charge sensing unit 614 simultaneously. Such arrangements can reduce the number of sequential quantization operations and can speed up the processing. In some examples, controller 920 can also allow photodiodes that detect different components of light to transfer overflow charge simultaneously to charge sensing unit 614, but set the biases of the transfer switches to set different quantum well capacities for the photodiodes. For example, the controller can lower the quantum well capacity for a photodiode associated with a particular wavelength range which is expected to the be strongest among other wavelength ranges, such that that photodiode is more likely to transfer overflow charge to the charge sensing unit than other photodiodes. Such arrangements not only provide same exposure period for each photodiode, as in the example described above, but also enhance flexibility in the light measurement operation. Specifically, while the TTS/FD ADC operation output is more likely to represent the output of the expected strongest component of the incident light, when the operation condition changes and the intensities of other components also increase, the TTS/FD ADC operation output can reflect the other high intensity components of the incident light as well.

In both operations 1302 and 1304, the quantization operations performed for each photodiode can be based on selection 922. For example, in operation 1302, it can be that only TTS operation is performed for PD0, only FD operation is performed for PD1, etc., based on selection 922. Moreover, the selection of PD0 to perform TTS and/or FD ADC operation in operation 1304 can also be based on selection 922.

Figure 14A:
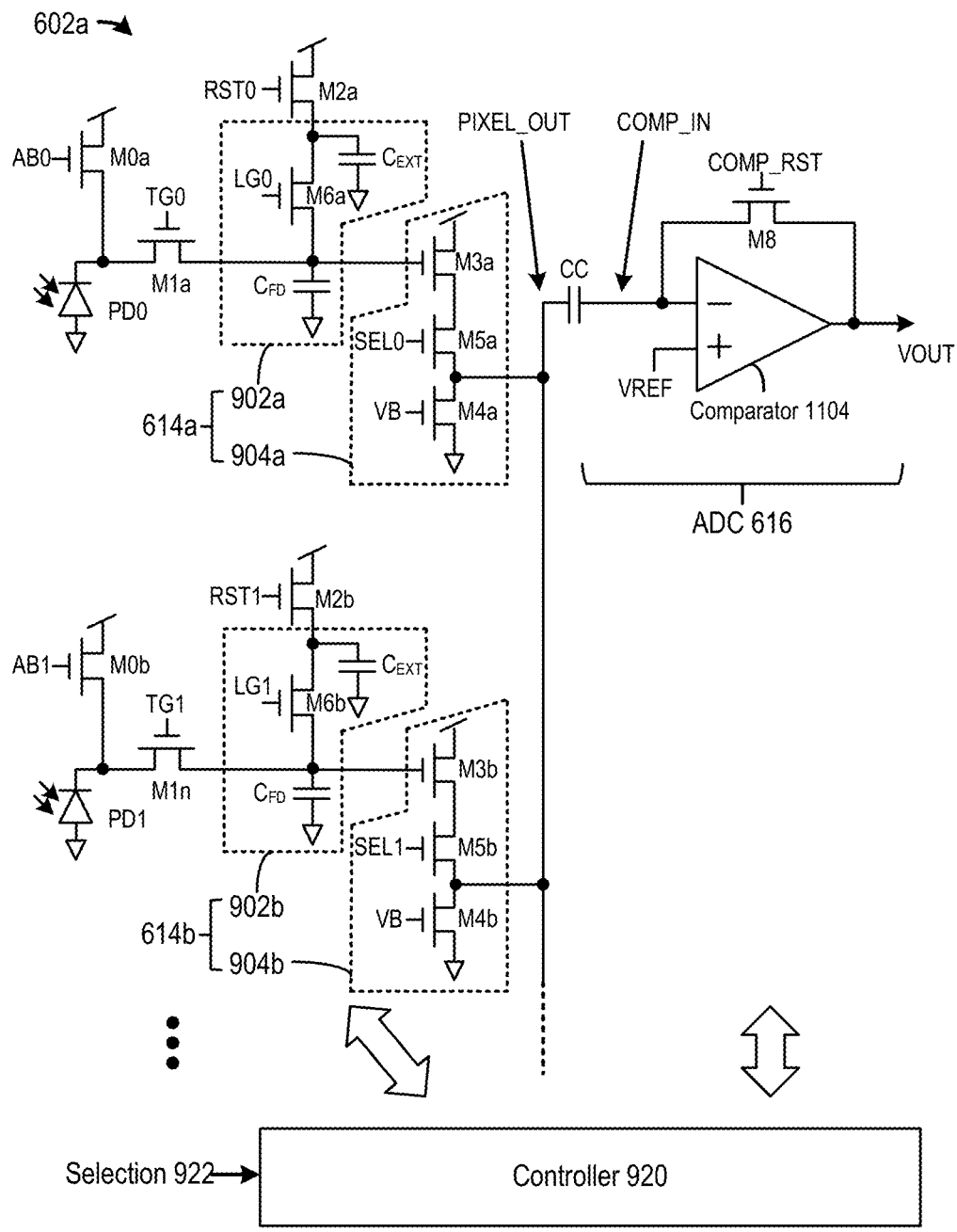
FIGS. 14A and 14B illustrate block diagrams of an example of a pixel cell having multiple photodiodes and its operations.

Reference is now made to FIG. 14A, which illustrates another example of pixel cell 602a including multiple photodiodes. As shown in FIG. 14A, pixel cell 602a includes a plurality of photodiodes including PD0, PD1, etc., as well as a plurality of charge sensing units 614 including charge sensing unit 614a, 614b, etc. Charge sensing unit 614a includes a charge storage device 902a and a switchable buffer 904a and is configured to convert residual charge and overflow charge transferred from photodiode PD0 to voltages. Charge sensing unit 614b includes a charge storage device 902b and a switchable buffer 904b and is configured to convert residual charge and overflow charge transferred form photodiode PD1 to voltages. Each photodiode is coupled with a respective shutter switch and a respective transfer switch. For example, photodiode PD0 is coupled with shutter switch M0a and transfer switch M1a, whereas photodiode PD1 is coupled with shutter switch M0b and transfer switch M1b. Controller 920 can control the timing of control signals AB0 and AB1 (for shutter switches M0a and M0b), control signals TG0 and TG1 (for transfer switches M1a and M1b), as well as control signals RST0, LG0, RST1, and LG1 to individually enable each photodiode to generate/accumulate residual charge, and to transfer overflow charge to a respective charge sensing unit 614. In addition, based on selection 922, controller 920 can also control the timing of control signals SEL0 and SEL1 to provide each charge sensing unit 614a and 614b access to ADC 616 to perform quantization operations selected by selection 922.

Figure 14B:
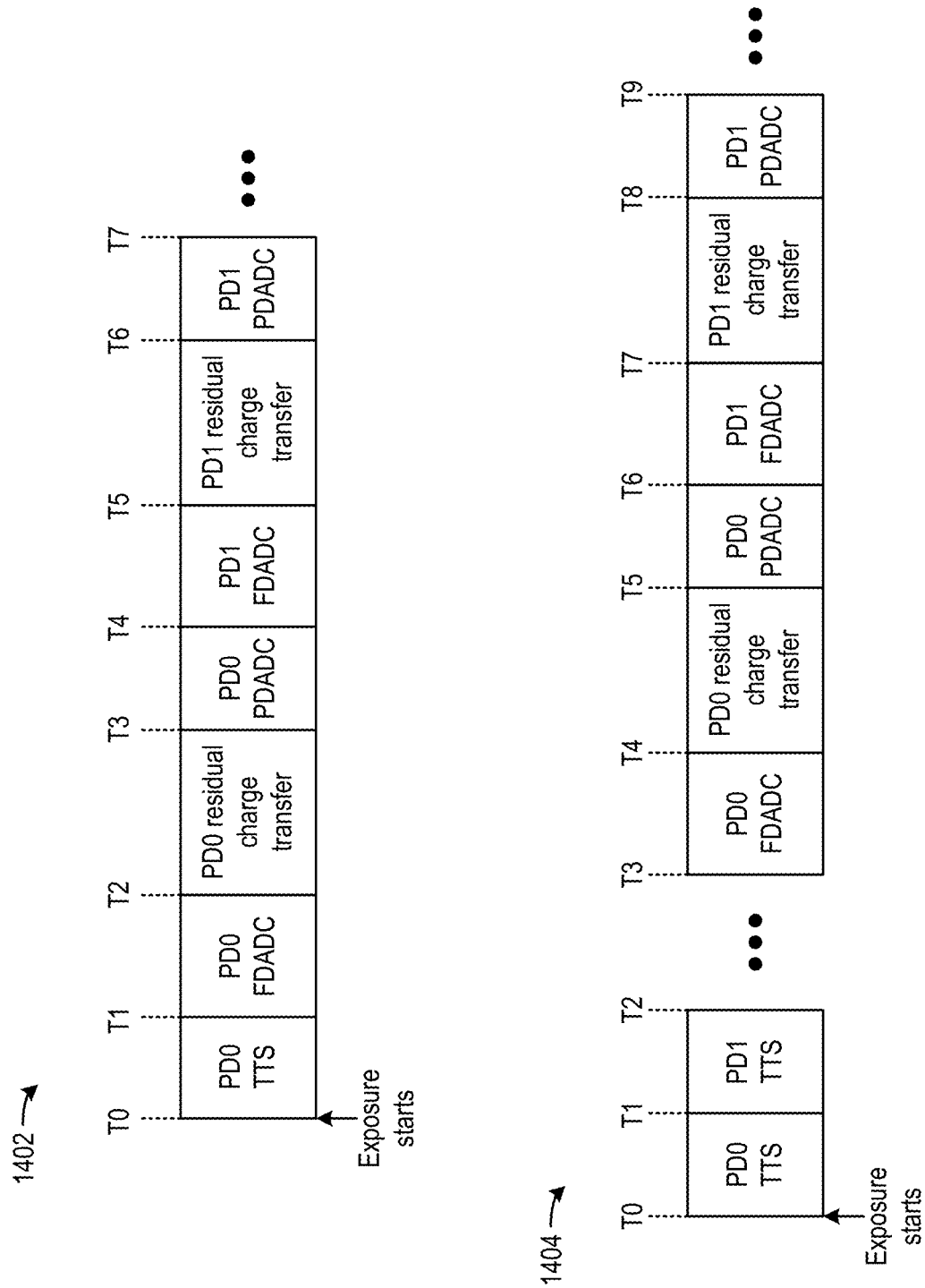

FIG. 14B illustrates example operations of pixel cell 602a of FIG. 13A. In operation 1402, controller 920 can control shutter switches M0a-M0n and transfer switches M1a-M1n to enable each photodiode to transfer overflow charge to its respective charge sensing unit simultaneously. For example, controller 920 can de-assert control signals AB0 and AB1 for shutter switches M0a and M0b to start the exposure time for photodiodes PD0 and PD1, such that each photodiode can generate and accumulate charge in response to a component of the incident light. However, controller 920 only connects one of the charge sensing units to ADC 616 to perform TTS operation. For example, between times T0 and T1, controller 920 can assert SEL0 to connect switchable buffer 904 of charge sensing unit 614a to ADC 616 within the exposure period to perform the TTS operation. After T1, controller 920 can control each charge sensing unit to take turn in connecting with the ADC 616. When a charge sensing unit is connected with ADC 616, an FD ADC operation and a PD ADC operation can be performed based on selection 922. For example, as shown in operation 1402, between times T1 and T2 a FD ADC operation is performed, followed by a PD ADC operation between times T3 and T4, for photodiode PD0. Controller 920 can then assert SEL1 (while de-asserting SEL0) to connect switchable buffer 904 of charge sensing unit 614b to ADC 616 to perform a FD ADC operation (between times T4 and T5) and a PD ADC operation (between times T6 and T7) for photodiode PD1. The arrangements of operation 1402 can be used when, for example, one of the photodiodes (e.g., PD0) is expected to receive high intensity light component and its charge storage device is expected to be saturated as a result, while other photodiodes are expected to receive medium/low intensity light components and their charge storage devices are not expected to become saturated.

In operation 1404, controller 920 can also allow each photodiode to take turn in performing the TTS operations during the exposure period, which starts at time T0. For example, between times T0 and T1 controller 920 can assert control signal SEL0 to connect charge sensing unit 614a to ADC 616 to perform a TTS operation for PD0. Also, between times T1 and T2 controller 920 can assert control signal SEL1 to connect charge sensing unit 614b to ADC 616 to perform a TTS operation for PD1. Controller 920 can repeat the TTS operations for other photodiodes. Starting at time T3, controller 920 can control the timing of the SEL0 and SEL1 signals to allow each charge sensing unit to take turn in connecting with ADC 616 to perform FD ADC operation and PD ADC operations. For example, a FD ADC operation is performed for PD0 between times T3 and T4, a PD ADC operation is performed for PD0 between times T5 and T6, followed by a FD ADC operation performed for PD1 between times T6 and T7, and a PD ADC operation is performed for PD1 between times T7 and T8.

In both operations 1402 and 1404, the quantization operations performed for each photodiode can be based on selection 922. For example, in operation 1402, it can be that only TTS operation is performed for PD0, only FD operation is performed for PD1, etc., based on selection 922. Moreover, the selection of PD0 to perform TTS and/or FD ADC operation in operation 1402 can also be based on selection 922.

In FIG. 13A-FIG. 14B, memory 912 can be configured to store the quantization results for each of the photodiodes. In some examples, memory 912 can be configured to store the quantization results for all of the photodiodes simultaneously. In some examples, the quantization results of each photodiode can be stored in memory 912 sequentially. Specifically, the quantization results of one photodiode of the pixel cell can be stored in the memory, read out for generation of the pixel value, and then overwritten by the quantization results of another photodiode of the pixel cell.

Although FIG. 14A illustrates an ADC 616 being shared among a plurality of charge sensing units, it is understood that a pixel cell can include multiple ADCs shared by subsets of charge sensing units. For example, in a case where a pixel cell includes four photodiodes and four charge sensing units, each pair of the charge sensing units can share one ADC, and the pixel cell can include two ADCs. Such arrangements can reduce the number of sequential quantization operations to be performed by each ADC, which can reduce the time it takes to generate the digital outputs and can increase the frame rate.

Figure 15:
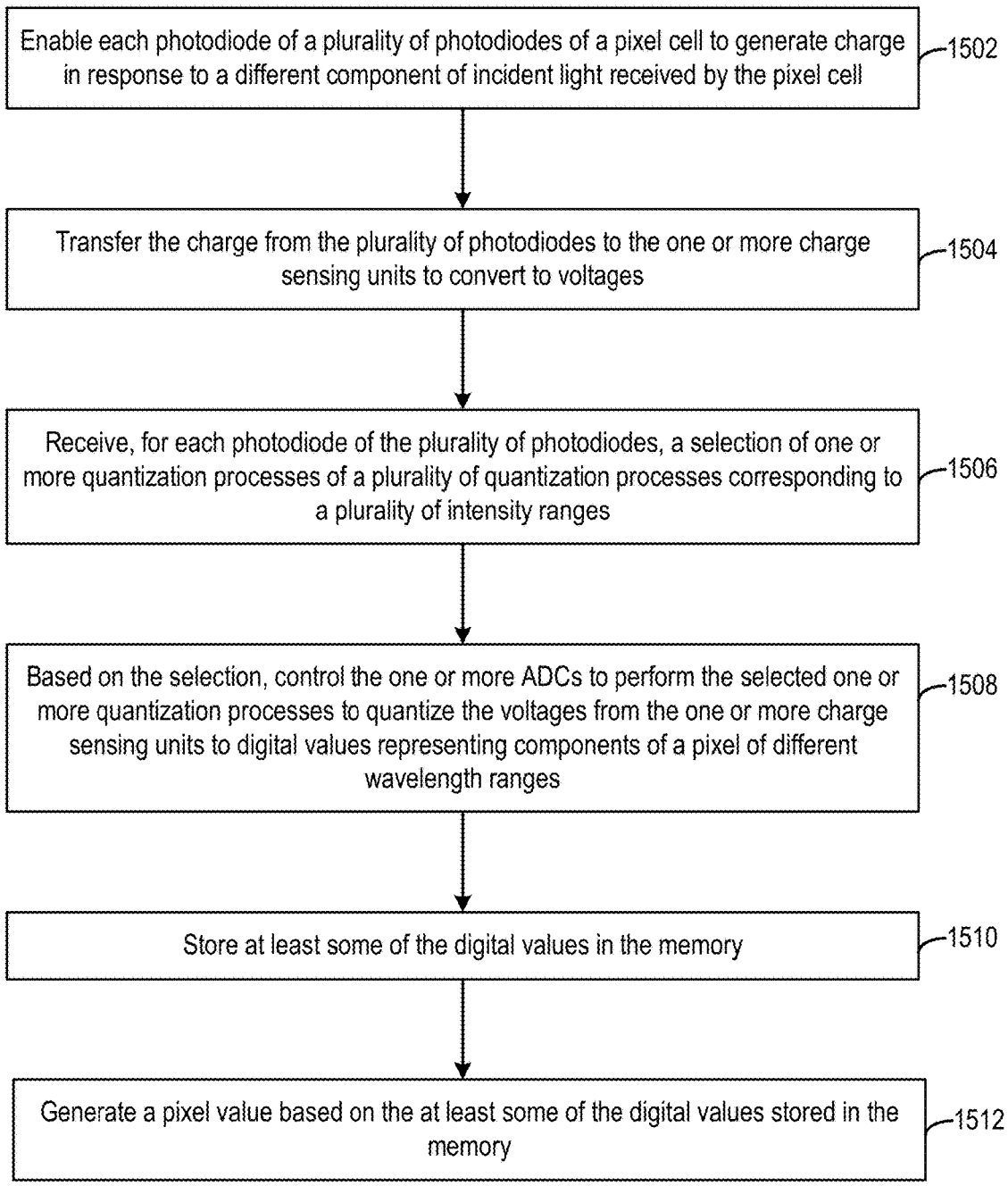
FIG. 15 illustrates a flowchart of an example process for measuring light intensity.

FIG. 15 illustrates a flowchart of a method 1500 for measuring intensities of different components of light. Method 1500 can be performed by, for example, various components of image sensor 600 including pixel cell 602a, memory 912, counter 914, and controller 920 as shown in FIG. 13A and FIG. 14A.

Method 1500 starts with step 1502, in which controller 920 can enable each photodiode of a plurality of photodiodes (e.g., PD0, PD1, PDn, etc.) of pixel cell 602a to generate charge in response to a different component of the incident light. As described above, pixel cell 602a may include a plurality of photodiodes. In some examples, as shown in FIG. 8A, the photodiodes can be stacked to have different distances from a light receiving surface which can set the wavelength of the light component absorbed by each photodiode. In some examples, as shown in FIGS. 8B-8C, the photodiodes can be arranged laterally to form sub-pixels of the pixel cell and can be overlaid with one or more microlens and one or more optical filter arrays to select the wavelength of the light component received by each photodiode. The controller can enable each photodiode to generate charge in response to the respective light component by disabling the shutter switches (e.g., M0a, M0b, etc.) coupled with each photodiode.

In step 1504, the controller can transfer the charge generated by the plurality of photodiodes to one or more charge sensing units 614 to convert to voltages. The charge may include residual charge accumulated at each photodiode, as well as overflow charge transferred by the each photodiode after the photodiode saturates. In some examples, as shown in FIG. 14A, the photodiodes share a single charge sensing unit 614. Each photodiode is coupled with the single charge sensing unit via a transfer switch (e.g., M1a, M1b, M1n, etc.). The controller can control the transfer switches to control a timing of when each photodiode transfers the overflow charge to the single charge sensing unit, as described in FIG. 13B. In some examples, as shown in FIG. 14B, each photodiode may have a corresponding charge sensing unit 614, and the controller can allow each photodiode to transfer overflow charge to its respective charge sensing unit 614 simultaneously.

In step 1506, the controller can receive, for each photodiode of the plurality of photodiodes, a selection of one or more quantization processes of a plurality of quantization processes corresponding to a plurality of intensity ranges. The plurality of quantization processes may include, for example, a time-to-saturation (TTS) measurement operation to measure a time for the charge sensing unit to become saturated by the overflow charge, a FD ADC measurement operation to measure a quantity of overflow charge, and a PD ADC measurement operation to measure a quantity of residual charge. The TTS operation can be for a high light intensity range, the FD ADC measurement operation can be for a medium light intensity range, whereas the PD ADC measurement operation can be for a low light intensity range.

The selection of the quantization operations may be specific to, for example, the sharing of the charge sensing units among the photodiodes. For example, referring to FIG. 13B, the selection may include selecting each photodiode to perform, at different times, TTS and FD ADC operations based on the overflow charge, followed by residual charge transfer and PD ADC operation for each photodiode. The selection may also include selecting one of the photodiodes to perform TTS and FD ADC operation based on overflow charge from that photodiode, followed by residual charge transfer and PD ADC operation for each photodiodes. As another example, referring to FIG. 14B, the selection may include selecting each photodiode to take turn in performing TTS, FD ADC, and PD ADC operation, selecting each photodiode to take turn in performing TTS operations, followed by FD ADC and PD ADC operations.

In step 1508, the controller can control one or more ADCs 616 to perform the selected quantization operations to quantize the voltages from the one or more charge sensing units to digital values representing components of a pixel of different wavelength ranges. For example, a digital value can be generated for one of the photodiodes based on the TTS, FD ADC, and PD ADC operations, whereas a digital value can be generated for other photodiodes based on the FD ADC and PD ADC operations. The quantization can be performed by a comparator (e.g., comparator 906) comparing the voltages with a static threshold (for TTS) or a ramping threshold (for FD ADC and PD ADC) to control when memory 912 stores a count value from counter 914. The count value can be the digital values.

In step 1510, the controller can store at least some of the digital values in memory 912. In some examples, memory 912 may have sufficient capacity to store a digital value for each photodiode representing a component of the pixel. In some examples, memory 912 may store the digital value of one photodiode, output the digital value to an imaging module (e.g., an imaging module 628), and then store the digital value of another photodiode. The imaging module can acquire the digital values of the pixel and construct the pixel based on the digital values, in step 1512.

Some portions of this description describe the examples of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some examples, a software module is implemented with a computer program product comprising a computer-readable medium containing computer program code, which can be executed by a computer processor for performing any or all of the steps, operations, or processes described.

Examples of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Examples of the disclosure may also relate to a product that is produced by a computing process described herein. Such a product may comprise information resulting from a computing process, where the information is stored on a non-transitory, tangible computer readable storage medium and may include any example of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the examples is intended to be illustrative, but not limiting, of the scope of the disclosure, which is set forth in the following claims.

What is claimed is:

1. An apparatus comprising:
   multiple distinct sets of photodiodes, each set of photodiodes in the multiple distinct sets of photodiodes being configured to convert a component of incident light of a unique wavelength range to charge, wherein each set of photodiodes comprises one or more photodiodes;
   one or more charge sensing units; and
   a controller configured to:
   transfer charge generated by the one or more photodiodes in response to a different component of incident light to the one or more charge sensing units in order to convert the charge to voltages;
   perform one or more quantization processes of a plurality of quantization processes corresponding to a plurality of intensity ranges, wherein the one or more quantization processes quantizes the voltages from the one or more charge sensing units to digital values representing components of a pixel of different wavelength ranges; and
   generate a pixel value based on the at least some of the digital values.

2. The apparatus of claim 1, wherein the one or more photodiodes are configured to, within an integration period, accumulate at least a part of the charge as residual charge until the one or more photodiodes saturates, and to transfer the remaining charge as overflow charge to the one or more charge sensing units after the one or more photodiode saturates;
   wherein the one or more charge sensing units comprises a charge storage device having a configurable capacitance;
   wherein the plurality of quantization processes comprise:
   a first quantization operation to generate a first digital value representing a quantity of the overflow charge received by the charge storage device configured at a maximum capacitance, the first quantization operating being associated with a first intensity range; and
   a second quantization operation to, after the residual charge is transferred to the charge storage device configured at a minimum capacitance, generate a second digital value representing a quantity of the residual charge stored at the charge storage device, the second quantization operation being associated with a second intensity range lower than the first intensity range.

3. The apparatus of claim 2, wherein the plurality of quantization processes comprises a third quantization operation to generate a third digital value representing a time-of-saturation of the charge storage device caused by the overflow charge.

4. The apparatus of claim 3, further comprising a light receiving surface through which the plurality of the photodiodes receive the incident light;
   wherein the multiple distinct sets of photodiodes form a stack structure with respect to the light receiving surface such that the one or more photodiodes are separated from the light receiving surface by a different distance; and wherein the component converted by the one or more photodiodes is based on the respective distance between the one or more photodiodes and the light receiving surface.

5. The apparatus of claim 3, further comprising:
a light receiving surface; and
a filter array on a first side of the light receiving surface, the filter array having filter elements positioned at a plurality of locations on the first side of the light receiving surface to set a component of the incident light that enters the light receiving surface at the respective location, wherein multiple distinct sets of photodiodes correspond to a plurality of sub-pixels and are positioned at the plurality of locations on a second side of the light receiving surface to receive the respective components of the incident light, and wherein multiple distinct sets of photodiodes convert incident light of a respective wavelength range based on the filter array.

6. The apparatus of claim 5, further comprising a single microlens over a plurality of filter arrays including the filter array and configured to project the incident light received from one spot of a scene towards the plurality of locations on the first side of the light receiving surface.

7. The apparatus of claim 5, further comprising a plurality of microlenses including a first microlens, the first microlens covering the filter array and configured to project the incident light received from one spot of a scene towards the plurality of locations on the first side of the light receiving surface.

8. The apparatus of claim 3, wherein the one or more charge sensing units comprises a single charge sensing unit and the apparatus further comprises an analog-to-digital converter (ADC);
wherein the ADC is coupled with an output of the single charge sensing unit;
wherein the apparatus further comprises a plurality of switches, each switch coupled between a photodiode and an input of the single charge sensing unit;
wherein the controller is configured to:
control the plurality of switches to transfer the charge generated by the one or more photodiodes to the single charge sensing unit to convert to voltages; and
control the ADC to quantize the voltages generated by the single charge sensing unit.

9. The apparatus of claim 8, wherein the controller is configured to:
control a first switch of the plurality of switches to transfer a first overflow charge from a first photodiode of the set of photodiodes to the single charge sensing unit to convert to a first voltage;
control the ADC to perform at least one of the first or third quantization processes of the first voltage to generate a first digital value;
control the first switch to transfer a first residual charge from the first photodiode to the single charge sensing unit to convert to a second voltage;
control the ADC to perform the second quantization operation of the second voltage to generate a second digital value;
control a second switch of the plurality of switches to transfer a second residual charge from a second photodiode of the set of photodiodes to the single charge sensing unit to convert to a third voltage;
control the ADC to perform the second quantization operation of the third voltage to generate a third digital value; and
generate the pixel value based on one of first digital value and the second digital value.

10. The apparatus of claim 8, wherein each of the photodiodes has a different full well capacity for storing the residual charge; and
wherein the controller is configured to:
control the plurality of switches to transfer overflow charge from the one or more photodiodes of the set of photodiodes to the single charge sensing unit simultaneously to generate a first voltage;
control the ADC to quantize the first voltage using at least one of the first or third quantization processes to generate a first digital value;
control the plurality of switches to transfer residual charge from the one or more photodiodes to the single charge sensing unit at different times to generate second voltages each corresponding the respective residual charge from the one or more photodiodes;
control the ADC to quantize the second voltages using the second quantization operation to generate second digital values; and
generate the pixel value based on the first digital value and the second digital values.

11. The apparatus of claim 8, wherein the controller is configured to:
within a first time period:
control the plurality of switches to transfer overflow charge from the one or more photodiodes of the set of photodiodes to the single charge sensing unit at different times to generate first voltages each corresponding the respective overflow charge from the one or more photodiodes; and
control the ADC to quantize the first voltages using at least one of the first or third quantization processes to generate first digital values;
within a second time period:
control the plurality of switches to transfer residual charge from the one or more photodiodes to the single charge sensing unit at different times to generate second voltages each corresponding to the respective residual charge from the one or more photodiodes;
control the ADC to quantize the second voltages using the second quantization operation to generate second digital values; and
generate the pixel value based on at least some of the first digital values and the second digital values.

12. The apparatus of claim 3, wherein the one or more charge sensing units comprises a plurality of charge sensing units corresponding to the set of photodiodes; and
wherein the apparatus further comprises a plurality of switches each coupled between each charge sensing unit of the plurality of charge sensing units and a corresponding photodiode of the set of photodiodes.

13. The apparatus of claim 12, wherein the controller is configured to:
enable a first photodiode of the plurality of the photodiodes to transfer a first charge to a first charge sensing unit of the plurality of charge sensing units to generate a first voltage;

enable a second photodiode of the plurality of the photodiodes to transfer a second charge to a second charge sensing unit of the plurality of charge sensing units to generate a second voltage;

perform the first quantization operation of the first voltage to generate a first digital value, followed by the second or third quantization processes of the second voltage to generate a second digital value; and generate the pixel value based on the first digital value and the second digital value.

14. The apparatus of claim 13, wherein the controller is configured to:
within a first time period:
enable a first photodiode of the plurality of the photodiodes to generate a first charge in response to the incident light;
enable the first photodiode to transfer a first overflow charge of the first charge to a first charge sensing unit of the plurality of charge sensing units to generate a first voltage; and
perform the third quantization operation of the first voltage to generate a first digital value representing a first time-to-saturation;
within a second time period:
enable a second photodiode of the plurality of the photodiodes to generate a second charge in response to the incident light;
enable the second photodiode to transfer a second overflow charge of the second charge to a second charge sensing unit of the plurality of charge sensing units to generate a second voltage; and
perform the third quantization operation of the second voltage to generate a second digital value representing a second time-to-saturation; and
generate the pixel value based on the first digital value and the second digital value.

15. The apparatus of claim 12, wherein the plurality of charge sensing units comprises a first charge sensing unit, a second charge sensing unit, a third charge sensing unit, and a fourth charge sensing unit;
wherein apparatus comprises a first ADC and a second ADC; and
wherein the controller is configured to:
control the first ADC to quantize a first voltage from the first charge sensing unit and a second voltage from the second charge sensing unit; and
control the second ADC to quantize a third voltage from the third charge sensing unit and a third voltage from the second charge sensing unit.

16. The apparatus of claim 1, wherein the controller is configured to store each of the digital values in a memory.

17. The apparatus of claim 1, wherein the apparatus comprises a memory and wherein the controller is configured to:
generate a first digital value based on quantizing a first voltage corresponding to charge generated by a first photodiode of the set of photodiodes;
store the first digital value in the memory;
read the first digital value to compute the pixel value;
generate a second digital value based on quantizing a second voltage corresponding to charge generated by a second photodiode of the set of photodiodes;
overwrite the first digital value with a second digital value in the memory; and
read the second digital value to compute the pixel value.

18. A method comprising:
enabling one or more photodiodes within a set of photodiodes to generate charge in response to a different component of incident light, wherein the set of photodiodes is part of multiple distinct sets of photodiodes, wherein each set of photodiodes is configured to convert a component of incident light of a unique wavelength range to charge;
transferring the charge from the one or more photodiodes to one or more charge sensing units;
controlling performance of one or more quantization processes to quantize voltages from the one or more charge sensing units to digital values representing components of a pixel of different wavelength ranges; and
generating a pixel value based on the at least some of the digital values.

19. The method of claim 18, wherein plurality of quantization processes comprises a first quantization process to measure a quantity of residual charge accumulated at a first photodiode within the set of photodiodes before the first photodiode saturates, a second quantization process to measure a quantity of overflow charge transferred by the first photodiode after the first photodiode saturates, and a third quantization process to measure a time-to-saturation of the one or more charge sensing units caused by the overflow charge from the first photodiode.

20. The method of claim 18, wherein the one or more charge sensing units comprises a single charge sensing unit shared by the set of photodiodes in the multiple distinct sets of photodiodes.

* * * * *